United States Patent
Yamazaki et al.

(10) Patent No.: US 8,729,550 B2
(45) Date of Patent: May 20, 2014

(54) SEMICONDUCTOR DEVICE AND METHOD FOR MANUFACTURING SEMICONDUCTOR DEVICE

(75) Inventors: Shunpei Yamazaki, Setagaya (JP); Junichiro Sakata, Atsugi (JP); Hiroyuki Miyake, Atsugi (JP); Hideaki Kuwabara, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 202 days.

(21) Appl. No.: 12/835,906

(22) Filed: Jul. 14, 2010

(65) Prior Publication Data
US 2011/0012117 A1    Jan. 20, 2011

(30) Foreign Application Priority Data
Jul. 18, 2009   (JP) .................. 2009-169601

(51) Int. Cl.
*H01L 29/10*   (2006.01)
(52) U.S. Cl.
USPC .......... 257/59; 257/71; 257/43; 257/E21.704; 257/E29.296; 257/E27.111; 438/158; 438/104
(58) Field of Classification Search
USPC ............ 257/59, 71, 43, E21.704, E29.296
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |

(Continued)

FOREIGN PATENT DOCUMENTS

| CN | 101154342 A | 4/2008 |
|---|---|---|
| CN | 101335293 A | 12/2008 |

(Continued)

OTHER PUBLICATIONS

Fortunato.E et al., "Wide-Bandgap High-Mobility ZNO Thin-Film Transistors Produced At Room Temperature,", Appl. Phys. Lett. (Applied Physics Letters), Sep. 27, 2004, vol. 85, No. 13, pp. 2541-2543.

(Continued)

*Primary Examiner* — Elias M Ullah
(74) *Attorney, Agent, or Firm* — Eric J. Robinson; Robinson Intellectual Property Law Office, P.C.

(57) ABSTRACT

An object is to reduce the manufacturing cost of a semiconductor device. An object is to improve the aperture ratio of a semiconductor device. An object is to make a display portion of a semiconductor device display a higher-definition image. An object is to provide a semiconductor device which can be operated at high speed. The semiconductor device includes a driver circuit portion and a display portion over one substrate. The driver circuit portion includes: a driver circuit TFT in which source and drain electrodes are formed using a metal and a channel layer is formed using an oxide semiconductor; and a driver circuit wiring formed using a metal. The display portion includes: a pixel TFT in which source and drain electrodes are formed using an oxide conductor and a semiconductor layer is formed using an oxide semiconductor; and a display wiring formed using an oxide conductor.

20 Claims, 40 Drawing Sheets

(56) References Cited

U.S. PATENT DOCUMENTS

| | | |
|---|---|---|
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,298,084 B2 | 11/2007 | Baude et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,719,185 B2 | 5/2010 | Jin et al. |
| 7,732,819 B2 | 6/2010 | Akimoto et al. |
| 7,745,798 B2 | 6/2010 | Takahashi |
| 7,910,490 B2 | 3/2011 | Akimoto et al. |
| 7,932,521 B2 | 4/2011 | Akimoto et al. |
| 7,978,274 B2 | 7/2011 | Umezaki et al. |
| 8,274,077 B2 | 9/2012 | Akimoto et al. |
| 8,466,463 B2 | 6/2013 | Akimoto et al. |
| 8,520,159 B2 | 8/2013 | Umezaki et al. |
| 8,629,069 B2 | 1/2014 | Akimoto et al. |
| 8,669,550 B2 | 3/2014 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0057261 A1 | 3/2007 | Jeong et al. |
| 2007/0072439 A1* | 3/2007 | Akimoto et al. ............. 438/795 |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0291350 A1 | 11/2008 | Hayashi et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308805 A1 | 12/2008 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0189155 A1 | 7/2009 | Akimoto |
| 2009/0189156 A1 | 7/2009 | Akimoto |
| 2009/0278122 A1 | 11/2009 | Hosono et al. |
| 2009/0280600 A1 | 11/2009 | Hosono et al. |
| 2009/0283762 A1 | 11/2009 | Kimura |
| 2009/0305461 A1 | 12/2009 | Akimoto et al. |
| 2010/0044701 A1 | 2/2010 | Sano et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2011/0012105 A1 | 1/2011 | Yamazaki et al. |
| 2011/0012106 A1 | 1/2011 | Yamazaki et al. |
| 2011/0012112 A1 | 1/2011 | Yamazaki et al. |
| 2011/0012116 A1 | 1/2011 | Yamazaki et al. |
| 2011/0012117 A1 | 1/2011 | Yamazaki et al. |
| 2011/0012118 A1 | 1/2011 | Yamazaki et al. |
| 2011/0017995 A1 | 1/2011 | Yamazaki et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0260169 A1 | 10/2011 | Umezaki et al. |
| 2013/0341616 A1 | 12/2013 | Umezaki et al. |

FOREIGN PATENT DOCUMENTS

| | | |
|---|---|---|
| EP | 1737044 A | 12/2006 |
| EP | 1770788 A | 4/2007 |
| EP | 1995787 | 11/2008 |
| EP | 1998373 A | 12/2008 |
| EP | 1998374 A | 12/2008 |
| EP | 1998375 A | 12/2008 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 | 9/1993 |
| JP | 08-264794 | 10/1996 |
| JP | 08-264794 A | 10/1996 |
| JP | 11-505377 | 5/1999 |
| JP | 2000-044236 A | 2/2000 |
| JP | 2000-150900 | 5/2000 |
| JP | 2002-076356 A | 3/2002 |
| JP | 2002-289859 A | 10/2002 |
| JP | 2003-029293 | 1/2003 |
| JP | 2003-086000 | 3/2003 |
| JP | 2003-086000 A | 3/2003 |

(56) References Cited

FOREIGN PATENT DOCUMENTS

| | | |
|---|---|---|
| JP | 2003-086808 | 3/2003 |
| JP | 2004-103957 | 4/2004 |
| JP | 2004-273614 A | 9/2004 |
| JP | 2004-273732 A | 9/2004 |
| JP | 2007-081362 | 3/2007 |
| JP | 2007-096055 | 4/2007 |
| JP | 2007-123861 | 5/2007 |
| JP | 2007-163467 | 6/2007 |
| JP | 2007-171932 | 7/2007 |
| JP | 2008-107807 A | 5/2008 |
| JP | 2008-235871 | 10/2008 |
| JP | 2009-049143 | 3/2009 |
| JP | 2009-265271 | 11/2009 |
| JP | 2010-098280 | 4/2010 |
| WO | WO 2004/114391 | 12/2004 |
| WO | WO-2008/105347 | 9/2008 |

OTHER PUBLICATIONS

Park.J et al., "Improvements in the Device Characteristics of Amorphous Indium Gallium Zinc Oxide Thin-Film Transistors By Ar Plasma Treatment,", Appl. Phys. Lett. (Applied Physics Letters), Jun. 26, 2007, vol. 90, No. 26, pp. 262106-1-262106-3.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Son.K et al., "42.4L: Late-News Paper: 4 Inch QVGA AMOLED Driven by the Threshold Voltage Controlled Amorphous Gizo (Ga2O3-In2O3-ZnO) TFT,", SID Digest '08 : SID International Symposium Digest of Technical Papers, May 20, 2008, vol. 39, pp. 633-636.

Van De Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Nakamura. M, "Synthesis of Homologous Compound with New Long-Period Structure,", NIRIM Newsletter, Mar. 1, 1995, vol. 150, pp. 1-4.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), 2007, vol. 76, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B) Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

International Search Report (Application No. PCT/JP2010/061303) Dated Aug. 10, 2010.

Written Opinion (Application No. PCT/JP2010/061303) Dated Aug. 10, 2010.

Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.

"Transparent Circuit,", Nikkei Electronics, Aug. 27, 2007, No. 959, pp. 39-52.

Kimizuka et al., "Spinel, $YbFe_2O_4$, and $Yb_2Fe_3O_7$ Types of Structures for Compounds in the $In_2O_3$ and $Sc_2O_3$-$A_2O_3$-BO Systems [A: Fe, Ga, Or Al; B: Mg, Mn, Fe, Ni, Cu, or Zn] at Temperatures Over 1000° C." Journal of Solid State Chemistry, 1985, vol. 60, pp. 382-384.

Kimizuka et al., "Syntheses and Single-Crystal Data of Homologous Compounds, $In_2O_3(ZnO)_m$, ($m$=3, 4, and 5), $InGaO_3(ZnO)_3$, and $Ga_2O_3(ZnO)_m$($m$=7, 8, 9, and 16) in the $In_2O_3$-$ZnGa_2O_4$-ZnO System," Journal of Solid State Chemistry, Apr. 1, 1995, vol. 116, No. 1, pp. 170-178.

Nakamura et al., "The Phase Relations in the $In_2O_3$-$Ga_2ZnO_4$-ZnO System at 1350° C.," Journal of Solid State Chemistry, Aug. 1, 1991, vol. 93, No. 2, pp. 298-315.

Li et al., "Modulated Structures of Homologous Compounds $InMO_3(ZnO)_m$ (M=In,Ga; m=Integer) Described by Four-Dimensional Superspace Group," Journal of Solid State Chemistry, 1988, vol. 139, pp. 347-355.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Nomura et al., "Thin-Film Transistor Fabricated in Single-Crystalline Transparent Oxide Semiconductor," Science, May 23, 2003, vol. 300, No. 5623, pp. 1269-1272.

Lee et al., "Current Status of, Challenges to, and Perspective View of AM-OLED," IDW '06: Proceedings of the 13th International Display Workshops, Dec. 7, 2006, pp. 663-666.

(56) References Cited

OTHER PUBLICATIONS

Jeong et al., "3.1: Distinguished Paper: 12.1-Inch WXGA AMOLED Display Driven by Indium—Gallium—Zinc Oxide TFTs Array," SID Digest '08: SID International Symposium Digest of Technical Papers, May 20, 2008, vol. 39, No. 1, pp. 1-4.
Asaoka et al., "29.1: Polarizer-Free Reflective LCD Combined With Ultra Low-Power Driving Technology," SID Digest '09: SID International Symposium Digest of Technical Papers, 2009, pp. 395-398.
Tsuda et al., "Ultra Low Power Consumption Technologies for Mobile TFT-LCDs," IDW '02: Proceedings of the 9th International Display Workshops, Dec. 4, 2002, pp. 295-298.
Kanno et al., "White Stacked Electrophosphorecent Organic Light-Emitting Device Employing $MoO_3$ as a Charge-Generation Layer," Adv. Mater. (Advanced Materials), 2006, vol. 18, No. 3, pp. 339-342.
Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.
Ikeda et al., "Full-Functional System Liquid Crystal Display Using CG-Silicon Technology," SID Digest '04: SID International Symposium Digest of Technical Papers, 2004, vol. 35, pp. 860-863.
Kurokawa et al., "UHF RFCPUS on Flexible and Glass Substrates for Secure RFID Systems," Journal of Solid-State Circuits, 2008, vol. 43, No. 1, pp. 292-299.
Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.
Hirao et al., "Novel Top-Gate Zinc Oxide Thin-Film Transistors (ZnO TFTs) for AMLCDs," Journal of the SID, 2007, vol. 15, No. 1, pp. 17-22.
Lee et al., "World's Largest (15-inch) XGA AMLCD Panel using IGZO Oxide TFT," SID Digest '08: SID International Symposium Digest of Technical Papers, May 20, 2008, vol. 39, pp. 625-628.
Park et al., "Challenge to Future Displays: Transparent AM-OLED Driven by PEALD Grown ZnO TFT," IMID '07 Digest, 2007, pp. 1249-1252.
Park et al., "Amorphous Indium—Gallium—Zinc Oxide TFTs and their Application for Large Size AMOLED," AM-FPD '08 Digest of Technical Papers, Jul. 2, 2008, pp. 275-277.
Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.
Lee et al., "15.4: Excellent Performance of Indium—Oxide-Based Thin-Film Transistors by DC Sputtering," SID Digest '09: SID International Symposium Digest of Technical Papers, May 31, 2009, pp. 191-193.
Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.
Coates et al., "Optical Studies of the Amorphous Liquid-Cholesteric Liquid Crystal Transition: the "Blue Phase"," Physics Letters, Sep. 10, 1973, vol. 45A, No. 2, pp. 115-116.
Meiboom et al., "Theory of the Blue Phase of Cholesteric Liquid Crystals," Phys. Rev. Lett. (Physical Review Letters), May 4, 1981, vol. 46, No. 18, pp. 1216-1219.
Costello et al., "Electron Microscopy of a Cholesteric Liquid Crystal and Its Blue Phase," Phys. Rev. A (Physical Review. A), May 1, 1984, vol. 29, No. 5, pp. 2957-2959.
Kitzerow et al., "Observation of Blue Phases in Chiral Networks," Liquid Crystals, 1993, vol. 14, No. 3, pp. 911-916.
Kikuchi et al., "Polymer-Stabilized Liquid Crystal Blue Phases," Nature Materials, Sep. 2, 2002, vol. 1, pp. 64-68.
Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.
Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.
Park et al., "High performance amorphous oxide thin film transistors with self-aligned top-gate structure," IEDM 09: Technical Digest of International Electron Devices Meeting, Dec. 7, 2009, pp. 191-194.
Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Miyasaka, "58.2: Invited Paper: Suftla Flexible Microelectronics on their Way to Business," SID Digest '07: SID International Symposium Digest of Technical Papers, 2007, vol. 38, pp. 1673-1676.
Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.
Prins et al., "A Ferroelectric Transparent Thin-Film Transistor," Appl. Phys. Lett. (Applied Physics Letters), Jun. 17, 1996, vol. 68, No. 25, pp. 3650-3652.
Takahashi et al., "Theoretical Analysis of IGZO Transparent Amorphous Oxide Semiconductor," IDW '08: Proceedings of the 15th International Display Workshops, Dec. 3, 2008, pp. 1637-1640.
Osada et al., "15.2: Development of Driver-Integrated Panel using Amorphous In—Ga—Zn—Oxide TFT," SID Digest '09: SID International Symposium Digest of Technical Papers, May 31, 2009, pp. 184-187.
Ohara et al., "21.3: 4.0 in. QVGA AMOLED Display Using In—Ga—Zn—Oxide TFTs with a Novel Passivation Layer," SID Digest '09: SID International Symposium Digest of Technical Papers, May 31, 2009, pp. 284-287.
Godo et al., "P-9: Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.
Osada et al., "Development of Driver-Integrated Panel using Amorphous In—Ga—Zn—Oxide TFT," AM-FPD '09 Digest of Technical Papers, Jul. 1, 2009, pp. 33-36.
Godo et al., "Temperature Dependence of Characteristics and Electronic Structure for Amorphous In—Ga—Zn—Oxide TFT," AM-FPD '09 Digest of Technical Papers, Jul. 1, 2009, pp. 41-44.
Ohara et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.
Sakata et al., "Development of 4.0-In. AMOLED Display with Driver Circuit Using Amorphous In—Ga—Zn—Oxide TFTS," IDW '09: Proceedings of the 16th International Display Workshops, 2009, pp. 689-692.
Chinese Office Action (Application No. 201080033672.2) Dated Mar. 5, 2014.

* cited by examiner

FIG. 1A
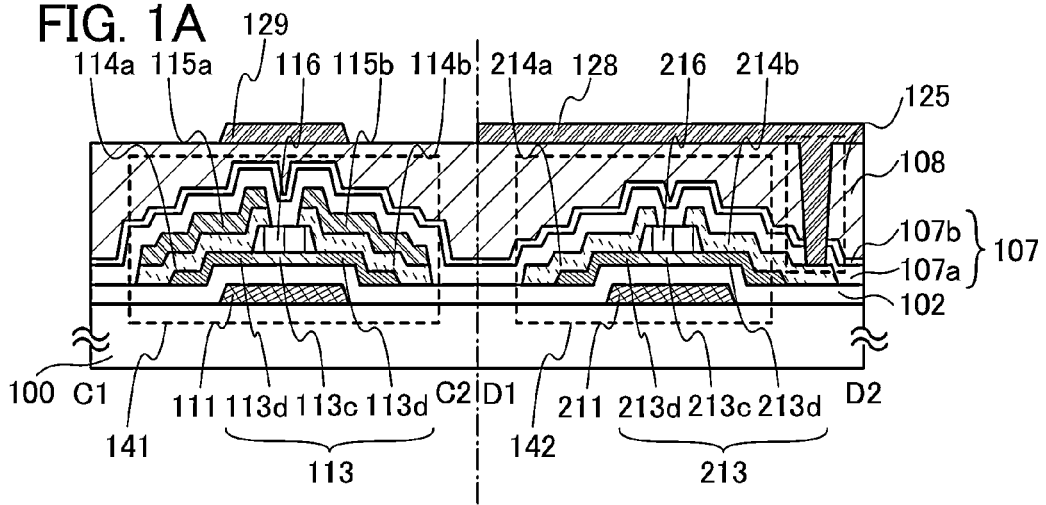
FIG. 1B
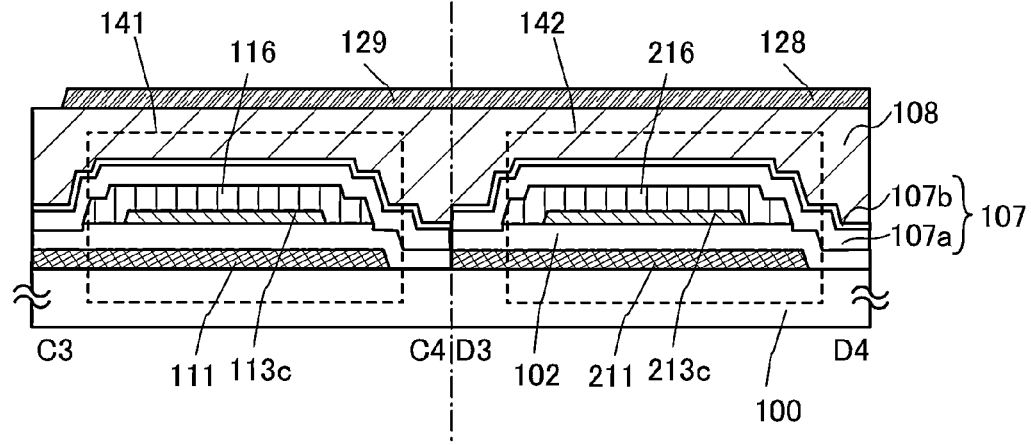
FIG. 1C1
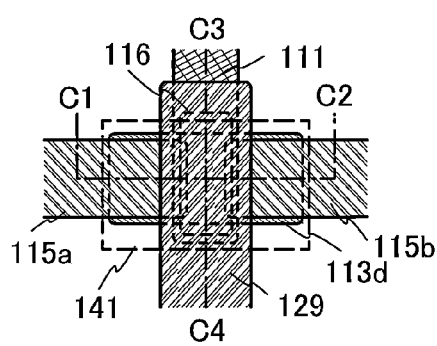
FIG. 1C2
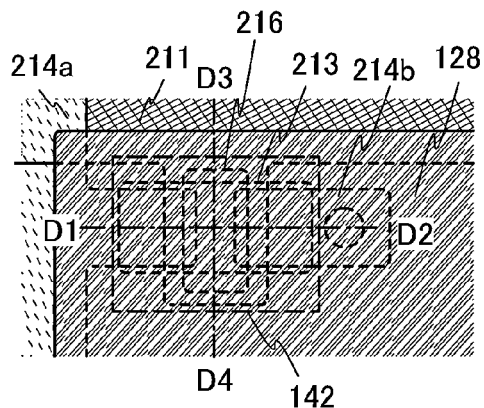

FIG. 4A
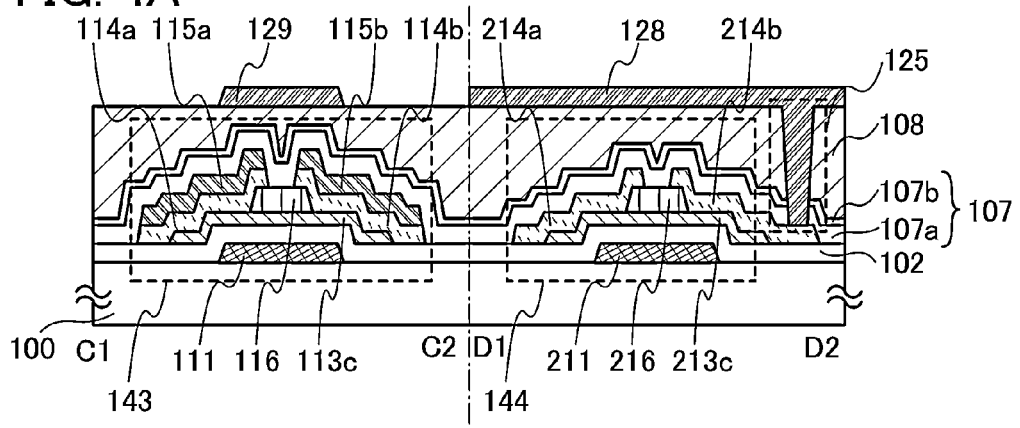
FIG. 4B
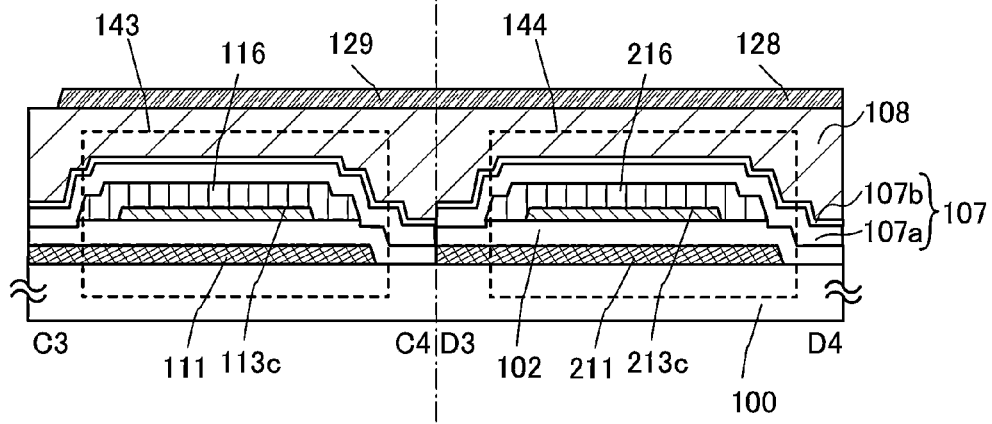
FIG. 4C1
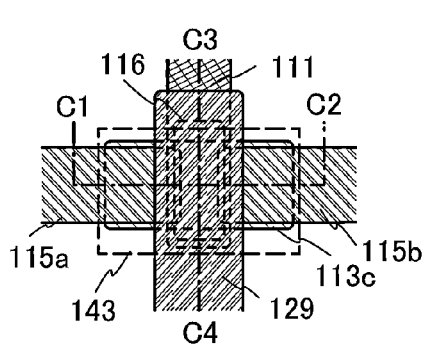
FIG. 4C2
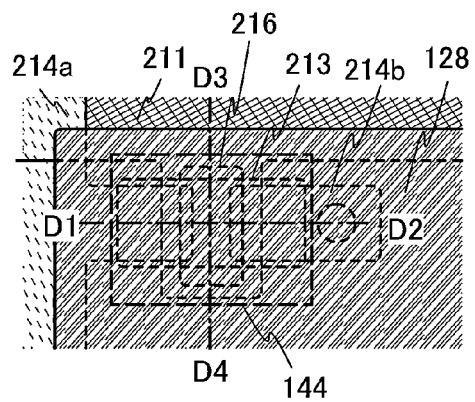

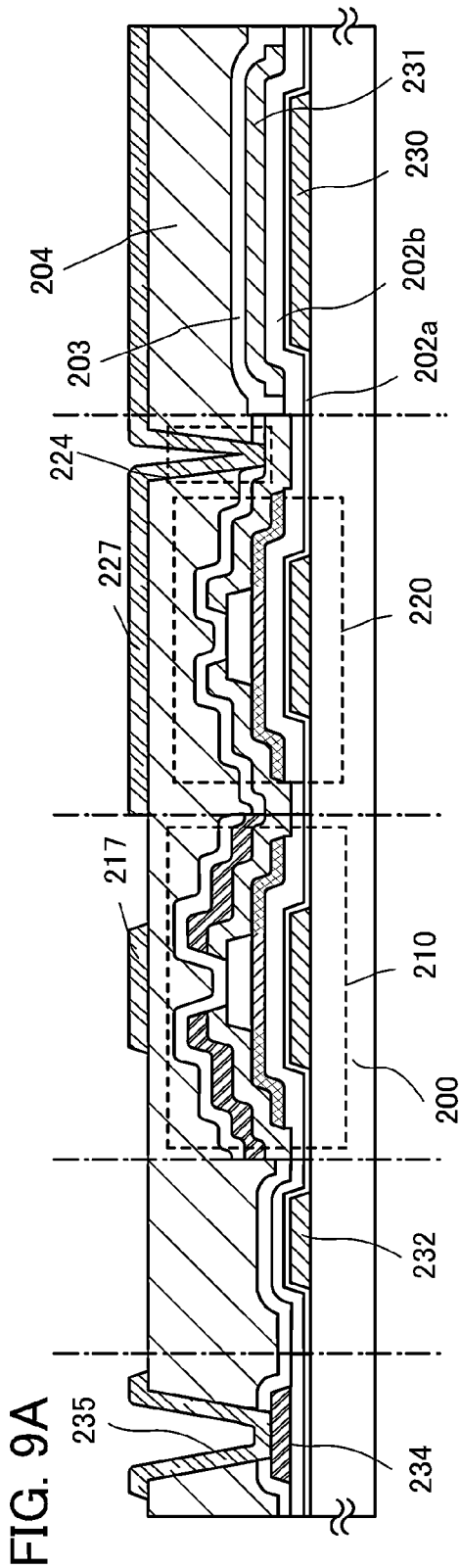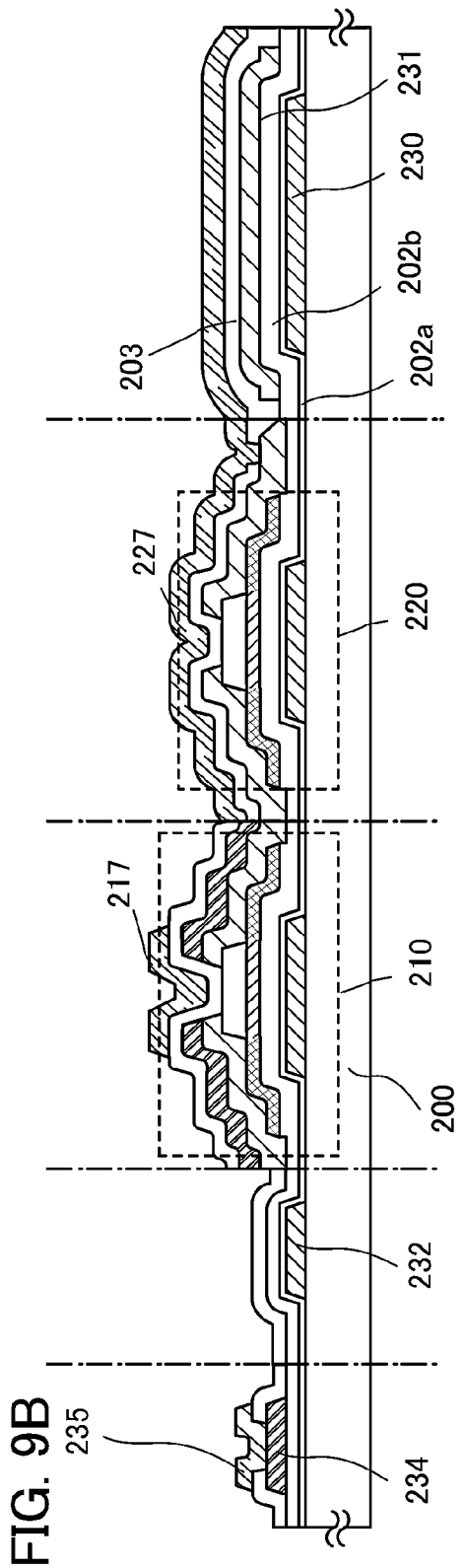

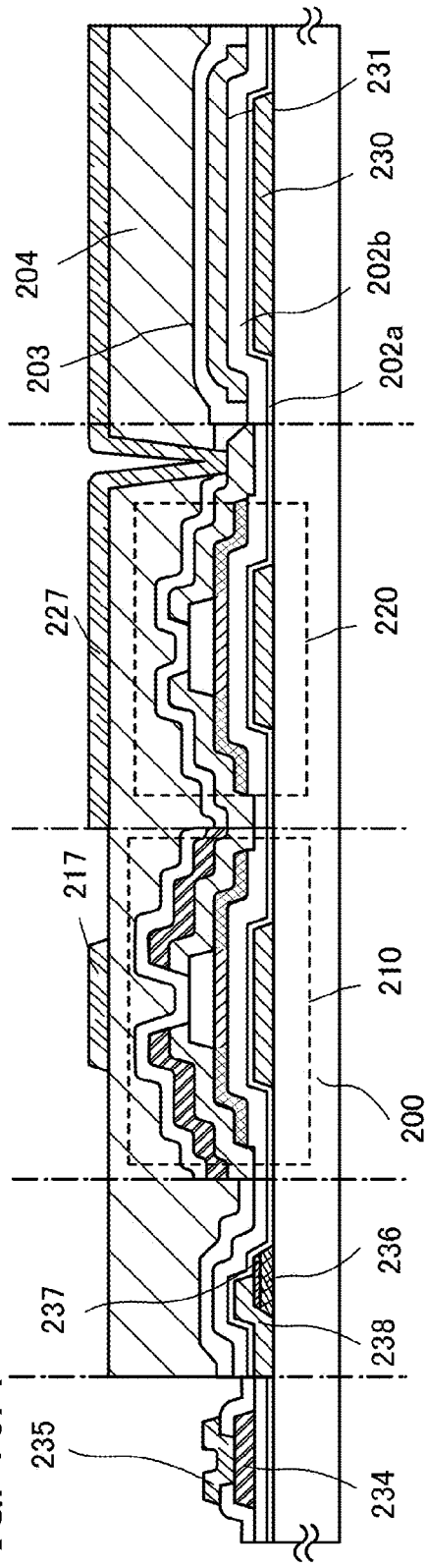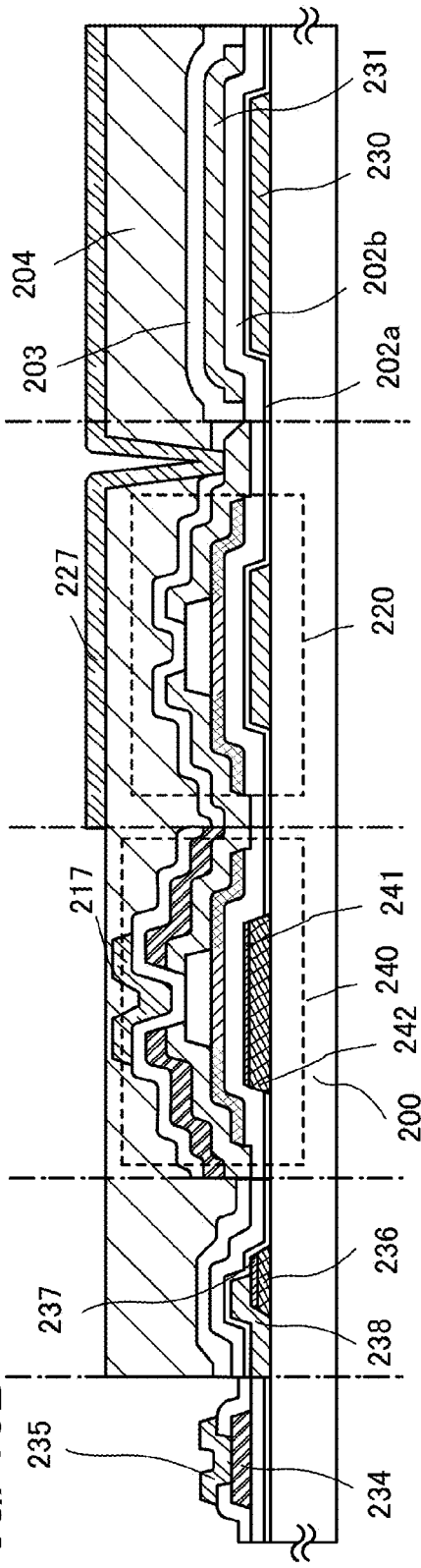

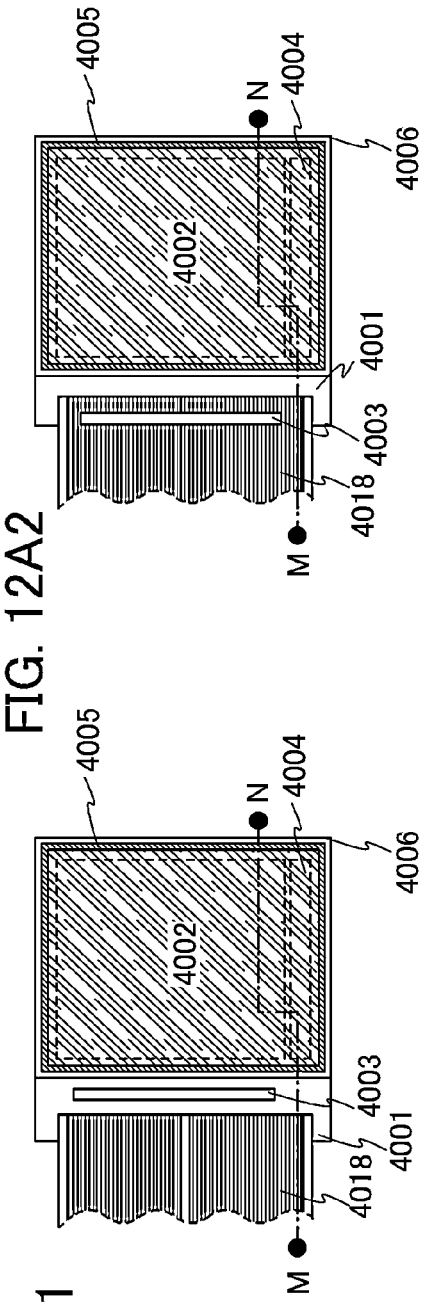
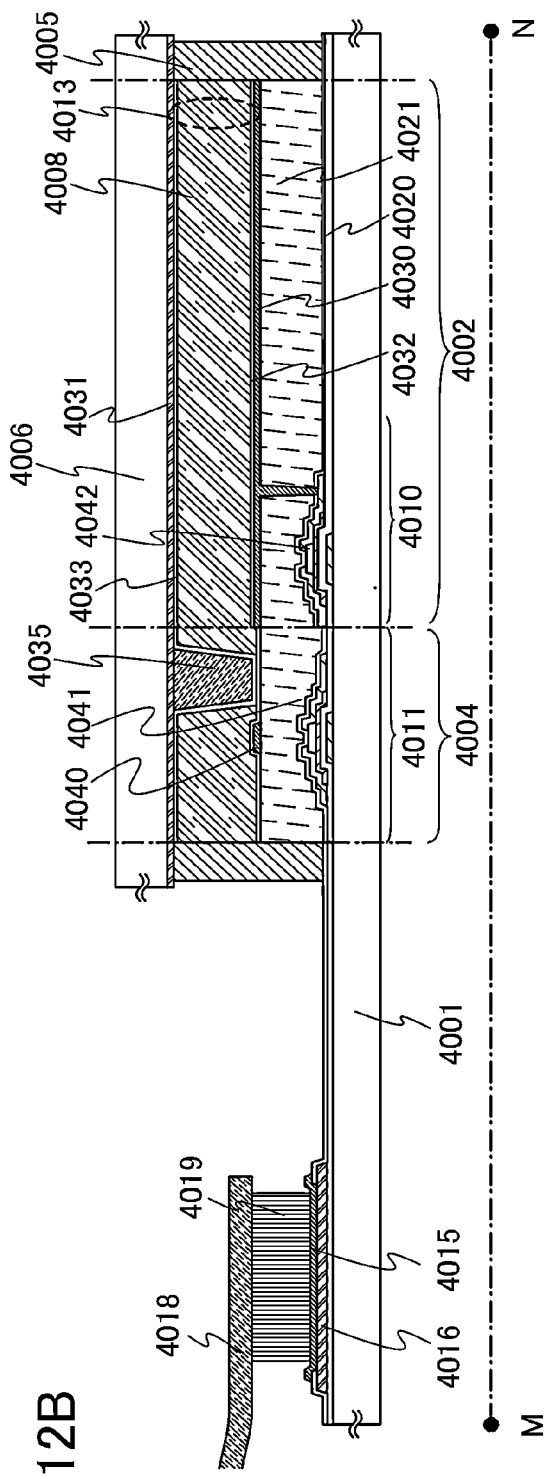

SEMICONDUCTOR DEVICE AND METHOD FOR MANUFACTURING SEMICONDUCTOR DEVICE

TECHNICAL FIELD

The present invention relates to semiconductor devices including oxide semiconductors and manufacturing methods thereof.

Note that in this specification, a semiconductor device refers to all devices that can function by utilizing semiconductor properties, and electro-optic devices such as display devices, semiconductor circuits, and electronic devices are all semiconductor devices.

BACKGROUND ART

Light-transmitting metal oxides are used in semiconductor devices. For example, conductive metal oxides (hereinafter referred to as oxide conductors) such as indium tin oxide (ITO) are used as transparent electrode materials needed in display devices such as liquid crystal displays.

In addition, light-transmitting metal oxides attract attention as materials having semiconductor properties. For example, In—Ga—Zn—O-based oxides and the like are expected to be used as semiconductor materials needed in display devices such as liquid crystal displays. In particular, they are expected to be used for channel layers of thin film transistors (hereinafter also referred to as TFTs).

TFTs which include metal oxides having semiconductor properties (hereinafter referred to as oxide semiconductors) can be formed by low-temperature processes. Thus, expectations for oxide semiconductors as materials which replace or surpass amorphous silicon used in display devices and the like are increased.

Further, oxide conductors and oxide semiconductors have light-transmitting properties. Thus, by forming TFTs with the use of these materials, light-transmitting TFTs can be formed (for example, see Non-Patent Document 1).

Furthermore, TFTs including oxide semiconductors have high field effect mobility. Thus, driver circuits in display devices or the like can be formed using the TFTs (for example, see Non-Patent Document 2).

REFERENCE

Non-Patent Document

[Non-Patent Document 1] T. Nozawa, "Transparent Circuitry", *Nikkei Electronics*, No. 959, Aug. 27, 2007, pp. 39-52.

[Non-Patent Document 2] T. Osada et al., "Development of Driver-Integrated Panel using Amorphous In—Ga—Zn-Oxide TFT", *Proc. SID '09 Digest,* 2009, pp. 184-187.

DISCLOSURE OF INVENTION

It is an object of one embodiment of the present invention to reduce the manufacturing cost of a semiconductor device.

It is an object of one embodiment of the present invention to improve the aperture ratio of a semiconductor device.

It is an object of one embodiment of the present invention to make a display portion of a semiconductor device display a higher-definition image.

It is an object of one embodiment of the present invention to provide a semiconductor device which can be operated at high speed.

One embodiment of the present invention is a display device including a driver circuit portion and a display portion over one substrate. The driver circuit portion includes a driver circuit TFT and a driver circuit wiring. A source electrode (also referred to as a source electrode layer) and a drain electrode (a drain electrode layer) of the driver circuit TFT are formed using a metal. A channel layer of the driver circuit TFT is formed using an oxide semiconductor. The driver circuit wiring is formed using a metal. The display portion includes a pixel TFT and a display portion wiring. A source electrode and a drain electrode of the pixel TFT are formed using an oxide conductor. A semiconductor layer of the pixel TFT is formed using an oxide semiconductor. The display portion wiring is formed using an oxide conductor.

Note that a specific manufacturing process of a TFT and a specific structure of a different element (e.g., a capacitor) included in a display device are not disclosed in Non-Patent Document 1. In addition, it is not disclosed that a driver circuit and a light-transmitting TFT are formed over one substrate.

In a semiconductor device of one embodiment of the present invention, a driver circuit portion including a driver circuit TFT and a display portion including a pixel TFT are formed over one substrate. Thus, the manufacturing cost of the semiconductor device can be reduced.

In a semiconductor device of one embodiment of the present invention, a display portion includes a pixel TFT and a display portion wiring. A source electrode and a drain electrode of the pixel TFT are formed using an oxide conductor. A semiconductor layer of the pixel TFT is formed using an oxide semiconductor. The display portion wiring is formed using an oxide conductor. That is, in the semiconductor device, a region where the pixel TFT and the display portion wiring are formed can be used as an opening. Thus, the aperture ratio of the semiconductor device can be improved.

In a semiconductor device of one embodiment of the present invention, a display portion includes a pixel TFT and a display portion wiring. A source electrode and a drain electrode of the pixel TFT are formed using an oxide conductor. A semiconductor layer of the pixel TFT is formed using an oxide semiconductor. The display portion wiring is formed using an oxide conductor. That is, in the semiconductor device, it is possible to design the pixel size without limitation on the size of the pixel TFT. Thus, it is possible to make the display portion of the semiconductor device display a higher-definition image.

In a semiconductor device of one embodiment of the present invention, a driver circuit portion includes a driver circuit TFT and a driver circuit wiring. A source electrode and a drain electrode of the driver circuit TFT are formed using a metal. A channel layer of the driver circuit TFT is formed using an oxide semiconductor. The driver circuit wiring is formed using a metal. That is, in the semiconductor device, a driver circuit includes a TFT having high field effect mobility and a wiring having low resistance. Thus, the semiconductor device can be operated at high speed.

As an oxide semiconductor used in this specification, a thin film of a material expressed by $InMO_3(ZnO)_m$ (m>0) is formed, and a thin film transistor including the thin film as an oxide semiconductor layer is formed. Note that M denotes one or more metal elements selected from Ga, Fe, Ni, Mn, and Co. For example, M might be Ga or might be Ga and the above metal element other than Ga, for example, Ga and Ni or Ga and Fe. Further, in the oxide semiconductor, in some cases, a transitional metal element such as Fe or Ni or an oxide of the transitional metal is contained as an impurity element in addition to the metal element contained as M. In this specification, among oxide semiconductor layers whose material is expressed by InMO$_3$(ZnO)$_m$ (m>0), an oxide semiconductor which includes Ga as M is referred to as an In—Ga—Zn—O-based oxide semiconductor, and a thin film of the In—Ga—Zn—O-based oxide semiconductor is also referred to as an In—Ga—Zn—O-based non-single-crystal film.

As an oxide semiconductor used for the oxide semiconductor layer, any of the following oxide semiconductors can be used in addition to the above oxide semiconductors: an In—Sn—Zn—O-based oxide semiconductor; an In—Al—Zn—O-based oxide semiconductor; a Sn—Ga—Zn—O-based oxide semiconductor; an Al—Ga—Zn—O-based oxide semiconductor; a Sn—Al—Zn—O-based oxide semiconductor; an In—Zn—O-based oxide semiconductor; a Sn—Zn—O-based oxide semiconductor; an Al—Zn—O-based oxide semiconductor; an In—O-based oxide semiconductor; a Sn—O-based oxide semiconductor; and a Zn—O-based oxide semiconductor. Silicon oxide may be contained in the above oxide semiconductor layer. By inclusion of silicon oxide (SiO$_x$ (x>0)), which hinders crystallization, in the oxide semiconductor layer, crystallization of the oxide semiconductor layer during heat treatment after formation of the oxide semiconductor layer in the manufacturing process can be suppressed. Note that the oxide semiconductor layer is preferably amorphous but may be partly crystallized.

The oxide semiconductor preferably contains In. More preferably, it contains In and Ga. In obtaining an i-type (intrinsic) oxide semiconductor, dehydration or dehydrogenation are effective.

In the case where heat treatment is performed in an atmosphere of an inert gas such as nitrogen or a rare gas (e.g., argon or helium) or under reduced pressure, an oxide semiconductor layer is changed into an oxygen-deficient oxide semiconductor layer by the heat treatment so as to be a low-resistant oxide semiconductor layer, i.e., an n-type (n$^-$-type) oxide semiconductor layer. Then, the oxide semiconductor layer is made to be in an oxygen-excess state by formation of an oxide insulating film which is in contact with the oxide semiconductor layer so as to be a high-resistant oxide semiconductor layer, i.e., an i-type oxide semiconductor layer. Thus, it is possible to form and provide a semiconductor device including a highly reliable thin film transistor having favorable electrical characteristics.

In dehydration or dehydrogenation, heat treatment is performed at a temperature which is higher than or equal to 350° C., preferably higher than or equal to 400° C., and lower than the strain point of a substrate in the atmosphere of an inert gas such as nitrogen or a rare gas (e.g., argon or helium) or under reduced pressure, so that an impurity such as moisture contained in the oxide semiconductor layer is reduced.

The condition of heat treatment performed on the oxide semiconductor layer subjected to dehydration or dehydrogenation is set such that two peaks of water or at least one peak of water at around 300° C. is not detected even when thermal desorption spectroscopy (TDS) at up to 450° C. is performed on the oxide semiconductor layer after being subjected to dehydration or dehydrogenation. Thus, even when TDS at up to 450° C. is performed on a thin film transistor including an oxide semiconductor layer subjected to dehydration or dehydrogenation, at least the peak of water at around 300° C. is not detected.

In addition, it is important not to remix water or hydrogen into the oxide semiconductor layer by cooling the oxide semiconductor layer in the same furnace used for dehydration or dehydrogenation from a heating temperature T at which dehydration or dehydrogenation are performed without exposure to the air. When a thin film transistor is formed using an oxide semiconductor layer obtained by changing an oxide semiconductor layer into a low-resistant oxide semiconductor layer, i.e., an n-type (e.g., n$^-$-type or n$^+$-type) oxide semiconductor layer by dehydration or dehydrogenation and then by changing the oxide semiconductor layer into a high-resistant oxide semiconductor layer so as to be an i-type semiconductor layer, the threshold voltage of the thin film transistor can be positive voltage, so that a so-called normally-off switching element can be realized. It is preferable that a channel of a semiconductor device (display device) be formed under such a condition that the gate voltage of the thin film transistor is a threshold voltage that is positive and as close to 0 V as possible. Note that when the threshold voltage of the thin film transistor is negative, the thin film transistor tends to be so-called normally on; that is, current flows between a source electrode and a drain electrode even when gate voltage is 0 V. In an active matrix display device, the electrical characteristics of a thin film transistor included in a circuit are important and influence the performance of the display device. Among the electrical characteristics of the thin film transistor, the threshold voltage (Vth) is particularly important. When the threshold voltage is high or negative even when field effect mobility is high, it is difficult to control the circuit. In the case where a thin film transistor has a high threshold voltage and a large absolute value of its threshold voltage, the thin film transistor cannot perform a switching function as the TFT and might be a load when the TFT is driven at a low voltage. In the case of an n-channel thin film transistor, it is preferable that a channel be formed and drain current flows after a positive voltage is applied as gate voltage. A transistor in which a channel is not formed unless the driving voltage is increased and a transistor in which a channel is formed and drain current flows even when a negative voltage is applied are unsuitable for a thin film transistor used in a circuit.

In addition, the gas atmosphere in which temperature is lowered from the heating temperature T may be changed into a gas atmosphere which is different from the gas atmosphere in which temperature is raised to the heating temperature T. For example, cooling is performed by using the furnace in which dehydration or dehydrogenation are performed and by filling the furnace with a high-purity oxygen gas, a high-purity N$_2$O gas, or ultra-dry air (having a dew point of –40° C. or lower, preferably –60° C. or lower) without exposure to the air.

The electrical characteristics of a thin film transistor are improved using an oxide semiconductor film cooled slowly (or cooled) in an atmosphere which does not contain moisture (having a dew point of –40° C. or lower, preferably –60° C. or lower) after moisture contained in a film is reduced by heat treatment in which dehydration or dehydrogenation are performed, and high-performance thin film transistors which can be mass-produced are realized.

In this specification, heat treatment in the atmosphere of an inert gas such as nitrogen or a rare gas (e.g., argon or helium) or under reduced pressure is referred to as heat treatment for dehydration or dehydrogenation. In this specification, for convenience, dehydration or dehydrogenation refer not only to elimination as H$_2$ but also to elimination of H, OH, or the like.

In the case where heat treatment is performed in the atmosphere of an inert gas such as nitrogen or a rare gas (e.g., argon or helium) or under reduced pressure, an oxide semiconductor layer is changed into an oxygen-deficient oxide semiconductor layer by the heat treatment so as to be a low-resistant oxide semiconductor layer, i.e., an n-type (n$^-$-type) oxide semiconductor layer. After that, a region overlapping with a drain electrode layer as a high-resistant drain region (also referred to as an HRD region) which is an oxygen-deficient region is formed.

Specifically, the carrier concentration of the high-resistant drain region is higher than or equal to $1\times10^{17}/cm^3$ and is at least higher than the carrier concentration of a channel formation region (lower than $1\times10^{17}/cm^3$). Note that the carrier concentration in this specification is carrier concentration obtained by Hall effect measurement at room temperature.

A low-resistant drain region (also referred to as an LRN region) may be formed between the oxide semiconductor layer and the drain electrode layer formed using a metal material. Specifically, the carrier concentration of the low-resistant drain region is higher than that of the high-resistant drain region (the HRD region); for example, it is higher than or equal to $1\times10^{20}/cm^3$ and lower than or equal to $1\times10^{21}/cm^3$.

Then, a channel formation region is formed by making at least a part of the oxide semiconductor layer subjected to dehydration or dehydrogenation in an oxygen-excess state so as to be a high-resistant oxide semiconductor layer, i.e., an i-type oxide semiconductor layer. Note that as the treatment for making the oxide semiconductor layer subjected to dehydration or dehydrogenation in an oxygen-excess state, deposition of an oxide insulating film which is in contact with the oxide semiconductor layer subjected to dehydration or dehydrogenation by sputtering, heat treatment after the deposition of the oxide insulating film, heat treatment after the deposition of the oxide insulating film in an atmosphere containing oxygen, cooling treatment in an oxygen atmosphere after heat treatment in an inert gas atmosphere after the deposition of the oxide insulating film, cooling treatment in ultra-dry air (having a dew point of $-40°$ C. or lower, preferably $-60°$ C. or lower) after heat treatment in an inert gas atmosphere after the deposition of the oxide insulating film, or the like is performed.

Further, in order to use at least a part of the oxide semiconductor layer subjected to dehydration or dehydrogenation (a portion overlapping with a gate electrode layer) as the channel formation region, the oxide semiconductor layer is selectively made in an oxygen-excess state so as to be a high-resistant oxide semiconductor layer, i.e., an i-type oxide semiconductor layer. The channel formation region can be formed in such a manner that a source electrode layer and a drain electrode layer including metal electrodes of Ti or the like are formed on and in contact with the oxide semiconductor layer subjected to dehydration or dehydrogenation and exposure regions which do not overlap with the source electrode layer and the drain electrode layer are selectively made in an oxygen-excess state. In the case where the exposure regions are selectively made in an oxygen-excess state, a first high-resistant drain region overlapping with the source electrode layer and a second high-resistant drain region overlapping with the drain electrode layer are formed, and the channel formation region is formed between the first high-resistant drain region and the second high-resistant drain region. That is, the channel formation region is formed between the source electrode layer and the drain electrode layer in a self-aligning manner.

Thus, it is possible to form and provide a semiconductor device including a highly reliable thin film transistor having favorable electrical characteristics.

Note that by forming the high-resistant drain region in the oxide semiconductor layer overlapping with the drain electrode layer (and the source electrode layer), the reliability when a driver circuit is formed can be improved. Specifically, by forming the high-resistant drain region, it is possible to employ a structure in which conductivity can be gradually varied from the drain electrode layer to the high-resistant drain region and the channel formation region. In the case where operation is performed with the drain electrode layer connected to a wiring for supplying a high power supply potential VDD, even when a high electric field is applied between the gate electrode layer and the drain electrode layer, the high electric field is not applied locally because the high-resistant drain region serves as a buffer; therefore, the withstand voltage of the transistor can be improved.

A low-resistant drain region (also referred to as an LRN region) may be formed between the drain electrode layer (and the source electrode layer) formed using a metal material and the oxide semiconductor layer. The low-resistant drain region (also referred to as the LRN region) can further improve the withstand voltage of the transistor.

In addition, by forming the high-resistant drain region in the oxide semiconductor layer overlapping with the drain electrode layer (and the source electrode layer), the amount of leakage current in the channel formation region when the driver circuit is formed can be reduced. Specifically, by forming the high-resistant drain region, the leakage current of the transistor, which flows between the drain electrode layer and the source electrode layer, flows sequentially from the drain electrode layer, the high-resistant drain region on the drain electrode layer side, the channel formation region, the high-resistant drain region on the source electrode layer side, and the source electrode layer. In this case, in the channel formation region, leakage current flowing from an low-resistant n-type region on the drain electrode layer side to the channel formation region can be concentrated on the vicinity of an interface between the channel formation region and a gate insulating layer which has high resistance when the transistor is off. Thus, the amount of leakage current in a back channel portion (a part of a surface of the channel formation region, which is apart from the gate electrode layer) can be reduced.

Further, the first high-resistant drain region overlapping with the source electrode layer and the second high-resistant drain region overlapping with the drain electrode layer overlap with a part of the gate electrode layer with the gate insulating layer interposed therebetween depending on the width of the gate electrode layer, and the intensity of an electric field near an end portion of the drain electrode layer can be reduced more effectively.

That is, a semiconductor device which is one embodiment of the present invention includes: a driver circuit including a first thin film transistor, and a pixel portion including a second thin film transistor over one substrate. The second thin film transistor includes: a bottom-gate electrode over the substrate, a gate insulating layer over the bottom-gate electrode, an oxide semiconductor layer over the gate insulating layer, a second channel protective layer in contact with a part of the oxide semiconductor layer, a source electrode and a drain electrode over the second channel protective layer and the oxide semiconductor layer, and a pixel electrode layer over the second channel protective layer. The bottom-gate electrode, the gate insulating layer, the oxide semiconductor layer, the source electrode, the drain electrode, the second channel protective layer, and the pixel electrode layer of the second thin film transistor have a light-transmitting property. A material for a source electrode and a drain electrode of the first thin film transistor is different from that for the source electrode and the drain electrode of the second thin film transistor, and it is a conductive material which has a lower resistance than the source electrode and the drain electrode of the second thin film transistor.

Another embodiment of the present invention is a semiconductor device according to the above semiconductor device, in which the first thin film transistor includes: a first channel protective layer in contact with a part of an oxide semiconductor layer of the first thin film transistor, and a source and a drain electrode over the first channel protective layer and the oxide semiconductor layer.

Another embodiment of the present invention is a semiconductor device according to the above semiconductor device, in which the first thin film transistor includes: a first channel protective layer in contact with a part of an oxide semiconductor layer of the first thin film transistor, a source electrode and a drain electrode over the first channel protective layer and the oxide semiconductor layer, and a back-gate electrode over a channel formation region with the first channel protective layer interposed therebetween.

Another embodiment of the present invention is a semiconductor device according to the above semiconductor device, in which the first channel protective layer and the second channel protective layer are formed using the same light-transmitting insulating material.

Another embodiment of the present invention is a semiconductor device according to the above semiconductor device, in which the source electrode and the drain electrode of the first thin film transistor are each formed using an element selected from Al, Cr, Cu, Ta, Ti, Mo, and W, or a stacked film formed in combination with an alloy film thereof.

Another embodiment of the present invention is a semiconductor device according to the above semiconductor device, in which the source electrode, the drain electrode, and the pixel electrode layer of the second thin film transistor are formed using indium oxide, an alloy of indium oxide and tin oxide, an alloy of indium oxide and zinc oxide, or zinc oxide.

Another embodiment of the present invention is a semiconductor device according to the above semiconductor device, which includes a capacitor portion over the same substrate. The capacitor portion includes a capacitor wiring and a capacitor electrode overlapping with the capacitor wiring. The capacitor wiring and the capacitor electrode have a light-transmitting property.

A thin film transistor having stable electrical characteristics can be provided. Therefore, a semiconductor device which includes highly reliable thin film transistors having favorable electrical characteristics can be provided.

BRIEF DESCRIPTION OF DRAWINGS

In the accompanying drawings:

FIGS. 1A, 1B, 1C1, and 1C2 illustrate thin film transistors;
FIGS. 4A, 4B, 4C1, and 4C2 illustrate thin film transistors;
FIGS. 9A and 9B illustrate a semiconductor device;
FIGS. 10A and 10B illustrate a semiconductor device;
FIGS. 12A1, 12A2, and 12B illustrate a display device.

BEST MODE FOR CARRYING OUT THE INVENTION

Figure 2A:
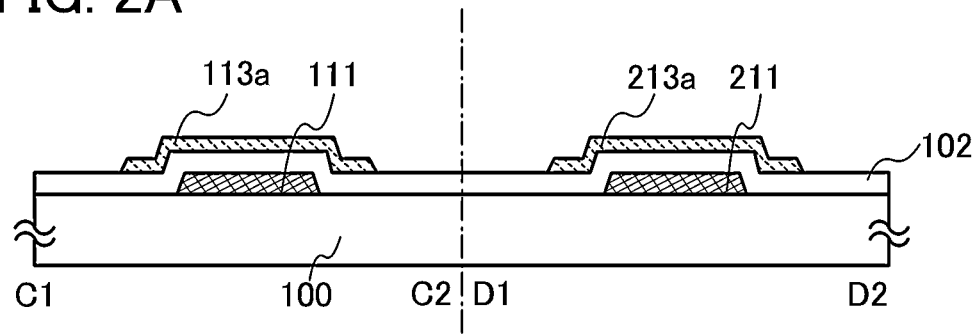
FIGS. 2A to 2C illustrate a method for manufacturing the thin film transistors.

Embodiments are described in detail with reference to the accompanying drawings. Note that the present invention is not limited to the following description and it will be readily appreciated by those skilled in the art that modes and details can be modified in various ways without departing from the spirit and the scope of the present invention. Therefore, the invention should not be construed as being limited to the description in the following embodiments. Note that in structures of the present invention described hereinafter, the same portions or portions having similar functions are denoted by the same reference numerals in different drawings, and description thereof is not repeated.

Embodiment 1

In this embodiment, described are a thin film transistor which is one embodiment of the present invention and its manufacturing method.

FIG. 1A illustrates a cross-sectional view of a thin film transistor 141 and a thin film transistor 142, each of which is one embodiment of the present invention. The thin film transistors 141 and 142 are formed over a substrate 100, and both of them are bottom-gate type thin film transistors. The thin film transistor 141 is provided for a driver circuit, and the thin film transistor 142 is provided for a pixel.

FIG. 1C1 is a plane view of the channel-stop-type thin film transistor 141 provided for a driver circuit, and a cross-sectional view taken along line C1-C2 in FIG. 1C1 is illustrated in FIG. 1A. A cross-sectional view taken along line C3-C4 in FIG. 1C1 is illustrated in FIG. 1B.

FIG. 1C2 is a plane view of the channel-stop-type thin film transistor 142 provided for a pixel, and a cross-sectional view taken along line D1-D2 in FIG. 1C2 is illustrated in FIG. 1A. A cross-sectional view taken along line D3-D4 in FIG. 1C2 is illustrated in FIG. 1B.

The thin film transistor 141 includes a first bottom-gate electrode 111, a gate insulating film 102, an oxide semiconductor layer 113 including a third oxide semiconductor layer 113c and fourth oxide semiconductor regions 113d, a first channel protective layer 116, and source and drain electrodes each formed over the substrate 100. Note that the source and drain electrodes are formed using a conductive layer in which a second conductive layer 115a is stacked over a first conductive layer 114a which transmits visible light, and a conductive layer in which a second conductive layer 115b is stacked over a first conductive layer 114b which transmits visible light. Further, a first protective insulating film 107 is formed to cover these and to be in contact with the first channel protective layer 116. A second protective insulating film 108 is formed over the first protective insulating film 107. Furthermore, a back-gate electrode 129 is formed over the second protective insulating film 108 and it overlaps with the third oxide semiconductor layer 113c.

Note that the low-resistant fourth oxide semiconductor regions 113d in contact with undersurfaces of the source and drain electrodes are formed in a self-aligned manner with respect to the channel protective layer. In addition, the thin film transistor 141 described in this embodiment is one embodiment of a channel-stop type.

When a pixel portion and a driver circuit are formed over one substrate in a liquid crystal display device, in the driver circuit, only either positive polarity or negative polarity is applied between the source and drain electrodes in a thin film transistor for constituting a logic gate such as an inverter circuit, a NAND circuit, a NOR circuit, or a latch circuit or a thin film transistor for constituting an analog circuit such as a sense amplifier, a constant voltage generating circuit, or a VCO. Therefore, one of the fourth oxide semiconductor regions 113d which requires a withstand voltage may be designed to be wider than the other fourth oxide semiconductor region 113d. In addition, the width of the fourth oxide semiconductor region 113d overlapping with the bottom-gate electrode may be increased.

A thin film transistor having a single-gate structure is described as the thin film transistor 141 provided for a driver circuit; however, a thin film transistor having a multi-gate structure in which a plurality of channel formation regions are included can also be used as needed.

The back-gate electrode 129 is formed over and to overlap with the oxide semiconductor layer 113. The oxide semiconductor layer 113 is interposed between the bottom-gate electrode 111 and the back-gate electrode 129. By electrically connecting the back-gate electrode 129 and the bottom-gate electrode 111 to have the same potential, a gate voltage can be applied to the oxide semiconductor layer 113 from above and below. When the potential of the bottom-gate electrode 111 and that of the back-gate electrode 129 are different, for example, one of them has a fixed potential, GND, or 0 V, electrical characteristics of the TFT such as the threshold voltage can be controlled. Note that in this specification, the conductive layer formed over and to overlap with the oxide semiconductor layer 113 is referred to as the back-gate electrode 129 regardless of its potential. Therefore, the back-gate electrode 129 can also be in a floating state.

The first protective insulating film 107 and the second protective insulating film 108 are stacked between the back-gate electrode 129 and the oxide semiconductor layer 113.

The thin film transistor 142 includes a second bottom-gate electrode 211, the gate insulating film 102, an oxide semiconductor layer 213 formed of a third oxide semiconductor layer 213c and fourth oxide semiconductor regions 213d, a second channel protective layer 216, and source and drain electrodes (denoted by 214a and 214b) each formed over the substrate 100. Further, the first protective insulating film 107 is formed to cover these and to be in contact with the second channel protective layer 216. The second protective insulating film 108 is formed over the first protective insulating film 107.

Note that the low-resistant fourth oxide semiconductor regions 213d in contact with undersurfaces of the source and drain electrodes are formed in a self-aligned manner. In addition, the thin film transistor 142 described in this embodiment is one embodiment of a channel-stop type. Note also that a pixel electrode 128 is formed over the second protective insulating film 108 to overlap with the thin film transistor 142.

An AC drive is performed in the liquid crystal display device in order to prevent deterioration of a liquid crystal. Through the AC drive, the polarity of a signal potential applied to a pixel electrode layer is inverted to be negative or positive at regular intervals of time. In a TFT connected to the pixel electrode layer, a pair of electrodes functions alternately as a source electrode and a drain electrode. In this specification, one electrode of the pixel thin film transistor is referred to as a source electrode and the other is referred to as a drain electrode; actually in AC drive, one electrode functions alternately as the source electrode and the drain electrode. In order to reduce leakage current, the second bottom-gate electrode of the thin film transistor 142 provided for a pixel may be narrower than the first bottom-gate electrode of the thin film transistor 141 provided for a driver circuit. In order to reduce the leakage current, the bottom-gate electrode of the thin film transistor 142 provided for a pixel may be designed so as not to overlap with the source or drain electrode.

A thin film transistor having a single-gate structure is described as the thin film transistor 142 provided for a pixel; however, a thin film transistor having a multi-gate structure in which a plurality of channel formation regions are included can also be used as needed.

In the thin film transistor 142, used are: the third oxide semiconductor layer 213c which transmits visible light; the second bottom-gate electrode 211 and the source and drain electrodes (denoted by 214a and 214b) formed using a conductive film which transmits visible light; the substrate 100 which transmits visible light; and the second channel protective layer 216, the first protective insulating film 107, and the second protective insulating film 108 which transmit visible light. Therefore, the thin film transistor 142 is a so-called transparent transistor which transmits visible light.

FIGS. 2A to 2C and FIGS. 3A to 3C illustrate cross-sectional views in manufacture of the thin film transistors 141 and 142.

The substrate 100 transmits visible light and has an insulating surface. Specifically, it is possible to use any glass substrate used in the electronics industry (also called an alkali-free glass substrate) such as an aluminosilicate glass substrate, an aluminoborosilicate glass substrate, or a barium borosilicate glass substrate, a plastic substrate with heat resistance which can withstand a process temperature in this manufacturing process, or the like. When the substrate 100 having an insulating surface is a mother glass, any of the following sizes of the substrate can be used: the first generation (320 mm×400 mm); the second generation (400 mm×500 mm); the third generation (550 mm×650 mm); the fourth generation (680 mm×880 mm or 730 mm×920 mm); the fifth generation (1000 mm×1200 mm or 1100 mm×1250 mm); the sixth generation (1500 mm×1800 mm); the seventh generation (1900 mm×2200 mm); the eighth generation (2160 mm×2460 mm); the ninth generation (2400 mm×2800 mm or 2450 mm×3050 mm); the tenth generation (2950 mm×3400 mm); and the like.

A base insulating layer may be formed between the substrate 100 and electrode the first bottom-gate electrode 111 and between the substrate 100 and the second bottom-gate electrode 211. The base insulating layer can be formed using an insulating film preventing diffusion of an impurity element (e.g., sodium) from the substrate 100 into the thin film transistor. For example, it is possible to use one or more films selected from a silicon nitride film, a silicon oxide film, a silicon nitride oxide film, and a silicon oxynitride film.

The first bottom-gate electrode 111 and the second bottom-gate electrode 211 are formed over the substrate 100 having an insulating surface. The first bottom-gate electrode 111 and the second bottom-gate electrode 211 are formed using a conductive film which transmits visible light.

The first bottom-gate electrode 111 and the second bottom-gate electrode 211 are formed using a light-transmitting conductive material, for example, indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, a Sn—Zn—O-based oxide semiconductor, an Al—Zn—O-based oxide semiconductor, an In—O-based oxide semiconductor, a Sn—O-based oxide semiconductor, a Zn—O-based oxide semiconductor, or the like. The thickness is set within the range of 50 nm to 300 nm inclusive.

Alternatively, it is possible to use, for example, an oxynitride film containing In (indium), Ga (gallium), and Zn (zinc) formed by sputtering using an oxide semiconductor target containing In, Ga, and Zn ($In_2O_3$:$Ga_2O_3$:ZnO=1:1:1) in an atmosphere containing a nitrogen gas. Further alternatively, an Al—Zn—O-based non-single-crystal film, or an Al—Zn—O-based non-single-crystal film containing nitrogen, in other words, an Al—Zn—O—N-based non-single-crystal film (also referred to as an AZON film) may be used.

The light-transmitting conductive film is deposited by a sputtering method, a vacuum evaporation method (e.g., an electron beam evaporation method), an arc discharge ion plating method, or a spray method. When a sputtering method is employed, it is preferable that deposition be performed using a target containing $SiO_2$ of 2 to 10 percent by weight and SiOx (x>0) which inhibits crystallization be contained in the light-transmitting conductive film so as to prevent crystallization at the time of the heat treatment for dehydration or dehydrogenation in a later step.

A wiring layer including the first bottom-gate electrode 111, similarly to the second bottom-gate electrode 211, may be formed using a conductive material which transmits visible light. Alternatively, it may be formed using a metal material having heat resistance such as molybdenum or tungsten, or an alloy material containing one of these elements as a main component, as a single layer or a stacked layer.

The wiring layer including the first bottom-gate electrode 111 is preferably formed using the same conductive film as the second bottom electrode 211 because the number of steps can be reduced. The wiring layer including the first bottom-gate electrode 111 is preferably formed using a metal material having heat resistance or an alloy material containing it as a main component because wiring resistance can be reduced.

For example, in the case where the wiring layer including the first bottom-gate electrode 111 has a two-layer structure, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. In the case of a three-layer structure, a stacked-layer structure of a tungsten layer or a tungsten nitride layer, a layer of an alloy of aluminum and silicon or an alloy of aluminum and titanium, and a titanium nitride layer or a titanium layer is preferable.

In this embodiment, after a conductive film which transmits visible light is formed over an entire surface of the substrate 100, a first photolithography step is performed to form a resist mask over the conductive film, unnecessary portions are removed by etching, and wirings and electrodes (e.g., a gate wiring including the first bottom-gate electrode 111 and the second bottom-gate electrode 211, a capacitor wiring, a terminal electrode, and the like) are formed.

Next, the gate insulating film 102 is formed over the first bottom-gate electrode 111 and the second bottom-gate electrode 211. In this embodiment, a single layer of silicon nitride is formed as the gate insulating film 102.

The gate insulating film 102 can be formed using a single layer or a stacked layer using any of a silicon oxide layer, a silicon nitride layer, a silicon oxynitride layer, and a silicon nitride oxide layer. Here, a single layer of silicon nitride film is used.

The gate insulating film 102 can be formed by a plasma CVD method or a sputtering method, for example. In the case of employing the plasma CVD method, a silicon oxynitride layer may be formed using $SiH_4$ and either or both oxygen or/and nitrogen as a source gas. Alternatively, dinitrogen monoxide or the like may be used instead of oxygen and nitrogen.

Next, an oxide semiconductor film is formed over the gate insulating film 102.

It is possible to use the following as the oxide semiconductor film: an In—Ga—Zn—O-based non-single-crystal film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, an Sn—O-based oxide semiconductor film, or a Zn—O-based oxide semiconductor film. In this embodiment, the oxide semiconductor film is formed by a sputtering method with use of an In—Ga—Zn—O-based oxide semiconductor target. Alternatively, the oxide semiconductor film can be formed by a sputtering method in a rare gas (typically argon) atmosphere, an oxygen atmosphere, or an atmosphere containing a rare gas (typically argon) and oxygen. When a sputtering method is employed, it is preferable that deposition be performed using a target containing $SiO_2$ of 2 to 10 percent by weight and SiOx (x>0) which inhibits crystallization be contained in the light-transmitting conductive film so as to prevent crystallization at the time of the heat treatment for dehydration or dehydrogenation in a later step.

Next, the oxide semiconductor film is processed into island-shaped first oxide semiconductor layers 113a and 213a through a second photolithography step (see FIG. 2A). A resist mask for forming the island-shaped oxide semiconductor layers may be formed by an ink-jet method. In the case where the resist mask is formed by an ink-jet method, manufacture cost can be reduced because a photomask is unnecessary.

Note that before the oxide semiconductor film is formed by a sputtering method, dust attached to a surface of the gate insulating film 102 is preferably removed by reverse sputtering in which an argon gas is introduced to generate plasma.

The reverse sputtering refers to a method in which, without application of a voltage to a target side, an RF power source is used for application of a voltage to a substrate side in an argon atmosphere to modify a surface. Note that, nitrogen, helium, oxygen, or the like may be used instead of an argon atmosphere.

Next, dehydration or dehydrogenation are performed on the first oxide semiconductor layers 113a and 213a. The temperature in first heat treatment for dehydration or dehydrogenation is higher than or equal to 350° C. and less than the strain point, preferably higher than or equal to 400° C. Here, after the substrate is introduced into an electric furnace, which is one of heating apparatuses, and the oxide semiconductor layer is subjected to heat treatment in a nitrogen atmosphere, reentry of water and hydrogen into the oxide semiconductor layer is prevented by cooling the oxide semiconductor layer without being exposed to the air. In this manner, second oxide semiconductor layers 113b and 213b are obtained (see FIG. 2B).

In this embodiment, the same furnace is used from the heating temperature T at which the oxide semiconductor film is subjected to dehydration or dehydrogenation to a temperature sufficient to prevent water from entering again; specifically, slow cooling is performed in a nitrogen atmosphere until the temperature drops by 100° C. or more from the heating temperature T. Moreover, without limitation to a nitrogen atmosphere, dehydration or dehydrogenation may be performed in an inert gas atmosphere such as helium, neon, or argon, or under a reduced pressure.

Note that in the first heat treatment, it is preferable that nitrogen or a rare gas such as helium, neon, or argon do not contain water, hydrogen, or the like. Alternatively, it is preferable that the purity of nitrogen or a rare gas such as helium, neon, or argon which is introduced to the heat treatment apparatus be 6N (99.9999%) or more, more preferably 7N (99.99999%) or more (that is, the impurity concentration is 1 ppm or lower, more preferably 0.1 ppm or lower).

The oxide semiconductor layer can be crystallized to be a microcrystalline film or a polycrystalline film in some cases because of conditions of the first heat treatment or materials of the oxide semiconductor layer.

The first heat treatment for the oxide semiconductor layer can be performed before the oxide semiconductor film is processed into the island-shaped oxide semiconductor layers. In that case, after the first heat treatment, the substrate is extracted from the heat treatment apparatus, and then the second photolithography step is performed.

Before formation of the oxide semiconductor film, the substrate may be subjected to heat treatment (at higher than or equal to 400° C. and lower than the strain point of the substrate) in an inert gas atmosphere (nitrogen, helium, neon, argon or the like), an oxygen atmosphere, or a reduced pressure, so that impurities such as hydrogen and water in the gate insulating layer are removed.

Next, an insulating film to be the channel protective layers is formed in contact with the second oxide semiconductor layers 113b and 213b. The insulating film to be the channel protective layers in contact with the second oxide semiconductor layers 113b and 213b can be formed using an oxide insulating film with a thickness of at least 1 nm by a sputtering method or the like. Any method for preventing entry of impurities such as water and hydrogen into the oxide insulating film can be used as appropriate.

In this embodiment, a 300-nm-thick silicon oxide film is formed by a sputtering method as the oxide insulating film. The substrate temperature in the formation may be room temperature to 300° C. inclusive; in this embodiment, it is 100° C. Formation of the silicon oxide film by a sputtering method can be performed in a rare gas (typically argon) atmosphere, an oxygen atmosphere, or an atmosphere containing a rare gas (typically argon) and oxygen. The target can be a silicon oxide target or a silicon target. For example, the silicon oxide film can be formed using a silicon target by a sputtering method in an atmosphere containing oxygen and nitrogen. An example of the channel protective layer formed in contact with the low-resistant oxide semiconductor layer is an inorganic insulating film which does not contain impurities such as moisture, a hydrogen ion, and OH⁻ and blocks entry of them from the outside. Typically, a silicon oxide film, a silicon nitride oxide film, an aluminum oxide film, an aluminum oxynitride film, or the like can be used.

Next, a third photolithography step is performed to form a resist mask over the insulating film which is to be the channel protective layer. Then, unnecessary portions are removed by etching and the first channel protective layer 116 and the second channel protective layer 216 are formed.

Figure 2B:
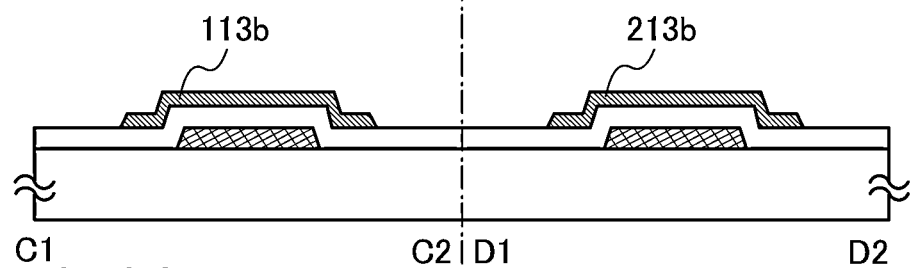
Figure 2C:
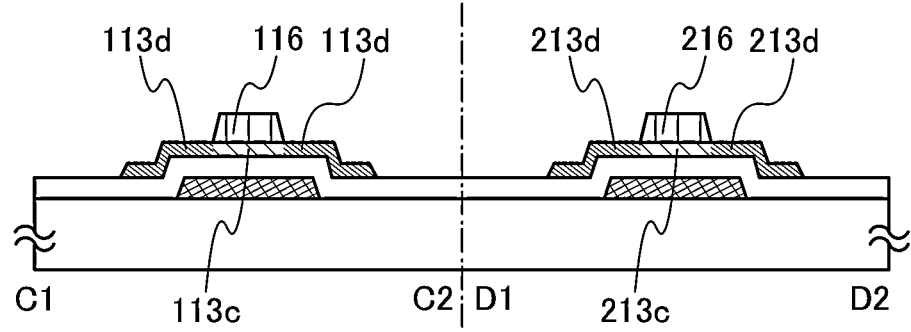

Next, second heat treatment (preferably at 200° C. to 400° C. inclusive, for example 250° C. to 350° C. inclusive) is performed in an inert gas atmosphere (see FIG. 2C). For example, the second heat treatment is performed in a nitrogen atmosphere at 250° C. for 1 hour. In the second heat treatment, heating is performed in the following condition: a part of the second oxide semiconductor layer 113b is in contact with the first channel protective layer 116, and a part of the second oxide semiconductor layer 213b is in contact with the second channel protective layer 216. The regions of the second oxide semiconductor layer 113b not in contact with the first channel protective layer 116, and the regions of the second oxide semiconductor layer 213b not in contact with the first channel protective layer 216 are heated while exposed to the inert gas atmosphere, and heating is performed in this condition.

Through the above steps, after the resistance of the formed oxide semiconductor film is lowered by the heat treatment for dehydration or dehydrogenation, the channel protective layer in contact with a part of the oxide semiconductor film is formed using an oxide insulating film, and excessive oxygen is selectively added into the region which overlaps with the channel protective layer. As a result, the channel formation region overlapping with the channel protective layer becomes i-type. In this specification, this i-type oxide semiconductor is referred to as a third oxide semiconductor. Thus, a part of the second oxide semiconductor layer 113b, which is subjected to the second heat treatment while in contact with the first channel protective layer 116, becomes the third oxide semiconductor layer 113c, and a part of the second oxide semiconductor layer 213b, which is subjected to the second heat treatment while in contact with the second channel protective layer 216, becomes the third oxide semiconductor layer 213c.

On the other hand, in the regions of the second oxide semiconductor layer 113b not in contact with the first channel protective layer 116, and in the regions of the second oxide semiconductor layer 213b not in contact with the first channel protective layer 216, high-resistant drain regions are formed in a self-aligned manner. In this specification, these high-resistant drain regions are referred to as the fourth oxide semiconductor regions. Thus, regions of the second oxide semiconductor layer 113b not in contact with the first channel protective layer 116 become the fourth oxide semiconductor regions 113d, and regions of the second oxide semiconductor layer 213b not in contact with the second channel protective layer 216 become the fourth oxide semiconductor regions 213d.

Next, a conductive film which transmits visible light is formed over the gate insulating film 102 and the fourth oxide semiconductor regions 113d and 213d.

The light-transmitting conductive film is deposited by a sputtering method, a vacuum evaporation method (e.g., an electron beam evaporation method), an arc discharge ion plating method, or a spray method. As a material for the conductive layer, a conductive material that transmits visible light, for example, any of the following metal oxides can be used: an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, an In—Zn—O-based metal oxide, a Sn—Zn—O-based metal oxide, an Al—Zn—O-based metal oxide, an In—O-based metal oxide, a Sn—O-based metal oxide, and a Zn—O-based metal oxide. The thickness is set within the range of 50 nm to 300 nm inclusive. When a sputtering method is employed, it is preferable that deposition be performed using a target containing $SiO_2$ of 2 to 10 percent by weight and $SiOx$ (x>0) which inhibits crystallization be contained in the light-transmitting conductive film so as to prevent crystallization at the time of the heat treatment in a later step.

Next, a metal conductive film is formed over the conductive film which transmits visible light. Examples of the metal conductive film include: an element selected from Al, Cr, Cu, Ta, Ti, Mo, and W; an alloy containing any of these elements as a component; an alloy containing any of these elements in combination; and the like. A three-layer structure in which a titanium layer, an aluminum layer, and a titanium layer are stacked in this order, or a three-layer structure in which a molybdenum layer, an aluminum layer, and a molybdenum layer are stacked in this order is preferable. It is needless to say that the metal conductive film can be a single layer, a two-layer, or a stacked structure in which four or more layers are stacked.

Figure 3A:
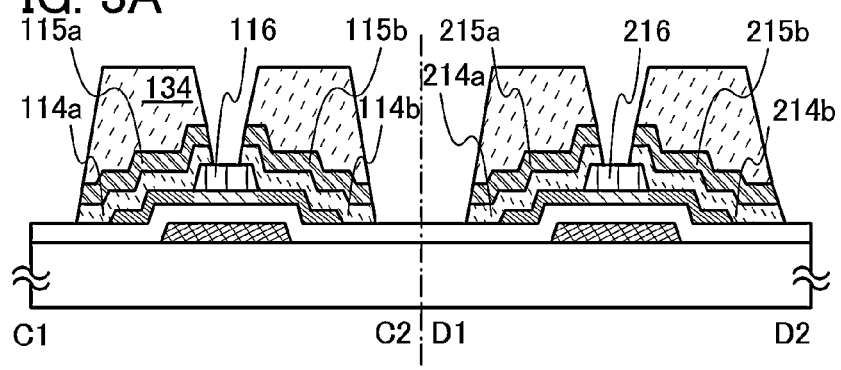
FIGS. 3A to 3C illustrate the method for manufacturing the thin film transistors.
Figure 3B:
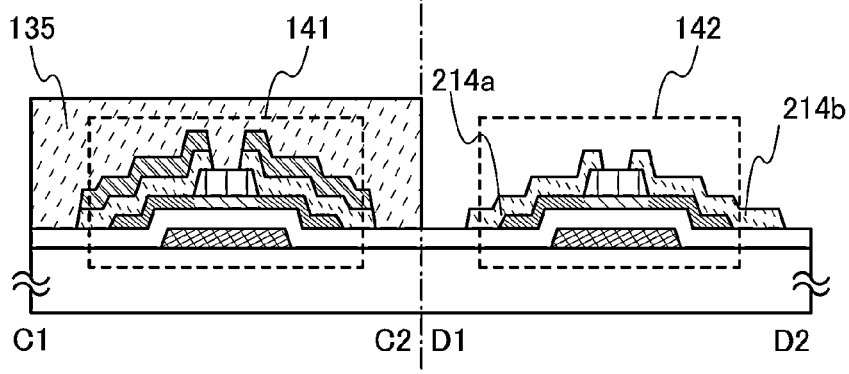

Next, a fourth photolithography step is performed to form a resist mask 134, unnecessary portions of the conductive film which transmits visible light and the metal conductive film are removed by selective etching, and electrode layers where the conductive film which transmits visible light and the metal conductive film are stacked are formed (see FIG. 3A).

Note that in this etching, the first channel protective layer 116 and the second channel protective layer 216 respectively function as etching stoppers of the third oxide semiconductor layers 113c and 213c; thus, the third oxide semiconductor layers 113c and 213c are not etched.

Since the first channel protective layer 116 is formed over the channel formation region of the third oxide semiconductor layer 113c and the second channel protective layer 216 is formed over the channel formation region of the third oxide semiconductor layer 213c, the channel formation regions of the third oxide semiconductor layers 113c and 213c can be protected from damages during steps (e.g., reduction in thickness by plasma or an etchant when etching is performed, or oxidation). Thus, the thin film transistors 141 and 142 can have improved reliability.

The resist mask may also be formed by an ink-jet method. In the case where the resist mask is formed by an ink-jet method, manufacture cost can be reduced because a photomask is unnecessary.

Next, after the resist mask 134 is removed, a fifth photolithography step is performed to form a resist mask 135 covering the thin film transistor 141 and a wiring layer including the source and drain electrodes (denoted by 115a and 115b). Next, by using the resist mask 135, unnecessary conductive layers (denoted by 215a and 215b) are removed by etching, resulting in source and drain electrodes having a light-transmitting property (denoted by 214a and 214b). At this step, the thin film transistors 141 and 142 are formed (see FIG. 3B).

Note that the reliability when a driver circuit is formed can be improved because the fourth oxide semiconductor regions, which are high-resistant drain regions, are formed in regions of the oxide semiconductor layer overlapping with the drain electrode layer or the source electrode layer. Specifically, the conductivity can be gradually varied from the drain electrode layer to the fourth oxide semiconductor region and the channel formation region. In the case where operation is performed with the drain electrode layer connected to a wiring for supplying a high power supply potential VDD, even when a high electric field is applied between the gate electrode layer and the drain electrode layer, the high electric field is not applied locally because the fourth oxide semiconductor regions, which are high-resistant drain regions, function as buffers; therefore, the withstand voltage of the transistor can be improved. The fourth oxide semiconductor region, which is a high-resistant drain region, in the oxide semiconductor layer overlapping with the drain electrode layer can result in reduced leakage current in the channel formation region when a driver circuit is formed.

Specifically, in the thin film transistor 141, the conductive layer 115b formed using the metal conductive film whose wiring resistance is low, which is the drain electrode, is electrically connected to the third oxide semiconductor layer 113c, which is the channel formation region via the conductive layer 114b having a light-transmitting property, the fourth oxide semiconductor region 113d, which is a high-resistant drain region. The conductive layer 114b having a light-transmitting property can also be referred to as a low-resistant drain region (also referred to as a LRN region). In the thin film transistor 142, the conductive film having a light-transmitting property, the fourth oxide semiconductor region 213d, which is a high-resistant drain region, and the third oxide semiconductor layer 213c, which is the channel formation region, are connected to each other.

Next, the resist mask 135 is removed, and the first protective insulating film 107 is formed over the first channel protective layer 116 and the second channel protective layer 216. In the first protective insulating film 107, the amount of moisture, hydrogen ions, and OH⁻ is reduced, and the first protective insulating film 107 blocks entry of these elements from outside. The first protective insulating film 107 is formed using an insulating inorganic material. Specifically, it can be formed using a single layer or a stacked layer of any of a silicon oxide film, a silicon oxynitride film, a silicon nitride oxide film, a silicon nitride film, an aluminum oxide film, an aluminum nitride film, and the like.

Here, first, a silicon nitride film is used to form a first protective insulating film 107a in contact with the gate insulating film 102. By using silicon nitride films for the gate insulating film 102 and the first protective insulating film 107a, the same inorganic insulating films can surround the thin film transistors 141 and 142 and be in contact with each other, so that the thin film transistors are sealed more tightly.

The first protective insulating film 107 may be a stacked layer in which a protective insulating film of a composition different from that of the silicon nitride film, for example a silicon oxynitride film, is stacked over the silicon nitride film.

The first protective insulating film 107 can have another structure; for example, a silicon nitride film may be stacked over a 300-nm-thick silicon oxide film formed by a sputtering method. The substrate temperature at the formation may be room temperature to 300° C. inclusive; in this embodiment, it is 100° C. Formation of the silicon oxide film by a sputtering method can be performed in a rare gas (typically argon) atmosphere, an oxygen atmosphere, or a mixed gas atmosphere containing a rare gas (typically argon) and oxygen. Further, a silicon oxide target or a silicon target may be used as a target. For example, the silicon oxide film can be formed using a silicon target by a sputtering method in an atmosphere containing oxygen.

Next, the second protective insulating film 108 is formed over the first protective insulating film 107 to cover the thin film transistors 141 and 142.

The second protective insulating film 108 covers the first channel protective layer 116, the second channel protective layer 216, and the source and drain electrodes (denoted by 115a, 115b, 214a, and 214b) with the first protective insulating film 107 interposed therebetween.

The second protective insulating film 108 can be formed using a photosensitive or non-photosensitive organic material with a thickness of 0.5 μm to 3 μm. Examples of the photosensitive or non-photosensitive organic material which can be used for the second protective insulating film 108 include polyimide, acrylic, polyamide, polyimide amide, resist, benzocyclobutene, or a stacked layer in which these materials are stacked. In addition to such organic materials, it is also possible to use a low-dielectric constant material (a low-k material), a siloxane-based resin, PSG (phosphosilicate glass), BPSG (borophosphosilicate glass), or the like. Note that the second protective insulating film 108 may be formed by stacking a plurality of insulating films formed using these materials.

Note that the siloxane-based resin refers to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

The method for the formation of the second protective insulating film 108 is not limited to a particular method, and the following method or means can be used depending on the material: a sputtering method, an SOG method, spin coating, dip coating, spray coating, or a droplet discharge method (e.g., an inkjet method, screen printing, or offset printing); a doctor knife, a roll coater, a curtain coater, a knife coater, or the like.

In this embodiment, photo-sensitive polyimide is deposited by a coating method as the second protective insulating film 108. After polyimide is applied on the entire surface, exposure, development, and baking are performed to form the second protective insulating film 108 formed from polyimide having a thickness of 1.5 μm and a flat surface.

The second protective insulating film 108 can reduce unevenness caused by structures of the thin film transistors 141 and 142 so that an upper surface can be flat. The material is not limited to a resin, but any other material can also be used as long as it can be deposited by a method to make the upper surface flat (e.g., a spin coating method or a reflow method).

Next, etching is performed to form an opening in the first protective insulating film 107, resulting in a contact hole 125 which reaches to the drain electrode 214b of the thin film transistor 142.

In the case where the back-gate electrode 129 is connected to the first bottom-gate electrode 111 in the thin film transistor 141, an opening is formed in a predetermined portion (not illustrated) in the second protective insulating film 108, the first protective insulating film 107, and the gate insulating film 102 before a conductive film to be the back-gate electrode 129 is formed.

Next, a conductive film which transmits visible light is formed over the second protective insulating film 108. The conductive film which transmits visible light can be the same conductive film as that for the first bottom-gate electrode 111 and the second bottom-gate electrode 211. In addition, by using the same material as that for the back-gate electrode 129 and the pixel electrode 128, the process can be simple.

Next, a sixth photolithography step is performed to form a resist mask over the conductive film, unnecessary portions are removed by etching, and a wiring layer including the back-gate electrode 129 and the pixel electrode 128 is formed. When the wiring layer including the back-gate electrode 129 and the pixel electrode 128 is selectively etched to have a predetermined top surface shape, the second protective insulating film 108 functions as an etching stopper.

Note that the back-gate electrode 129 may be formed to cover a region which overlaps with the first channel protective layer 116 overlapping with the third oxide semiconductor layer 113c between the source and drain electrodes. The narrower the back-gate electrode 129 is formed, the less parasitic capacitance becomes.

Figure 3C:
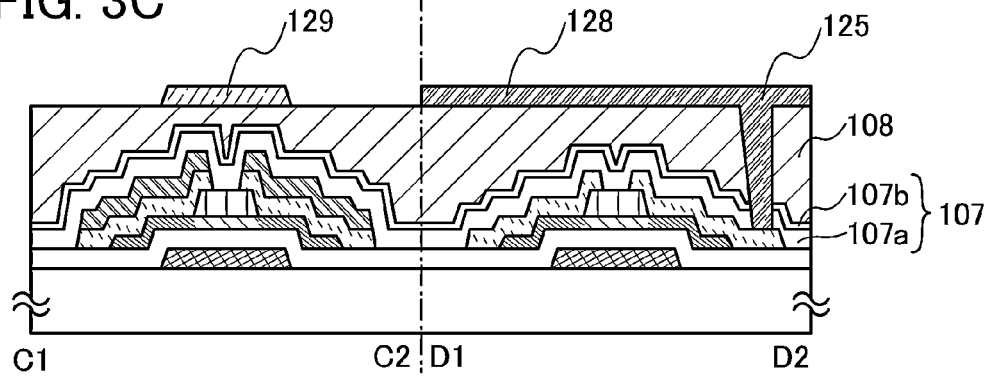

The pixel electrode 128 is connected to the drain electrode 214b of the thin film transistor 142 through the contact hole 125 (see FIG. 3C).

In addition, the thin film transistors 141 and 142 may be subjected to heat treatment in a nitrogen atmosphere or the atmospheric atmosphere (in the air). The heat treatment is preferably performed at a temperature of lower than or equal to 350° C., and may be performed any time after the formation of the insulating film to be the first protective insulating film 107. For example, the heat treatment is performed at 350° C. for 1 hour in a nitrogen atmosphere. The heat treatment can reduce variation in electrical characteristics of the thin film transistors 141 and 142.

Through the above process, the thin film transistors 141 and 142 illustrated in FIG. 1A can be formed.

In FIGS. 2A and 2B, before the insulating film to be the channel protective layers are formed, oxygen radical treatment may be performed on the exposed second oxide semiconductor layers 113b and 213b. By the oxygen radical treatment, an exposed surface and the vicinity of the exposed surface of the oxide semiconductor layer can be modified into an oxygen-excess region. Oxygen radicals may be produced by a plasma generation apparatus with the use of a gas containing oxygen, or by an ozone generation apparatus. By irradiating the thin film with the produced oxygen radicals or oxygen, surfaces of the second oxide semiconductor layers 113b and 213b (surfaces in back channel portions) can be modified. The treatment is not limited to oxygen radical treatment, but may be treatment using radicals of argon and oxygen. The argon and oxygen radical treatment is to modify a surface of a thin film using plasma generated by introducing argon gas and oxygen gas.

Figure 7:
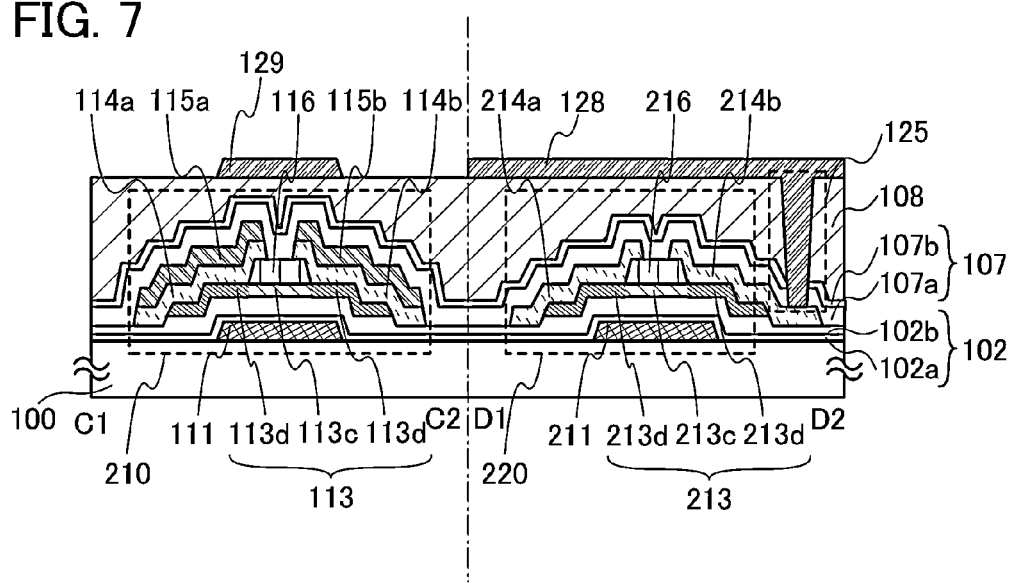
FIG. 7 illustrates thin film transistors.

FIG. 7 illustrates thin film transistors 210 and 220 in each of which the gate insulating film 102 is formed using a two-layer stacked film in which a silicon oxide film is formed over a silicon nitride film. In the case where the gate insulating film 102b in contact with the oxide semiconductor layer is a silicon oxide film, when the channel protective layer is formed using the silicon oxide film, the gate insulating film 102b is etched; as a result, the thickness of the gate insulating film 102b in a region which does not overlap with the island-shaped oxide semiconductor layer becomes smaller than that of the gate insulating film 102b in a region overlapping with the island-shaped oxide semiconductor layer.

In the thin film transistors 210 and 220, the gate insulating film 102 and the first protective insulating film 107 are formed in contact with each other by using the same inorganic insulating material. Due to the structure in which the same inorganic insulating films surround the thin film transistors 210 and 220 and are in contact with each other, the thin film transistors are sealed more tightly. In the case where the same inorganic insulating films are in contact with each other, the above-described inorganic insulating film can be used; in particular, a silicon nitride film is preferable because it can block impurities effectively.

The resist mask for forming the pixel electrode 128 may also be formed by an ink-jet method. In the case where the resist mask is formed by an ink-jet method, manufacturing cost can be reduced because a photomask is unnecessary.

Through the above steps, by using seven photomasks, the thin film transistors 141 and 142 or the thin film transistors 210 and 220 are separately formed over the same substrate.

By providing the back-gate electrode 129 overlapping with the channel formation region of the third oxide semiconductor layer 113c, the amount of change in threshold voltage of the thin film transistor 141 before and after bias-temperature stress testing (hereinafter, referred to as BT testing) for examining reliability of a thin film transistor can be reduced. The potential of the back-gate electrode 129 may be the same as that of the bottom-gate electrode 111, or may be different. In addition, the potential of the back-gate electrode 129 may be GND, 0 V, or the back-gate electrode 129 may be in a floating state.

The channel formation region in the semiconductor layer included in the thin film transistor of this embodiment is a high-resistant region; thus, electrical characteristics of the thin film transistor are stabilized and an increase in off current and the like can be prevented. Therefore, a semiconductor device including a highly reliable thin film transistor having favorable electrical characteristics can be provided.

Further, in the thin film transistors 141 and 142, and the thin film transistors 210 and 220, since the fourth oxide semiconductor regions are formed in the source and drain regions in contact with the source and drain electrodes respectively, the contact resistance is suppressed so that a high on current can be achieved.

This embodiment can be freely combined with any of the other embodiments described in this specification.

Embodiment 2

In this embodiment, described are a thin film transistor which is one embodiment of the present invention and is different from that in Embodiment 1, and its manufacturing method.

FIG. 4A illustrates a cross-sectional view of a thin film transistor 143 and a thin film transistor 144, each of which is one embodiment of the present invention. The thin film transistors 143 and 144 are formed over the same substrate 100, and both of them are bottom-gate type thin film transistors. The thin film transistor 143 is provided for a driver circuit, and the thin film transistor 144 is provided for a pixel.

FIG. 4C1 is a plane view of the channel-stop-type thin film transistor 143 provided for a driver circuit, and a cross-sectional view taken along line C1-C2 in FIG. 4C1 is illustrated in FIG. 4A. A cross-sectional view taken along line C3-C4 in FIG. 4C1 is illustrated in FIG. 4B.

FIG. 4C2 is a plane view of the channel-stop-type thin film transistor 144 provided for a pixel, and a cross-sectional view taken along line D1-D2 in FIG. 4C2 is illustrated in FIG. 4A. A cross-sectional view taken along line D3-D4 in FIG. 4C2 is illustrated in FIG. 4B.

The thin film transistor 143 includes a first bottom-gate electrode 111, a gate insulating film 102, a third oxide semiconductor layer 113c, a first channel protective layer 116, and source and drain electrodes each formed over the substrate 100. Note that the source and drain electrodes are formed using a conductive layer in which a second conductive layer 115a is stacked on a first conductive layer 114a, and a conductive layer in which a second conductive layer 115b is stacked on a first conductive layer 114b. Further, a first protective insulating film 107 is formed to cover these and to be in contact with the first channel protective layer 116. A second protective insulating film 108 is formed over the first protective insulating film 107. Furthermore, a back-gate electrode 129 is formed over the second protective insulating film 108 and it overlaps with the third oxide semiconductor layer 113c. In addition, the thin film transistor 143 described in this embodiment is one embodiment of a channel-stop type.

When a pixel portion and a driver circuit are formed over one substrate in a liquid crystal display device, in the driver circuit, only either positive polarity or negative polarity is applied between the source and drain electrodes in a thin film transistor for constituting a logic gate such as an inverter circuit, a NAND circuit, a NOR circuit, or a latch circuit or a thin film transistor for constituting an analog circuit such as a sense amplifier, a constant voltage generating circuit, or a VCO. Therefore, one of the source and drain electrodes which requires withstand voltage to the third oxide semiconductor layer 113c may be designed to be wider than the other of the source and drain electrodes. In addition, the width of the third oxide semiconductor layer 113c overlapping with the bottom-gate electrode may be increased.

A thin film transistor having a single-gate structure is described as the thin film transistor 143 provided for a driver circuit; however, a thin film transistor having a multi-gate structure in which a plurality of channel formation regions are included can also be used as needed.

The back-gate electrode 129 is formed over and to overlap with the third oxide semiconductor layer 113c. The third oxide semiconductor layer 113c is interposed between the bottom-gate electrode 111 and the back-gate electrode 129. By electrically connecting the back-gate electrode 129 and the bottom-gate electrode 111 to have the same potential, a gate voltage can be applied to the third oxide semiconductor layer 113c from above and below. When the potential of the bottom-gate electrode 111 and that of the back-gate electrode 129 are different, for example, one of them has a fixed potential, GND, or 0 V, electrical characteristics of the TFT such as the threshold voltage can be controlled. Note that in this specification, the conductive layer formed over and to overlap with the third oxide semiconductor layer 113c is referred to as the back-gate electrode 129 regardless of its potential. Therefore, the back-gate electrode 129 can also be in a floating state.

The first protective insulating film 107 and the second protective insulating film 108 are stacked between the back-gate electrode 129 and the third oxide semiconductor layer 113c.

The thin film transistor 144 includes a second bottom-gate electrode 211, the gate insulating film 102, a third oxide semiconductor layer 213c, a second channel protective layer 216, and source and drain electrodes (denoted by 214a and 214b) each formed over the substrate 100. Further, the first protective insulating film 107 is formed to cover these and to be in contact with the second channel protective layer 216. The second protective insulating film 108 is formed over the first protective insulating film 107. Thus, the thin film transistor 144 described in this embodiment is one embodiment of a channel-stop type. Note that a pixel electrode 128 is formed over the second protective insulating film 108 to overlap with the thin film transistor 144.

An AC drive is performed in the liquid crystal display device in order to prevent deterioration of a liquid crystal. Through the AC drive, the polarity of a signal potential applied to a pixel electrode layer is inverted to be negative or positive at regular intervals of time. In a TFT connected to the pixel electrode layer, a pair of electrodes functions alternately as a source electrode and a drain electrode. In this specification, one electrode of the pixel thin film transistor is referred to as a source electrode and the other one is referred to as a drain electrode; actually in AC drive, one electrode functions alternately as the source electrode and the drain electrode. In order to reduce leakage current, the second bottom-gate electrode of the thin film transistor 144 provided for a pixel may be narrower than the first bottom-gate electrode of the thin film transistor 143 provided for a driver circuit. In order to reduce the leakage current, the bottom-gate electrode of the thin film transistor 144 provided for a pixel may be designed so as not to overlap with the source or drain electrode.

A thin film transistor having a single-gate structure is described as the thin film transistor 144 provided for a pixel; however, a thin film transistor having a multi-gate structure in which a plurality of channel formation regions are included can also be used as needed.

In the thin film transistor 144, used are: the third oxide semiconductor layer 213c which transmits visible light; the second bottom-gate electrode 211 and the source and drain electrodes (denoted by 214a and 214b) formed using a conductive film which transmits visible light; the substrate 100 which transmits visible light; and the second channel protective layer 216, the first protective insulating film 107, and the second protective insulating film 108 which transmit visible light. Therefore, the thin film transistor 144 is a so-called transparent transistor which transmits visible light.

The oxide semiconductor layer including the channel formation region may be formed using an oxide material having semiconductor characteristics. Specifically, the oxide semiconductor materials described in Embodiment 1 can be used.

Note that each thin film transistor of this embodiment includes the third oxide semiconductor layer (denoted by 113c or 213c) in the channel formation region.

FIGS. 5A to 5C and FIGS. 6A to 6C illustrate cross-sectional views in manufacture of the thin film transistors 143 and 144. Note that steps for forming the first bottom-gate electrode 111 and the second bottom-gate electrode 211 over the substrate 100 having an insulating surface, the gate insulating film 102 covering the first bottom-gate electrode 111 and the second bottom-gate electrode 211, and the oxide semiconductor film covering the gate insulating film 102 are the same as those in Embodiment 1; therefore, a detailed description is omitted here and the same reference numbers are used for the same portion illustrated in FIG. 2A.

A first oxide semiconductor film is formed over the gate insulating film 102 as in Embodiment 1.

Next, a second photolithography step is performed to form a resist mask over the first oxide semiconductor film, and the first oxide semiconductor film is etched to form island-shaped oxide semiconductor layers 113a and 213a. Note that etching here is not limited to wet etching but may also be dry etching (see FIG. 5A).

Next, first heat treatment is performed on the first oxide semiconductor layers 113a and 213a as in Embodiment 1. The resistance of the oxide semiconductor layers 113a and 213a is lowered by the heat treatment and slow cooling in an inert gas atmosphere or a reduced pressure. The first oxide semiconductor layers 113a and 213a can be low-resistant second oxide semiconductor layers 113b and 213b, respectively (see FIG. 5B).

Next, an insulating film to be the channel protective layers is formed in contact with the second oxide semiconductor layers 113b and 213b, as in Embodiment 1.

In this embodiment, a 300-nm-thick silicon oxide film is formed by a sputtering method as the oxide insulating film.

Next, a third photolithography step is performed to form a resist mask over the insulating film which is to be the channel protective layer. Then, unnecessary portions are removed by etching and the first channel protective layer 116 and the second channel protective layer 216 are formed.

In this embodiment, second heat treatment at 200° C. to 400° C. inclusive, preferably 200° C. to 300° C. inclusive, is performed in an oxygen gas atmosphere, a $N_2O$ gas atmosphere, or ultra dry air (having a dew point of −40° C. or lower, preferably −60° C. or lower). For example, the second heat treatment is performed in an oxygen atmosphere at 250° C. for 1 hour.

Figure 5A:
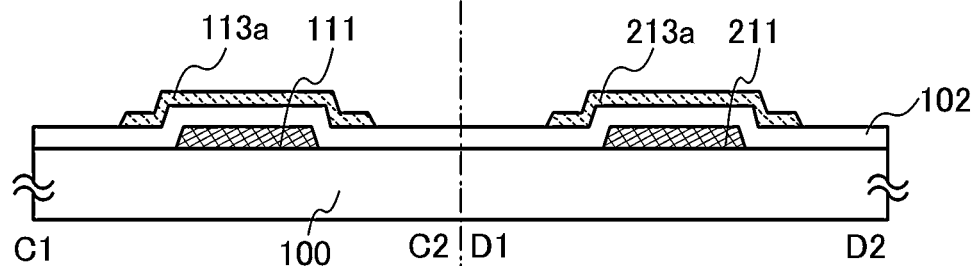
FIGS. 5A to 5C illustrate a method for manufacturing the thin film transistors.
Figure 5B:
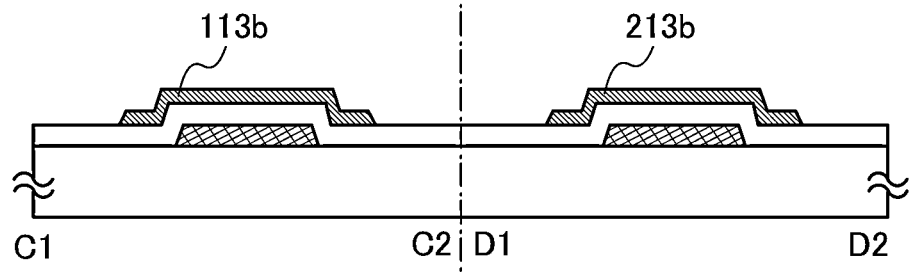
Figure 5C:
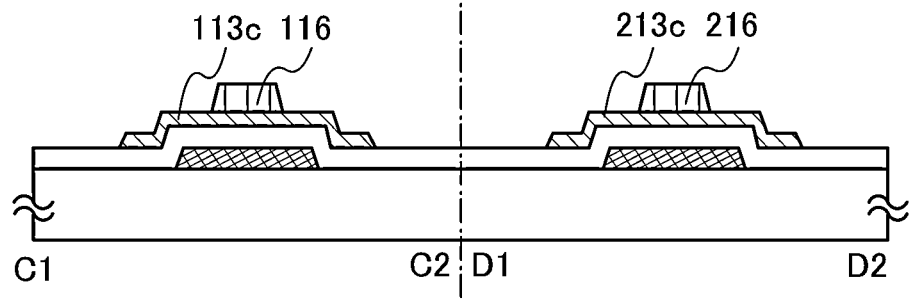

The resistance of the entire second oxide semiconductor layers 113b and 213b becomes higher (see FIG. 5C).

Next, a conductive film which transmits visible light is formed over the gate insulating film 102 and the third oxide semiconductor layers 113c and 213c, as in Embodiment 1. A metal conductive film is formed thereover.

Figure 6A:
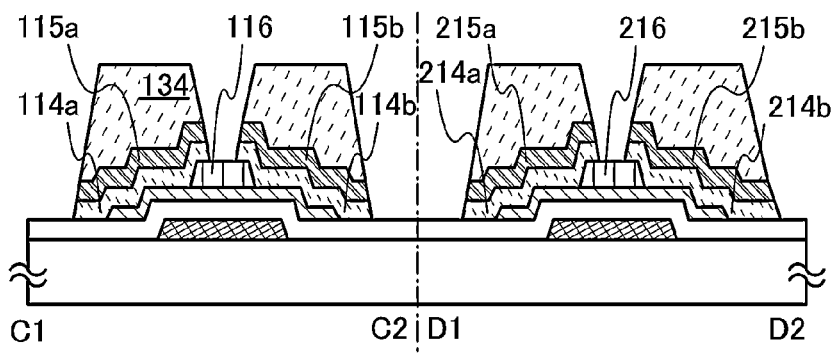
FIGS. 6A to 6C illustrate the method for manufacturing the thin film transistors.
Figure 6B:
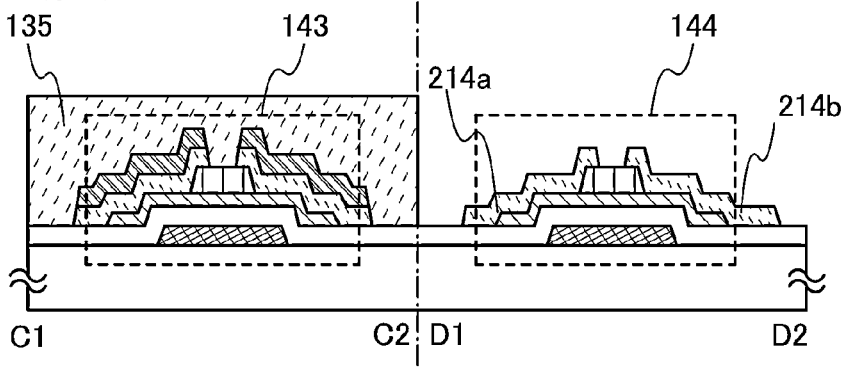

Next, a fourth photolithography step is performed to form a resist mask 134 over the conductive film, unnecessary portions of the conductive film which transmits visible light and the conductive film are removed by etching, and the conductive film including source and drain electrodes (denoted by 114a, 114b, 115a, 115b, 214a, 214b, 215a, and 215b) are formed (see FIG. 6A).

Note that in this etching, the first channel protective layer 116 and the second channel protective layer 216 respectively function as etching stoppers of the third oxide semiconductor layers 113c and 213c; thus, the third oxide semiconductor layers 113c and 213c are not etched.

Since the first channel protective layer 116 is formed over the channel formation region of the third oxide semiconductor layer 113c and the second channel protective layer 216 is formed over the channel formation region of the third oxide semiconductor layer 213c, the channel formation regions of the third oxide semiconductor layers 113c and 213c can be protected from damages during steps (e.g., reduction in thickness by plasma or an etchant when etching is performed, or oxidation). Thus, the thin film transistors 143 and 144 can have improved reliability.

Next, after the resist mask 134 is removed, a fifth photolithography step is performed to form a resist mask 135 covering the thin film transistor 143 and a wiring layer including the source and drain electrodes (denoted by 115a and 115b). Next, by using the resist mask 135, unnecessary conductive layers (denoted by 215a and 215b) are removed by etching, resulting in source and drain electrodes having a light-transmitting property (denoted by 214a and 214b).

Next, the resist mask 135 is removed. At this step, the thin film transistors 143 and 144 are formed (see FIG. 6B).

Then, a first protective insulating film 107 is formed over the first channel protective layer 116 and the second channel protective layer 216, as in Embodiment 1. The first protective insulating film 107 is formed using an insulating inorganic material as a single layer or a stacked layer.

The first protective insulating film 107 can have another structure; for example, a silicon nitride film may be stacked over a 300-nm-thick silicon oxide film formed by a sputtering method.

Next, the second protective insulating film 108 is formed over the first protective insulating film 107 to cover the thin film transistors 143 and 144, as in Embodiment 1.

The second protective insulating film 108 covers the first channel protective layer 116, the second channel protective layer 216, and the source and drain electrodes (denoted by 115a, 115b, 214a, and 214b) with the first protective insulating film 107 interposed therebetween.

Next, etching is performed to form an opening in the first protective insulating film 107, resulting in a contact hole 125 which reaches to the drain electrode 214b of the thin film transistor 144.

In the case where the back-gate electrode 129 is connected to the first bottom-gate electrode 111 in the thin film transistor 143, an opening is formed in a predetermined portion (not illustrated) in the second protective insulating film 108, the first protective insulating film 107, and the gate insulating film 102 before a conductive film to be the back-gate electrode 129 is formed.

Next, as in Embodiment 1, a conductive film which transmits visible light is formed over the second protective insulating film 108, unnecessary portions are removed by etching, and wiring layers including the back-gate electrode 129 and the pixel electrode 128 are formed.

Note that the back-gate electrode 129 may be formed to cover a region which overlaps with the first channel protective layer 116 in contact with the third oxide semiconductor layer 113c between the source and drain electrodes. The narrower the back-gate electrode 129 is formed, the less parasitic capacitance becomes.

Figure 6C:
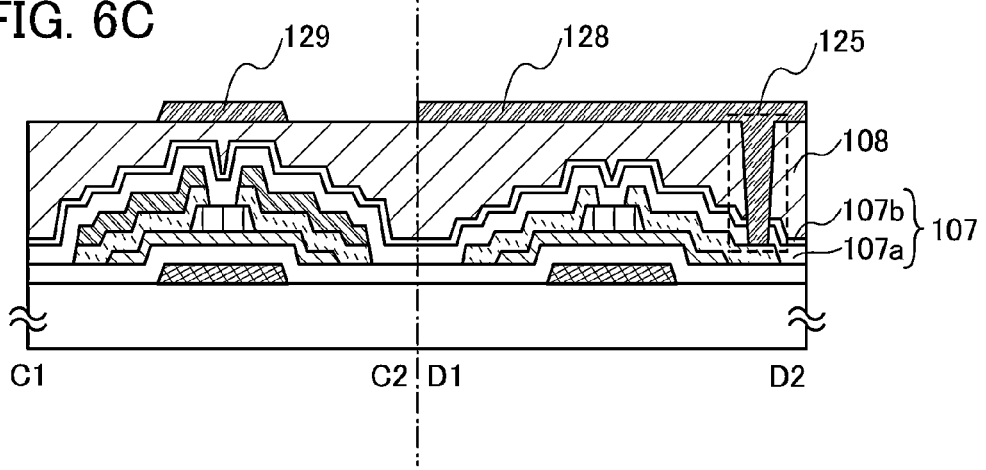

The pixel electrode 128 is connected to the drain electrode 214b of the thin film transistor 144 through the contact hole 125 (see FIG. 6C).

In addition, the thin film transistors 143 and 144 may be subjected to heat treatment in a nitrogen atmosphere or the atmospheric atmosphere (in the air). The heat treatment is preferably performed at a temperature of lower than or equal to 350° C., and may be performed any time after the formation of the insulating film to be the first protective insulating film 107. For example, the heat treatment is performed at 350° C. for 1 hour in a nitrogen atmosphere. The heat treatment can reduce variation in electrical characteristics of the thin film transistors 143 and 144.

Through the above process, the thin film transistors 143 and 144 illustrated in FIG. 1A can be formed.

In FIGS. 5A and 5B, before the insulating film to be the channel protective layers are formed, oxygen radical treatment may be performed on the exposed second oxide semiconductor layers 113b and 213b, as in Embodiment 1.

Figure 8:
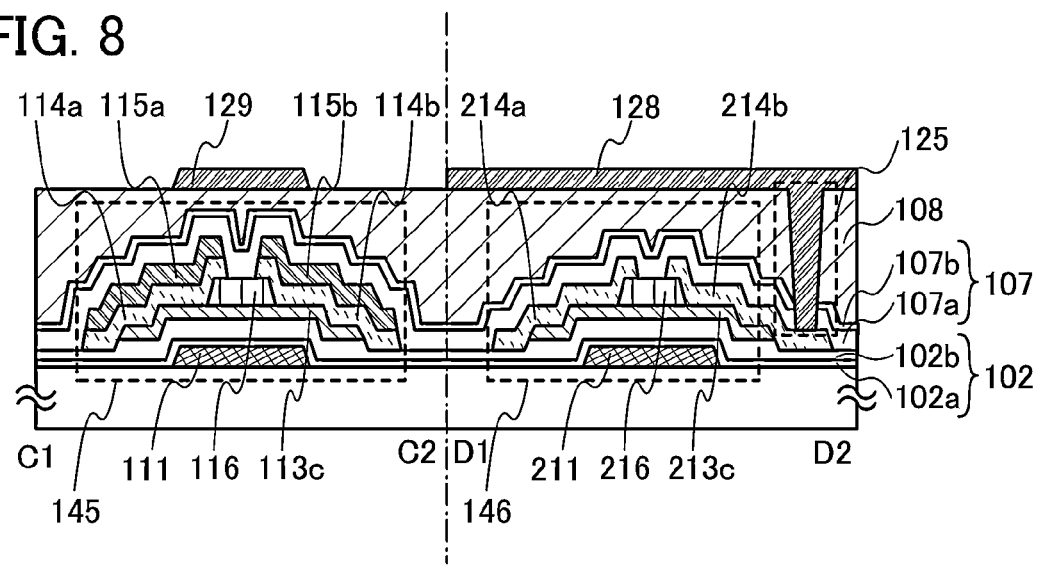
FIG. 8 illustrates thin film transistors.

FIG. 8 illustrates thin film transistors 145 and 146 in each of which the gate insulating film 102 is formed using a stack of a silicon oxide film and a silicon nitride film. When the channel protective layers 116 and 216 are formed using the silicon oxide film, the silicon oxide film in the gate insulating film 102 is etched; as a result, the thickness of the regions which do not overlap with the island-shaped oxide semiconductor layer becomes smaller than that of the silicon oxide film overlapping with the island-shaped oxide semiconductor layer.

A resist mask for forming the pixel electrode 128 may be formed by an ink-jet method. In the case where the resist mask is formed by an ink-jet method, manufacture cost can be reduced because a photomask is unnecessary.

Through the above steps, by using seven photomasks, the thin film transistors 143 and 144 or the thin film transistors 145 and 146 are separately formed over the same substrate.

By providing the back-gate electrode 129 overlapping with the channel formation region of the third oxide semiconductor layer 113c, the amount of change in threshold voltage of the thin film transistor 143 before and after bias-temperature stress testing (hereinafter, referred to as BT testing) for examining reliability of a thin film transistor can be reduced. The potential of the back-gate electrode 129 may be the same as that of the bottom-gate electrode 111, or may be different. In addition, the potential of the back-gate electrode 129 may be GND, 0 V, or the back-gate electrode 129 may be in a floating state.

The channel formation region in the semiconductor layer included in the thin film transistor of this embodiment is a high-resistant region; thus, electrical characteristics of the thin film transistor are stabilized and an increase in off current and the like can be prevented. Therefore, a semiconductor device including a highly reliable thin film transistor having favorable electrical characteristics can be provided.

This embodiment can be freely combined with any of the other embodiments described in this specification.

Embodiment 3

This embodiment will show an example of manufacturing an active matrix liquid crystal display device with the active matrix substrate described in Embodiment 1.

FIG. 9A illustrates an example of a cross-sectional structure of an active matrix substrate.

The thin film transistor in the driver circuit and the thin film transistor in the pixel portion over one substrate are shown in Embodiment 1; in this embodiment, terminal portions of a storage capacitor, a gate wiring (also referred to as a gate wiring layer), and a source wiring (also referred to as a source wiring layer) are shown in addition to these thin film transistors for description. The terminal portions of the capacitor, the gate wiring, and the source wiring can be formed in the same manufacturing step as in Embodiment 1 and can be manufactured without an increase in the number of photomasks and an increase in the number of steps. Moreover, in a portion to serve as a display region in a pixel portion, all the gate wiring, the source wiring, and a capacitor wiring layer are formed from a light-transmitting conductive film, resulting in high aperture ratio. Furthermore, a metal wiring can be used for the source wiring layer in a portion that is not the display region in order to reduce the wiring resistance.

In FIG. 9A, a thin film transistor 210 is a channel-stop-type thin film transistor provided for a driver circuit. A thin film transistor 220 that is electrically connected to a pixel electrode layer 227 is a channel-stop-type thin film transistor provided for a pixel portion.

In this embodiment, the thin film transistor 220 formed over a substrate 200 has the same structure as the thin film transistor 220 in Embodiment 1. Note that a first protective insulating layer 203 may be a single layer or a stacked layer.

A capacitor wiring layer 230 which is formed from the same light-transmitting material in the same step as a gate electrode layer of the thin film transistor 220 overlaps with a capacitor electrode 231, with a first gate insulating layer 202a and a second gate insulating layer 202b serving as dielectrics placed therebetween; thus, a storage capacitor is formed. The capacitor electrode 231 is formed from the same light-transmitting material in the same step as a source electrode layer or a drain electrode layer of the thin film transistor 220. Since the storage capacitor as well as the thin film transistor 220 has light-transmitting property, the aperture ratio can be increased.

The light transmittance of the storage capacitor is important in increasing the aperture ratio. For small liquid crystal display panels of 10 inches or smaller in particular, high aperture ratio can also be achieved when the size of a pixel is decreased in order to realize higher definition of display images by increasing the number of gate wirings, for example. Moreover, wide viewing angle is realized by using a light-transmitting film for components in the thin film transistor 220 and the storage capacitor, so that high aperture ratio can also be achieved when one pixel is divided into a plurality of subpixels. That is, high aperture ratio can be maintained even when a group of high-density thin film transistors is arranged, and the display region can have a sufficient area. For example, when one pixel includes two to four subpixels and storage capacitors, the storage capacitors have light transmittance as well as the thin film transistors, so that the aperture ratio can be increased.

Note that the storage capacitor is provided below the pixel electrode layer 227, and the capacitor electrode 231 is electrically connected to the pixel electrode layer 227.

This embodiment shows the example in which the storage capacitor is constituted by the capacitor electrode 231 and the capacitor wiring layer 230; however, there is no particular limitation on the structure of the storage capacitor. For example, a storage capacitor may be formed in such a manner that, without providing a capacitor wiring layer, a pixel electrode layer overlaps with a gate wiring in an adjacent pixel, with a planarization insulating layer, a protective insulating layer, a first gate insulating layer, and a second gate insulating layer placed therebetween.

A plurality of gate wirings, source wirings, and capacitor wiring layers are provided in accordance with the pixel density. In the terminal portions, a plurality of first terminal electrodes at the same potential as the gate wiring, a plurality of second terminal electrodes at the same potential as the source wiring, a plurality of third terminal electrodes at the same potential as the capacitor wiring layer, and the like are arranged. There is no particular limitation on number of each of the terminal electrodes, and the number of the terminals can be determined by a practitioner as appropriate.

In the terminal portion, the first terminal electrode which has the same potential as the gate wiring can be formed from the same light-transmitting material as the pixel electrode layer 227. The first terminal electrode is electrically connected to the gate wiring through a contact hole that reaches the gate wiring. The contact hole that reaches the gate wiring is formed by selective etching of a second protective insulating layer 204, the first protective insulating layer 203, the second gate insulating layer 202b, and the first gate insulating layer 202a with the use of a photomask used for forming a contact hole for electrically connecting the drain electrode layer of the thin film transistor 220 and the pixel electrode layer 227.

A gate electrode layer of the thin film transistor 210 provided for the driver circuit may be electrically connected to a conductive layer 217 provided above an oxide semiconductor layer. In that case, a contact hole is formed by selective etching of the second protective insulating layer 204, the first protective insulating layer 203, the second gate insulating layer 202b, and the first gate insulating layer 202a with the use of the photomask used for forming the contact hole for electrically connecting the drain electrode layer of the thin film transistor 220 and the pixel electrode layer 227. The conductive layer 217 and the gate electrode layer of the thin film transistor 210 provided for the driver circuit are electrically connected through the contact hole.

A second terminal electrode 235 which has the same potential as a source wiring 234 in the driver circuit can be formed from the same light-transmitting material as the pixel electrode layer 227. The second terminal electrode 235 is electrically connected to the source wiring 234 through a contact hole that reaches the source wiring 234. The source wiring is a metal wiring, is formed from the same material in the same step as a source electrode layer of the thin film transistor 210, and has the same potential as the source electrode layer of the thin film transistor 210.

The third terminal electrode which has the same potential as the capacitor wiring layer 230 can be formed from the same light-transmitting material as the pixel electrode layer 227. Moreover, a contact hole that reaches the capacitor wiring layer 230 can be formed in the same step using the same photomask as those for forming a contact hole 224 for electrically connecting the capacitor electrode 231 to the pixel electrode layer 227.

In the case of manufacturing an active matrix liquid crystal display device, a liquid crystal layer is provided between an active matrix substrate and a counter substrate provided with a counter electrode (also referred to as a counter electrode layer), and the active matrix substrate and the counter substrate are fixed to each other. A common electrode electrically connected to the counter electrode on the counter substrate is provided over the active matrix substrate, and a fourth terminal electrode electrically connected to the common electrode is provided in the terminal portion. The fourth terminal electrode is used for setting the common electrode to a fixed potential such as GND or 0 V. The fourth terminal electrode can be formed from the same light-transmitting material as the pixel electrode layer 227.

There is no particular limitation on the structure where the source electrode layer of the thin film transistor 220 and the source electrode layer of the thin film transistor 210 are electrically connected to each other; for example, a connection electrode for connecting the source electrode layer of the thin film transistor 220 and the source electrode layer of the thin film transistor 210 may be formed in the same step as the pixel electrode layer 227. Furthermore, in the portion that is not the display region, the source electrode layer of the thin film transistor 220 and the source electrode layer of the thin film transistor 210 may be in contact with each other to overlap with each other.

Note that FIG. 9A illustrates a cross-sectional structure of a gate wiring layer 232 in the driver circuit. Since this embodiment shows an example of a small liquid crystal display panel of 10 inches or smaller, the gate wiring layer 232 in the driver circuit is formed from the same light-transmitting material as the gate electrode layer of the thin film transistor 220.

When the same material is used for the gate electrode layer, the source electrode layer, the drain electrode layer, the pixel electrode layer, another electrode layer, and another wiring layer, a common sputtering target and a common manufacturing apparatus can be used, and thus the material costs and costs of an etchant (or an etching gas) used for etching can be reduced. As a result, manufacturing costs can be reduced.

When a photosensitive resin material is used for the second protective insulating layer 204 in the structure in FIG. 9A, the step for forming a resist mask can be omitted.

FIG. 9B illustrates a cross-sectional structure, a part of which is different from the structure in FIG. 9A. FIG. 9B is the same as FIG. 9A except that the second protective insulating layer 204 is not provided; therefore, the same portions are denoted by the same reference numerals and detailed description of the same portions is not repeated. In FIG. 9B, the pixel electrode layer 227, the conductive layer 217, and the second terminal electrode 235 are formed on and in contact with the first protective insulating layer 203.

With the structure in FIG. 9B, the step for forming the second protective insulating layer 204 can be omitted.

This embodiment can be freely combined with any of the other embodiments.

Embodiment 4

This embodiment will show an example in which a part of a gate wiring is made from a metal wiring so that the wiring resistance is reduced, because there is the possibility that the resistance of a light-transmitting wiring might become a problem in the case where the size of a liquid crystal display panel exceeds 10 inches and reaches 60 inches or 120 inches.

Note that in FIG. 10A, the same portions as those in FIG. 9A are denoted by the same reference numerals and detailed description of the same portions is not repeated.

FIG. 10A illustrates an example in which a part of a gate wiring in a driver circuit is made from a metal wiring and formed in contact with a light-transmitting wiring which is the same as the gate electrode layer of a thin film transistor 210. Note that the number of photomasks is larger than that in Embodiment 3 since the metal wiring is formed.

First, a heat-resistant conductive material film (with a thickness of 100 nm to 500 nm inclusive) that can withstand first heat treatment for dehydration or dehydrogenation is formed over a substrate 200.

In this embodiment, a 370-nm-thick tungsten film and a 50-nm-thick tantalum nitride film are formed. Although a stack of the tantalum nitride film and the tungsten film is used as the conductive film here, there is no particular limitation and the conductive film may be formed from an element selected from Ta, W, Ti, Mo, Al, and Cu; an alloy containing any of these elements as its component; an alloy containing a combination of any of these elements; or a nitride containing any of these elements as its component. The heat-resistant conductive material film is not limited to a single layer containing the above-described element, but may be a stack of two or more layers.

In a first photolithography step, metal wirings are formed, so that a first metal wiring layer 236 and a second metal wiring layer 237 are formed. An inductively coupled plasma (ICP) etching method is preferably used for etching of the tungsten film and the tantalum nitride film. The films can be etched into a desired tapered shape with the ICP etching method with appropriate adjustment of etching conditions (e.g., the amount of electric power applied to a coiled electrode, the amount of electric power applied to a substrate-side electrode, and the temperature of the substrate-side electrode). The first metal wiring layer 236 and the second metal wiring layer 237 are tapered; thus, defects in formation of a light-transmitting conductive film thereon can be reduced.

Then, after the light-transmitting conductive film is formed, a gate wiring layer 238, a gate electrode layer of the thin film transistor 210, a gate electrode layer of a thin film transistor 220, and a capacitor wiring layer 230 are formed in a second photolithography step. The light-transmitting conductive film is formed using any of the conductive materials that transmit visible light described in Embodiment 1.

Note that for example, when there is an interface where the gate wiring layer 238 is in contact with the first metal wiring layer 236 or the second metal wiring layer 237, it is possible that, depending on the material of the light-transmitting conductive film, an oxide film is formed with later heat treatment or the like, and contact resistance is increased. Consequently, the second metal wiring layer 237 is preferably formed from a metal nitride film that prevents oxidation of the first metal wiring layer 236.

Next, a gate insulating layer, an oxide semiconductor layer, and the like are formed in the same step as in Embodiment 1. An active matrix substrate is formed in accordance with the subsequent steps in Embodiment 1.

This embodiment shows an example in which after formation of a second protective insulating layer 204, a planarization insulating layer in a terminal portion is selectively removed using a photomask. It is preferable that the planarization insulating layer be not placed in the terminal portion so that the terminal portion can be connected to an FPC in a favorable manner.

In FIG. 10A, a second terminal electrode 235 is formed over a first protective insulating layer 203. FIG. 10A illustrates the gate wiring layer 238 which overlaps with a part of the second metal wiring layer 237; alternatively, the gate wiring layer may cover all the first metal wiring layer 236 and the second metal wiring layer 237. In other words, the first metal wiring layer 236 and the second metal wiring layer 237 can be referred to as auxiliary wirings for reducing the resistance of the gate wiring layer 238.

In the terminal portion, a first terminal electrode that has the same potential as the gate wiring is formed over the first protective insulating layer 203 and electrically connected to the second metal wiring layer 237. A wiring led from the terminal portion is also formed using a metal wiring.

Furthermore, in order to reduce the wiring resistance, the metal wirings (i.e., the first metal wiring layer 236 and the second metal wiring layer 237) can be used as the auxiliary wirings for the gate wiring layer and a capacitor wiring layer in a portion that does not serve as a display region.

FIG. 10B illustrates a cross-sectional structure, a part of which is different from the structure in FIG. 10A. FIG. 10B is the same as FIG. 10A except for a material of the gate electrode layer in the thin film transistor in the driver circuit; therefore, the same portions are denoted by the same reference numerals and detailed description of the same portions is not repeated.

FIG. 10B illustrates an example in which the gate electrode layer in the thin film transistor in the driver circuit is made from a metal wiring. In the driver circuit, a material of the gate electrode layer is not limited to a light-transmitting material.

In FIG. 10B, a thin film transistor 240 in the driver circuit includes a gate electrode layer in which a second metal wiring layer 241 is stacked over a first metal wiring layer 242. Note that the first metal wiring layer 242 can be formed from the same material in the same step as the first metal wiring layer 236. Moreover, the second metal wiring layer 241 can be formed from the same material in the same step as the second metal wiring layer 237.

In the case where the first metal wiring layer 242 is electrically connected to a conductive layer 217, it is preferable to use a metal nitride film as the second metal wiring layer 241 for preventing oxidation of the first metal wiring layer 242.

In this embodiment, metal wirings are used for some wirings so that the wiring resistance is reduced; high definition of display images is achieved and high aperture ratio can be realized even when the size of a liquid crystal display panel exceeds 10 inches and reaches 60 inches or 120 inches.

This embodiment can be freely combined with any of the other embodiments.

Embodiment 5

Figure 11A:
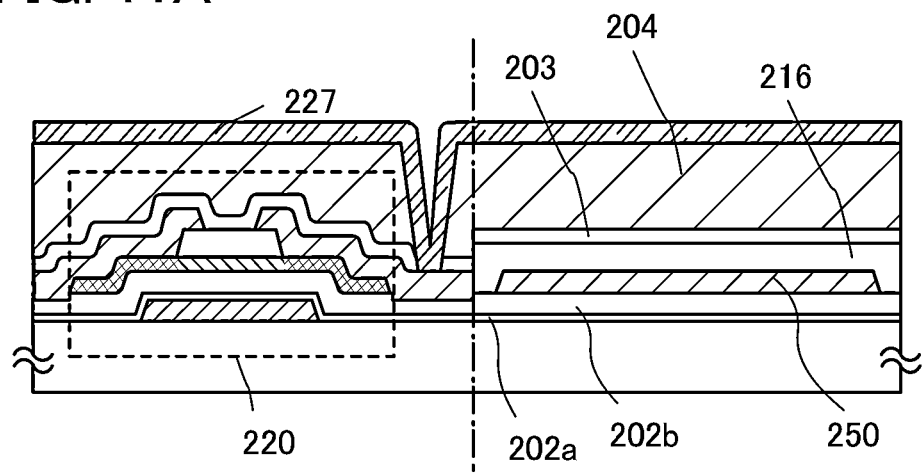
FIGS. 11A and 11B illustrate a semiconductor device.
Figure 11B:
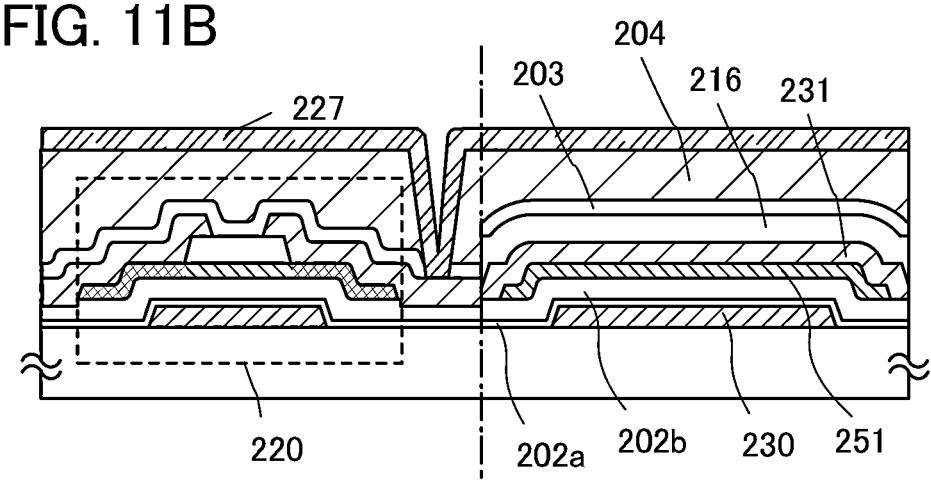

In this embodiment, an example of a structure of a storage capacitor which is different from that in Embodiment 3 will be shown with reference to FIGS. 11A and 11B. FIG. 11A is the same as FIG. 9A except for a structure of the storage capacitor; therefore, the same portions are denoted by the same reference numerals and detailed description of the same portions is not repeated. FIG. 11A illustrates a cross-sectional structure of a thin film transistor 220 provided for a pixel and a storage capacitor.

FIG. 11A illustrates an example in which the storage capacitor is constituted by a pixel electrode layer 227 and a capacitor wiring layer 250 that overlaps with the pixel electrode layer 227, with a channel protective layer 216 formed using an oxide insulating layer, a first protective insulating layer 203, and a second protective insulating layer 204 serving as dielectrics. Since the capacitor wiring layer 250 is formed from the same light-transmitting material in the same step as the source electrode layer of the thin film transistor 220 provided for the pixel, the capacitor wiring layer 250 is arranged so as not to overlap with a source wiring layer of the thin film transistor 220.

In the storage capacitor illustrated in FIG. 11A, a pair of electrodes and the dielectrics have light-transmitting properties, and thus the storage capacitor as a whole has a light-transmitting property.

FIG. 11B illustrates an example of a structure of the storage capacitor which is different from that in FIG. 11A. FIG. 11B is the same as FIG. 11A except for a structure of the storage capacitor; therefore, the same portions are denoted by the same reference numerals and detailed description of the same portions is not repeated.

FIG. 11B illustrates an example in which the storage capacitor is constituted by the capacitor wiring layer 230 and a stack of an oxide semiconductor layer 251 that overlaps with the capacitor wiring layer 230 and the capacitor electrode 231 with a first gate insulating layer 202a and a second gate insulating layer 202b serving as dielectrics. The capacitor electrode 231 is stacked on and in contact with the oxide semiconductor layer 251 and functions as one electrode of the storage capacitor. Note that the oxide semiconductor layer 251 is formed from the same light-transmitting material in the same step as the source electrode or the drain electrode of the thin film transistor 220. Moreover, since the capacitor wiring layer 230 is formed from the same light-transmitting material in the same step as the gate electrode of the thin film transistor 220, the capacitor wiring layer 230 is arranged so as not to overlap with a gate wiring layer of the thin film transistor 220.

The capacitor electrode 231 is electrically connected to the pixel electrode layer 227.

Also in the storage capacitor illustrated in FIG. 11B, a pair of electrodes and the dielectrics have light-transmitting properties, and thus the storage capacitor as a whole has a light-transmitting property.

Each of the storage capacitors illustrated in FIGS. 11A and 11B has light-transmitting properties; thus, sufficient capacitance and high aperture ratio can be obtained even when the size of a pixel is decreased in order to realize higher definition of display images by increasing the number of gate wirings, for example.

This embodiment can be freely combined with any of the other embodiments.

Embodiment 6

In this embodiment, described below is an example in which at least some of driver circuits and a thin film transistor placed in a pixel portion are formed over one substrate.

The thin film transistor placed in the pixel portion is formed according to Embodiment 1 or Embodiment 2. Since the thin film transistor described in Embodiment 1 or Embodiment 2 is an n-channel TFT, some of driver circuits that can be constituted by n-channel TFTs among the driver circuits are formed over a substrate where the thin film transistor in the pixel portion is formed.

Figure 16A:
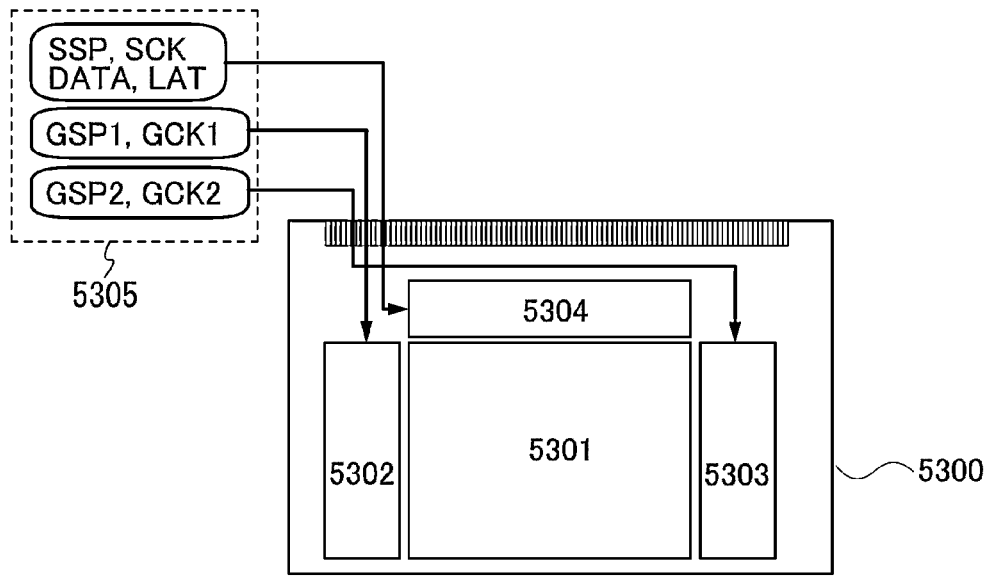
FIGS. 16A and 16B are block diagrams each illustrating a semiconductor device.

FIG. 16A illustrates an example of a block diagram of an active matrix display device. A pixel portion 5301, a first scan line driver circuit 5302, a second scan line driver circuit 5303, and a signal line driver circuit 5304 are provided over a substrate 5300 in the display device. In the pixel portion 5301, a plurality of signal lines extended from the signal line driver circuit 5304 are placed, and a plurality of scan lines extended from the first scan line driver circuit 5302 and the second scan line driver circuit 5303 are placed. Note that pixels each including a display element are arranged in matrix in respective regions where the scan lines and the signal lines intersect with each other. The substrate 5300 of the display device is connected to a timing control circuit 5305 (also referred to as a controller or a control IC) through a connection portion such as a flexible printed circuit (FPC).

In FIG. 16A, the first scan line driver circuit 5302, the second scan line driver circuit 5303, and the signal line driver circuit 5304 are formed over the substrate 5300 where the pixel portion 5301 is formed. Consequently, the number of components of a driver circuit and the like externally provided is reduced, so that costs can be reduced. Moreover, the number of connections in the connection portion in the case where wirings are extended from a driver circuit provided outside the substrate 5300 can be reduced, and the reliability or yield can be increased.

Note that the timing control circuit 5305 supplies, for example, a first scan line driver circuit start signal (GSP1) (a start signal is also referred to as a start pulse) and a scan line driver circuit clock signal (GCK1) to the first scan line driver circuit 5302. Furthermore, the timing control circuit 5305 supplies, for example, a second scan line driver circuit start signal (GSP2) and a scan line driver circuit clock signal (GCK2) to the second scan line driver circuit 5303. Moreover, the timing control circuit 5305 supplies a signal line driver circuit start signal (SSP), a signal line driver circuit clock signal (SCK), video signal data (DATA, also simply referred to as a video signal), and a latch signal (LAT) to the signal line driver circuit 5304. Each clock signal may be a plurality of clock signals with shifted phases or may be supplied together with a signal (CKB) obtained by inverting the clock signal. Note that it is possible to omit either the first scan line driver circuit 5302 or the second scan line driver circuit 5303.

Figure 16B:
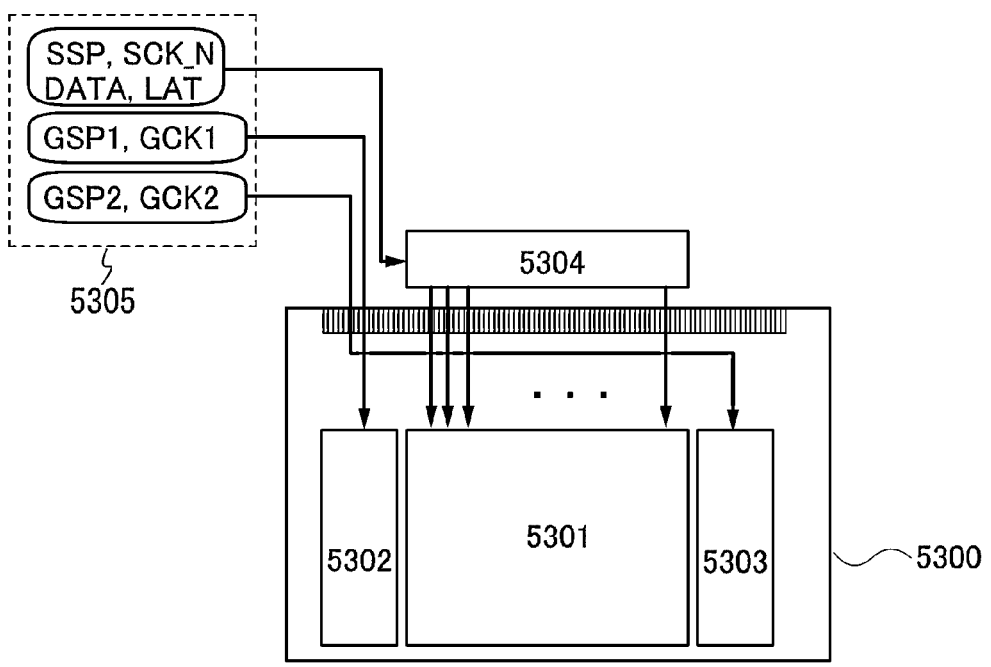

FIG. 16B illustrates a structure in which circuits with lower driving frequency (e.g., the first scan line driver circuit 5302 and the second scan line driver circuit 5303) are formed over the substrate 5300 where the pixel portion 5301 is formed, and the signal line driver circuit 5304 is formed over a substrate which is different from the substrate 5300 where the pixel portion 5301 is formed. With this structure, the driver circuits formed over the substrate 5300 can be constituted by thin film transistors whose field effect mobility is lower than that of transistors including a single crystal semiconductor.

Thus, increase in the size of the display device, reduction in the number of steps, reduction in cost, improvement in yield, or the like can be achieved.

Figure 17A:
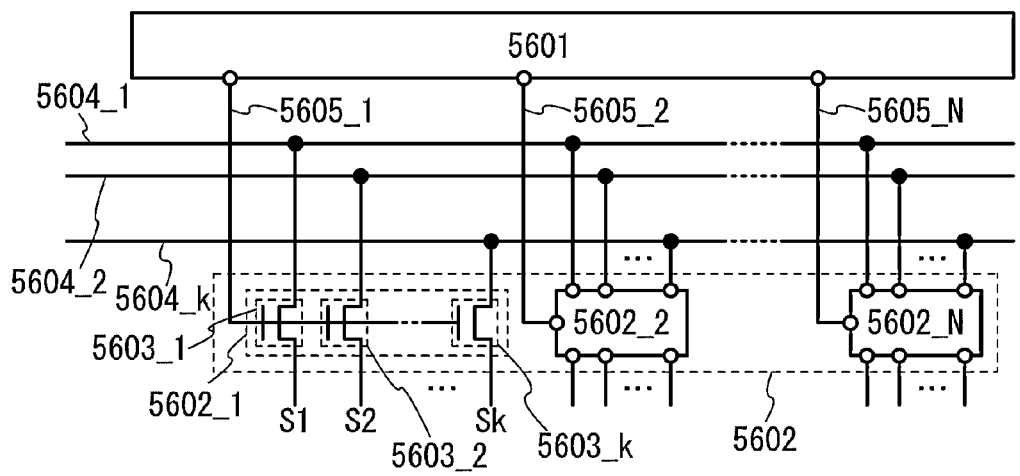
FIGS. 17A and 17B illustrate a display device.
Figure 17B:
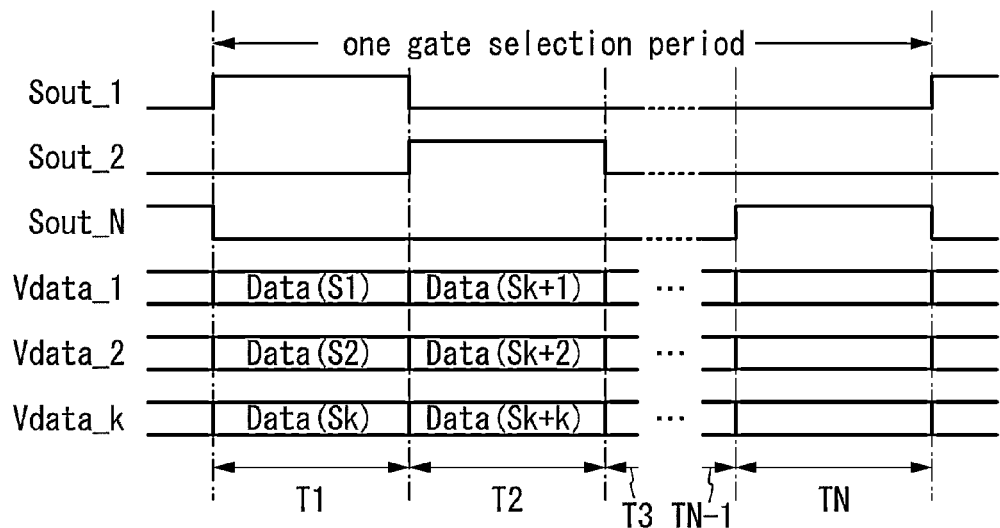

The thin film transistors in Embodiment 1 or Embodiment 2 are n-channel TFTs. FIGS. 17A and 17B illustrate an example of a structure and operation of a signal line driver circuit constituted by n-channel TFTs.

The signal line driver circuit includes a shift register 5601 and a switching circuit 5602. The switching circuit 5602 includes a plurality of switching circuits 5602_1 to 5602_N (N is a natural number). The switching circuits 5602_1 to 5602_N each include a plurality of thin film transistors 5603_1 to 5603_$k$ (k is a natural number). The example in which the thin film transistors 5603_1 to 5603_$k$ are n-channel TFTs is described below.

A connection relation in the signal line driver circuit is described by using the switching circuit 5602_1 as an example. First terminal of the thin film transistors 5603_1 to 5603_$k$ are connected to wirings 5604_1 to 5604_$k$, respectively. Second terminals of the thin film transistors 5603_1 to 5603_$k$ are connected to signal lines S1 to Sk, respectively. Gates of the thin film transistors 5603_1 to 5603_$k$ are connected to a wiring 5605_1.

The shift register 5601 has a function of sequentially selecting the switching circuits 5602_1 to 5602_N by sequentially outputting an H-level signal (also referred to as an H signal or a signal at high power supply potential level) to wirings 5605_1 to 5605_N.

The switching circuit 5602_1 has a function of controlling a conduction state between the wirings 5604_1 to 5604_$k$ and the signal lines S1 to Sk (electrical continuity between the first terminals and the second terminals), that is, a function of controlling whether potentials of the wirings 5604_1 to 5604_$k$ are supplied to the signal lines S1 to Sk. In this manner, the switching circuit 5602_1 functions as a selector. Moreover, the thin film transistors 5603_1 to 5603_$k$ have functions of controlling conduction states between the wirings 5604_1 to 5604_$k$ and the signal lines S1 to Sk, respectively, that is, functions of supplying potentials of the wirings 5604_1 to 5604_$k$ to the signal lines S1 to Sk, respectively. In this manner, each of the thin film transistors 5603_1 to 5603_$k$ functions as a switch.

The video signal data (DATA) is input to each of the wirings 5604_1 to 5604_$k$. The video signal data (DATA) is often an analog signal that corresponds to an image signal or image data.

Next, the operation of the signal line driver circuit in FIG. 17A is described with reference to a timing chart in FIG. 17B. FIG. 17B illustrates examples of signals Sout_1 to Sout_N and signals Vdata_1 to Vdata_k. The signals Sout_1 to Sout_N are examples of output signals from the shift register 5601. The signals Vdata_1 to Vdata_k are examples of signals input to the wirings 5604_1 to 5604_$k$. Note that one operation period of the signal line driver circuit corresponds to one gate selection period in a display device. For example, one gate selection period is divided into periods T1 to TN. Each of the periods T1 to TN is a period for writing the video signal data (DATA) into a pixel in a selected row.

In the periods T1 to TN, the shift register 5601 sequentially outputs an H-level signals to the wirings 5605_1 to 5605_N. For example, in the period T1, the shift register 5601 outputs an H-level signal to the wiring 5605_1. Then, the thin film transistors 5603_1 to 5603_$k$ are turned on, so that the wirings 5604_1 to 5604_$k$ and the signal lines S1 to Sk are brought into conduction. At this time, Data(S1) to Data(Sk) are input to the wirings 5604_1 to 5604_$k$, respectively. The Data(S1) to Data(Sk) are written into pixels in a first to kth columns in a selected row through the thin film transistors 5603_1 to 5603_$k$, respectively. In such a manner, in the periods T1 to TN, the video signal data (DATA) are sequentially written into the pixels in the selected row by k columns.

The video signal data (DATA) are written into pixels by a plurality of columns as described above, whereby the number of video signal data (DATA) or the number of wirings can be reduced. Consequently, the number of connections with an external circuit can be reduced. Moreover, the time for writing can be extended when video signals are written into pixels by a plurality of columns; thus, insufficient writing of video signals can be prevented.

Note that any of the circuits constituted by the thin film transistors described in Embodiment 1 or Embodiment 2 can be used for the shift register 5601 and the switching circuit 5602. In that case, the shift register 5601 can be constituted by only n-channel transistors or only p-channel transistors.

One embodiment of a shift register which is used for a part of the scan line driver circuit and/or the signal line driver circuit is described with reference to FIGS. 18A to 18C and FIGS. 19A and 19B.

The scan line driver circuit includes a shift register. Additionally, the scan line driver circuit may include a level shifter, a buffer, or the like in some cases. In the scan line driver circuit, a clock signal (CK) and a start pulse signal (SP) are input to the shift register, so that a selection signal is generated. The selection signal generated is buffered and amplified by the buffer, and the resulting signal is supplied to a corresponding scan line. Gate electrodes of transistors in pixels of one line are connected to a scan line. Since the transistors in the pixels of one line have to be turned on all at once, a buffer that can supply a large current is used.

Figure 18A:
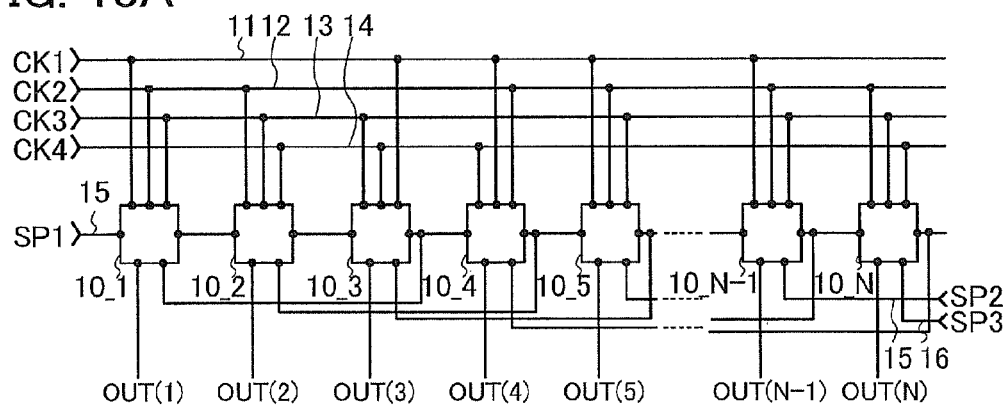
FIGS. 18A to 18C illustrate a display device.

The shift register includes a first pulse output circuit 10_1 to a Nth pulse output circuits 10_N(N is a natural number greater than or equal to 3) (see FIG. 18A). In the shift register illustrated in FIG. 18A, a first clock signal CK1, a second clock signal CK2, a third clock signal CK3, and a fourth clock signal CK4 are respectively supplied from a first wiring 11, a second wiring 12, a third wiring 13, and a fourth wiring 14, to the first pulse output circuit 10_1 to the Nth pulse output circuit 10_N. A start pulse SP1 (a first start pulse) is input from a fifth wiring 15 to the first pulse output circuit 10_1. To the nth pulse output circuit 10_$n$ of the second or subsequent stage (n is a natural number greater than or equal to 2 and less than or equal to N), a signal from the pulse output circuit of the previous stage (such a signal is referred to as a previous-stage signal OUT(n−1)) (n is a natural number greater than or equal to 2) is input. To the first pulse output circuit 10_1, a signal from the third pulse output circuit 10_3 of the stage following the next stage is input. Similarly, to the nth pulse output circuit 10_$n$ of the second or subsequent stage, a signal from the (n+2)th pulse output circuit 10_(n+2) of the stage following the next stage (such a signal is referred to as a subsequent-stage signal OUT(n+2)) is input. Therefore, the pulse output circuits of the respective stages output first output signals (OUT(1)(SR) to OUT(N)(SR)) to be input to the pulse output circuit of the respective subsequent stage and/or the pulse output circuit of the stage before the previous stage and second output signals (OUT(1) to OUT(N)) to be input to another wiring or the like. Note that since the subsequent-stage signal OUT(n+2) is not input to the last two stages of the shift register as illustrated in FIG. 18A, a second start pulse SP2 and a third start pulse SP3 may be additionally input to the pulse output circuits of the last two stages, for example.

Note that a clock signal (CK) is a signal that alternates between an H-level and an L-level (also referred to as an L signal or a signal at low power supply potential level) at regular intervals. Here, the first clock signal (CK1) to the fourth clock signal (CK4) are delayed by ¼ cycle sequentially. In this embodiment, driving of the pulse output circuit is controlled with the first to fourth clock signals (CK1) to (CK4). Note that in some cases, the clock signal is also referred to as GCK or SCK, depending on a driver circuit to which the clock signal is input; in the following description, the clock signal is expressed as CK.

A first input terminal 21, a second input terminal 22, and a third input terminal 23 are electrically connected to any of the first to fourth wirings 11 to 14. For example, in the first pulse output circuit 10_1 in FIG. 18A, the first input terminal 21 is electrically connected to the first wiring 11, the second input terminal 22 is electrically connected to the second wiring 12, and the third input terminal 23 is electrically connected to the third wiring 13. In the second pulse output circuit 10_2, the first input terminal 21 is electrically connected to the second wiring 12, the second input terminal 22 is electrically connected to the third wiring 13, and the third input terminal 23 is electrically connected to the fourth wiring 14.

Figure 18B:
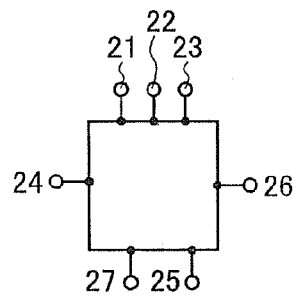

Each of the first pulse output circuit 10_1 to the Nth pulse output circuit 10_N includes the first input terminal 21, the second input terminal 22, the third input terminal 23, a fourth input terminal 24, a fifth input terminal 25, a first output terminal 26, and a second output terminal 27 (see FIG. 18B). In the first pulse output circuit 10_1, the first clock signal CK1 is input to the first input terminal 21; the second clock signal CK2 is input to the second input terminal 22; the third clock signal CK3 is input to the third input terminal 23; a start pulse is input to the fourth input terminal 24; a subsequent-stage signal OUT(3) is input to the fifth input terminal 25; the first output signal OUT(1)(SR) is output from the first output terminal 26; and the second output signal OUT(1) is output from the second output terminal 27.

In the first pulse output circuit 10_1 to the Nth pulse output circuit 10_N, the thin film transistor (TFT) having four terminals described in the above embodiment can be used in addition to a thin film transistor having three terminals. Note that in this specification, when a thin film transistor has two gate electrodes with a semiconductor layer therebetween, the gate electrode below the semiconductor layer is called a lower gate electrode and the gate electrode above the semiconductor layer is called an upper gate electrode.

When an oxide semiconductor is used for a semiconductor layer including a channel formation region in a thin film transistor, the threshold voltage sometimes shifts in the positive or negative direction depending on a manufacturing process. For that reason, the thin film transistor in which an oxide semiconductor is used for a semiconductor layer including a channel formation region preferably has a structure with which the threshold voltage can be controlled. The threshold voltage of a thin film transistor with four terminals can be controlled to be a desired value by controlling a potential of the upper gate electrode and/or the lower gate electrode.

Next, an example of a specific circuit configuration of the pulse output circuit illustrated in FIG. 18B will be described with reference to FIG. 18C.

Figure 18C:
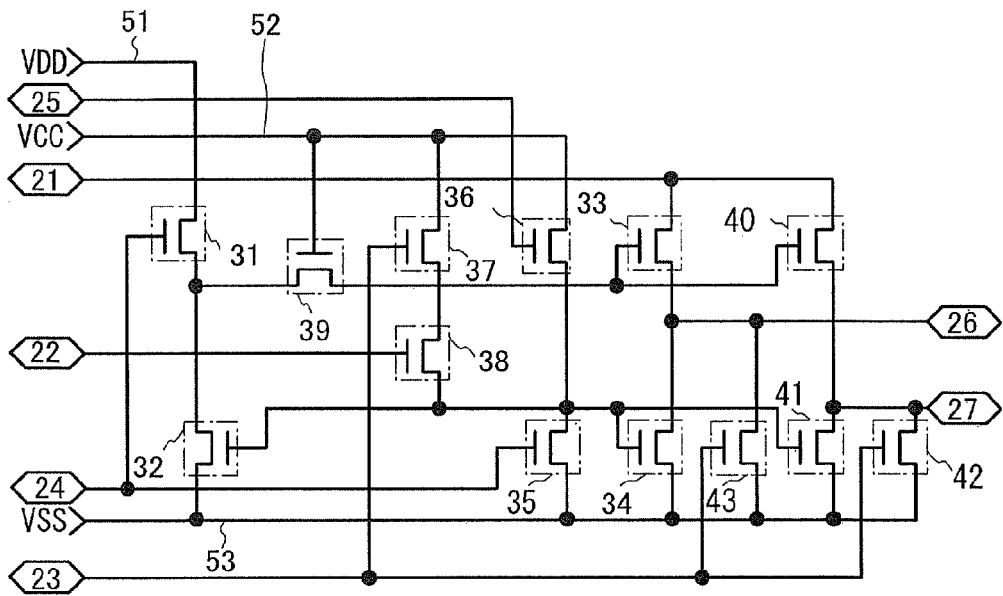

The pulse output circuit illustrated in FIG. 18C includes a first transistor 31 to thirteenth transistor 43. A signal or a power supply potential is supplied to the first transistor 31 to the thirteenth transistor 43 from a power supply line 51 to which a first high power supply potential VDD is supplied, a power supply line 52 to which a second high power supply potential VCC is supplied, and a power supply line 53 to which a low power supply potential VSS is supplied, in addition to the above-described first input terminal 21 to fifth input terminal 25, the first output terminal 26, and the second output terminal 27, which are described above. The relation of the power supply potentials of the power supply lines in FIG. 18C is as follows: the first power supply potential VDD is higher than or equal to the second power supply potential VCC, and the second power supply potential VCC is higher than the third power supply potential VSS. Note that the first clock signal (CK1) to the fourth clock signal (CK4) each alternate between an H-level and an L-level at regular intervals; the clock signal at the H level is VDD, and the clock signal at the L level is VSS. By making the potential VDD of the power supply line 51 higher than the potential VCC of the power supply line 52, a potential applied to a gate electrode of a transistor can be lowered, shift in the threshold voltage of the transistor can be reduced, and degradation of the transistor can be suppressed without an adverse effect on the operation of the transistor. A thin film transistor with four terminals is preferably used as the first transistor 31 and the sixth transistor 36 to the ninth transistor 39 among the first transistor 31 to the thirteenth transistor 43. The first transistor 31 and the sixth transistor 36 to the ninth transistor 39 need to be operated so that a potential of a node to which one electrode serving as a source or a drain is connected is switched with a control signal of the gate electrode, and can further reduce a malfunction of the pulse output circuit since response to the control signal input to the gate electrode is fast (the rise of on-state current is steep). Thus, by using the thin film transistor with four terminals, the threshold voltage can be controlled, and a malfunction of the pulse output circuit can be further reduced.

In FIG. 18C, a first terminal of the first transistor 31 is electrically connected to the power supply line 51, a second terminal of the first transistor 31 is electrically connected to a first terminal of the ninth transistor 39, and a gate electrode of the first transistor 31 is electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and a gate electrode of the sixth transistor 36 is electrically connected to the fifth input terminal 25. A first terminal of the seventh transistor 37 is electrically connected to the power supply line 52, a second terminal of the seventh transistor 37 is electrically connected to a second terminal of the eighth transistor 38, and a gate electrode of the seventh transistor 37 is electrically connected to the third input terminal 23. A first terminal of the eighth transistor 38 is electrically connected to the gate electrode of the second transistor 32 and the gate electrode of the fourth transistor 34, and a gate electrode of the eighth transistor 38 is electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to the gate electrode of the third transistor 33 and a gate electrode of the tenth transistor 40, and a gate electrode of the ninth transistor 39 is electrically connected to the power supply line 52. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34. A first terminal of the twelfth transistor 42 is electrically connected to the power supply line 53, a second terminal of the twelfth transistor 42 is electrically connected to the second output terminal 27, and a gate electrode of the twelfth transistor 42 is electrically connected to the gate electrode of the seventh transistor 37. A first terminal of the thirteenth transistor 43 is electrically connected to the power supply line 53, a second terminal of the thirteenth transistor 43 is electrically connected to the first output terminal 26, and a gate electrode of the thirteenth transistor 43 is electrically connected to the gate electrode of the seventh transistor 37.

In FIG. 18C, a portion where the gate electrode of the third transistor 33, the gate electrode of the tenth transistor 40, and the second terminal of the ninth transistor 39 are connected is referred to as a node A. Moreover, a portion where the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 is referred to as a node B (see FIG. 19A).

Figure 19A:
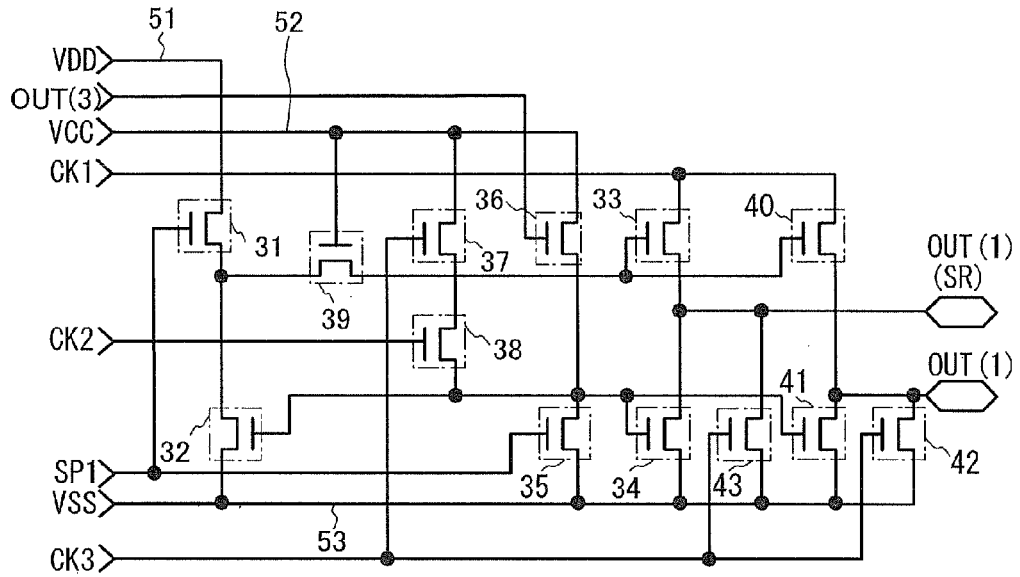
FIGS. 19A and 19B illustrate a display device.

FIG. 19A illustrates signals that are input to or output from the first input terminal 21 to the fifth input terminal 25 and the first and output terminal 26 and the second output terminal 27 in the case where the pulse output circuit illustrated in FIG. 18C is applied to the first pulse output circuit 10_1.

Specifically, the first clock signal CK1 is input to the first input terminal 21; the second clock signal CK2 is input to the second input terminal 22; the third clock signal CK3 is input to the third input terminal 23; the start pulse is input to the fourth input terminal 24; the subsequent-stage signal OUT(3) is input to the fifth input terminal 25; the first output signal OUT(1)(SR) is output from the first output terminal 26; and the second output signal OUT(1) is output from the second output terminal 27.

Note that a thin film transistor is an element having at least three terminals of a gate, a drain, and a source. The thin film transistor has a semiconductor including a channel region formed in a region overlapping with the gate. Current that flows between the drain and the source through the channel region can be controlled by controlling a potential of the gate. Here, since the source and the drain of the thin film transistor may change depending on the structure, the operating condition, and the like of the thin film transistor, it is difficult to define which is a source or a drain. Therefore, a region functioning as the source or the drain is not called the source or the drain in some cases. In that case, for example, such regions may be referred to as a first terminal and a second terminal, respectively.

Note that in FIG. 18C and FIG. 19A, a capacitor for performing bootstrap operation by bringing the node A into a floating state may be additionally provided. Furthermore, a capacitor having one electrode electrically connected to the node B may be additionally provided in order to hold a potential of the node B.

Figure 19B:
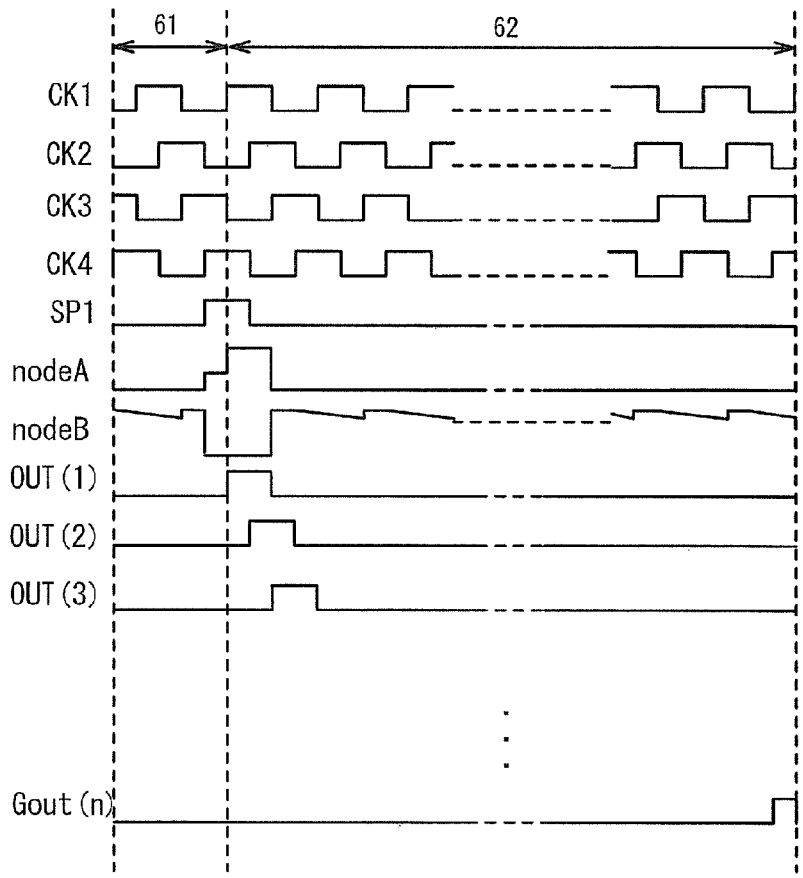

FIG. 19B illustrates a timing chart of a shift register including a plurality of pulse output circuits illustrated in FIG. 19A. Note that when the shift register is included in a scan line driver circuit, a period 61 in FIG. 19B corresponds to a vertical retrace period and a period 62 corresponds to a gate selection period.

Note that by providing the ninth transistor 39 in which the second power supply potential VCC is applied to the gate as illustrated in FIG. 19A, the following advantages before and after bootstrap operation are provided.

In the case where a potential of the node A is raised by bootstrap operation without the provision of the ninth transistor 39 in which the second power supply potential VCC is applied to the gate electrode, a potential of the source which is the second terminal of the first transistor 31 rises to a value higher than the first power supply potential VDD. Then, the source of the first transistor 31 is switched to the first terminal, that is, the terminal on the power supply line 51 side. Consequently, in the first transistor 31, a high bias voltage is applied and thus significant stress is applied between the gate and the source and between the gate and the drain, which might cause deterioration of the transistor. In contrast, in the case of providing the ninth transistor 39 in which the second power supply potential VCC is applied to the gate electrode, an increase in the potential of the second terminal of the first transistor 31 can be prevented while the potential of the node A is raised by bootstrap operation. That is, the provision of the ninth transistor 39 can lower the level of a negative bias voltage applied between the gate and the source of the first transistor 31. Thus, the circuit configuration in this embodiment can reduce a negative bias voltage applied between the gate and the source of the first transistor 31, so that deterioration of the first transistor 31 due to stress can be suppressed.

Note that the ninth transistor 39 may be provided anywhere as long as the first terminal and the second terminal of the ninth transistor 39 are connected between the second terminal of the first transistor 31 and the gate of the third transistor 33. Note also that when the shift register including a plurality of pulse output circuits in this embodiment serves as a signal line driver circuit having a larger number of stages than a scan line driver circuit, the ninth transistor 39 can be omitted, which results in reducing the number of transistors.

Note that an oxide semiconductor is used for semiconductor layers of the first transistor 31 to the thirteenth transistor 43; thus, the off-state current of the thin film transistors can be reduced, the on-state current and field effect mobility can be increased, and the degree of degradation of the transistors can be reduced. As a result, a malfunction in the circuit can be reduced. Moreover, the degree of deterioration of the transistor using an oxide semiconductor by application of a high potential to a gate electrode is smaller than that of a transistor using amorphous silicon. Consequently, similar operation can be obtained even when the first power supply potential VDD is supplied to the power supply line to which the second power supply potential VCC is supplied, and the number of power supply lines placed between circuits can be reduced; thus, the size of the circuit can be reduced.

Note that a similar function is obtained even when the connection relation is changed so that a clock signal that is supplied to the gate electrode of the seventh transistor 37 from the third input terminal 23 and a clock signal that is supplied to the gate electrode of the eighth transistor 38 from the second input terminal 22 are supplied from the second input terminal 22 and the third input terminal 23, respectively. In the shift register illustrated in FIG. 19A, a state of the seventh transistor 37 and the eighth transistor 38 is changed so that both the seventh transistor 37 and the eighth transistor 38 are on, then the seventh transistor 37 is off and the eighth transistor 38 is on, and then the seventh transistor 37 and the eighth transistor 38 are off; thus, the fall in potential of the node B due to fall in potentials of the second input terminal 22 and the third input terminal 23 is caused twice by fall in potential of the gate electrode of the seventh transistor 37 and fall in potential of the gate electrode of the eighth transistor 38. In contrast, when a state of the seventh transistor 37 and the eighth transistor 38 in the shift register illustrated in FIG. 19A is changed as in the period in FIG. 19B so that both the seventh transistor 37 and the eighth transistor 38 are on, then the seventh transistor 37 is on and the eighth transistor 38 is off, and then the seventh transistor 37 and the eighth transistor 38 are off, the fall in potential of the node B due to fall in potentials of the second input terminal 22 and the third input terminal 23 occurs once, which is caused by fall in potential of the gate electrode of the eighth transistor 38. Consequently, it is preferable to use the clock signal supplied to the gate electrode of the seventh transistor 37 from the third input terminal 23 and the clock signal supplied to the gate electrode of the eighth transistor 38 from the second input terminal 22 in order to reduce fluctuation in potential of the node B, because noise can be reduced.

In such a manner, an H-level signal is regularly supplied to the node B in a period during which the potentials of the first output terminal 26 and the second output terminal 27 are held at L level; thus, a malfunction of the pulse output circuit can be suppressed.

Embodiment 7

It is possible to manufacture a thin film transistor, and a semiconductor device having a display function (also referred to as a display device) using the thin film transistor in a pixel portion and also in a driver circuit. Moreover, a part of the driver circuit or the entire driver circuit using a thin film transistor can be formed over a substrate where a pixel portion is formed, whereby a system-on-panel can be obtained.

The display device includes a display element. Examples of the display element include a liquid crystal element (also referred to as a liquid crystal display element) and a light-emitting element (also referred to as a light-emitting display element). The light-emitting element includes in its category an element whose luminance is controlled by current or voltage, and specifically includes an inorganic electroluminescent (EL) element, an organic EL element, and the like. Furthermore, a display medium whose contrast is changed by an electric effect, such as electronic ink, can be used.

In addition, the display device includes a panel in which the display element is sealed, and a module in which an IC or the like including a controller is mounted on the panel. Furthermore, an element substrate, which corresponds to one embodiment before the display element is completed in a manufacturing process of the display device, is provided with a means for supplying current to the display element in each of a plurality of pixels. Specifically, the element substrate may be in a state in which only a pixel electrode (also referred to as a pixel electrode layer) of the display element is formed, a state after formation of a conductive film to be a pixel electrode and before etching of the conductive film to form the pixel electrode, or any other states.

Note that a display device in this specification refers to an image display device, or a light source (including a lighting device). Further, the display device includes the following modules in its category: a module including a connector such as a flexible printed circuit (FPC), a tape automated bonding (TAB) tape, or a tape carrier package (TCP); a module having a TAB tape or a TCP that is provided with a printed wiring board at the end thereof; and a module having an integrated circuit (IC) that is directly mounted on a display element by a chip on glass (COG) method.

The appearance and a cross section of a liquid crystal display panel, which is one embodiment of a semiconductor device, will be described with reference to FIGS. 12A1, 12A2, and 12B. FIGS. 12A1 and 12A2 are plan views of panels in which thin film transistor 4010 and thin film transistor 4011 and a liquid crystal element 4013 are sealed between a first substrate 4001 and a second substrate 4006 with a sealant 4005. FIG. 12B is a cross-sectional view taken along M-N in FIGS. 12A1 and 12A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that there is no particular limitation on the connection method of the driver circuit which is separately formed, and a COG method, a wire bonding method, a TAB method, or the like can be used. FIG. 12A1 illustrates an example in which the signal line driver circuit 4003 is mounted by a COG method. FIG. 12A2 illustrates an example in which signal line driver circuit 4003 is mounted by a TAB method.

The pixel portion 4002 and the scan line driver circuit 4004 provided over the first substrate 4001 include a plurality of thin film transistors. FIG. 12B illustrates the thin film transistor 4010 included in the pixel portion 4002 and the thin film transistor 4011 included in the scan line driver circuit 4004, as an example. A protective insulating layer 4020 and a protective insulating layer 4021 are provided over the thin film transistor 4010 and the thin film transistor 4011.

Any of the highly reliable thin film transistors including the oxide semiconductor layers which are described in Embodiment 1 or Embodiment 2 can be used as the thin film transistor 4010 and the thin film transistor 4011. The thin film transistor 141 or the thin film transistor 143 described in Embodiment 1 or Embodiment 2 can be used as the thin film transistor 4011 for the driver circuit. The thin film transistor 142 or the thin film transistor 144 can be used as the thin film transistor 4010 for a pixel. In this embodiment, the thin film transistor 4010 and the thin film transistor 4011 are n-channel thin film transistors.

A back-gate electrode 4040 is provided over a part of the insulating layer 4021, which overlaps with a channel formation region of an oxide semiconductor layer in the thin film transistor 4011 for the driver circuit. By providing the back-gate electrode 4040 overlapping with the channel formation region of the oxide semiconductor layer, the amount of change in threshold voltage of the thin film transistor 4011 before and after the BT testing can be reduced. A potential of the back-gate electrode 4040 may be the same as or different from that of a gate electrode layer of the thin film transistor 4011. The back-gate electrode 4040 can also function as a second gate electrode layer. Alternatively, the potential of the back-gate electrode 4040 may be GND, 0 V, or the back-gate electrode 4040 may be in a floating state.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 functioning as alignment films, respectively, and the liquid crystal layer 4008 is interposed between the pixel electrode layer 4030 and the counter electrode layer 4031 with the insulating layer 4032 and the insulating layer 4033 therebetween.

Note that a light-transmitting substrate can be used as the first substrate 4001 and the second substrate 4006; a glass substrate, a ceramics substrate, or a plastic substrate can be used. The plastic substrate can be a fiberglass-reinforced plastics (FRP) plate, a polyvinyl fluoride (PVF) film, a polyester film, or an acrylic resin film.

A columnar spacer 4035 is obtained by selective etching of an insulating film and provided in order to control the distance (a cell gap) between the pixel electrode layer 4030 and the counter electrode layer 4031. Alternatively, a spherical spacer may be used. The counter electrode layer 4031 is electrically connected to a common potential line formed over the substrate where the thin film transistor 4010 is formed. The counter electrode layer 4031 and the common potential line can be electrically connected to each other through conductive particles arranged between a pair of substrates using the common connection portion. Note that the conductive particles are included in the sealant 4005.

Alternatively, liquid crystal exhibiting a blue phase for which an alignment film is unnecessary may be used. The blue phase is one of liquid crystal phases, which occurs just before a cholesteric phase changes into an isotropic phase while temperature of cholesteric liquid crystal is increased; thus, the blue phase only occurs within a narrow range of temperature. In order to improve the temperature range, a liquid crystal composition containing a chiral agent at 5 wt % or higher is used for the liquid crystal layer 4008. The liquid crystal composition including liquid crystal exhibiting a blue phase and a chiral agent has a short response time of 1 msec or less and is optically isotropic; therefore, alignment treatment is not necessary and viewing angle dependence is small.

Note that this embodiment can also be applied to a transflective liquid crystal display device in addition to a transmissive liquid crystal display device.

In the example of the liquid crystal display device, a polarizing plate is provided on the outer surface of the substrate (on the viewer side) and a coloring layer (a color filter) and an electrode layer used for a display element are sequentially provided on the inner surface of the substrate; alternatively, the polarizing plate may be provided on the inner surface of the substrate. The layered structure of the polarizing plate and the coloring layer is not limited to that in this embodiment, but may be set as appropriate depending on materials of the polarizing plate and the coloring layer or conditions of the manufacturing process. Further, a light-blocking film serving as a black matrix may be provided except in the display portion.

In the thin film transistor 4011, the insulating layer 4042 is formed as a channel protective layer. The insulating layer 4042 may be formed using a material and a method which are similar to those of the channel protective layer 116 and the channel protective layer 216 described in Embodiment 1. Moreover, the insulating layer 4021 functioning as a planarization insulating film covers the thin film transistors in order to reduce surface unevenness of the thin film transistors. Here, as the insulating layer 4041 and the insulating layer 4042, a silicon oxide film is formed by a sputtering method described in Embodiment 1 as an example.

The protective insulating layer 4020 is formed over the insulating layer 4041 and the insulating layer 4042. The protective insulating layer 4020 can be formed using a material and a method which are similar to those of the protective insulating film 107 described in Embodiment 1. Here, a silicon nitride film is formed by a PCVD method as the insulating layer 4020.

The insulating layer 4021 is formed as the planarization insulating film. The insulating layer 4021 can be formed using a material and a method which are similar to those of the protective insulating film 108 described in Embodiment 1, and a heat-resistant organic material such as polyimide, acrylic, benzocyclobutene, polyamide, or epoxy can be used. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed from these materials.

Note that the siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. Moreover, the organic group may include a fluoro group.

There is no particular limitation on the method of forming the insulating layer 4021, and the following method or means can be used depending on the material: a sputtering method, an SOG method, a spin coating method, a dipping method, a spray coating method, or a droplet discharge method (e.g., an ink-jet method, screen printing, or offset printing); a doctor knife, a roll coater, a curtain coater, a knife coater, or the like. The baking step of the insulating layer 4021 also serves as annealing of the semiconductor layer, whereby a semiconductor device can be efficiently manufactured.

The pixel electrode layer 4030 and the counter electrode layer 4031 can be formed from a light-transmitting conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added.

Alternatively, a conductive composition containing a conductive high molecule (also referred to as a conductive polymer) can be used for the pixel electrode layer 4030 and the counter electrode layer 4031. The pixel electrode formed using the conductive composition preferably has a sheet resistance of less than or equal to 10000 ohms per square and a light transmittance of greater than or equal to 70% at a wavelength of 550 nm. Further, the resistivity of the conductive high molecule contained in the conductive composition is preferably less than or equal to 0.1 Ω·cm.

As the conductive high molecule, a so-called π-electron conjugated conductive polymer can be used. Examples are polyaniline and a derivative thereof, polypyrrole and a derivative thereof, polythiophene and a derivative thereof, a copolymer of two or more kinds of these materials, and the like.

Further, a variety of signals and potentials are supplied to the signal line driver circuit 4003 which is separately formed, the scan line driver circuit 4004, or the pixel portion 4002 from an FPC 4018.

A connection terminal electrode 4015 is formed using the same conductive film as the pixel electrode layer 4030 included in the liquid crystal element 4013. A terminal electrode 4016 is formed using the same conductive film as source and drain electrode layers of the thin film transistor 4011.

The connection terminal electrode 4015 is electrically connected to a terminal included in the FPC 4018 through an anisotropic conductive film 4019.

Note that FIGS. 12A1, 12A2, and 12B illustrate the example in which the signal line driver circuit 4003 is formed separately and mounted on the first substrate 4001; however, this embodiment is not limited to this structure. The scan line driver circuit may be separately formed and then mounted, or only a part of the signal line driver circuit or a part of the scan line driver circuit may be separately formed and then mounted.

Figure 21:
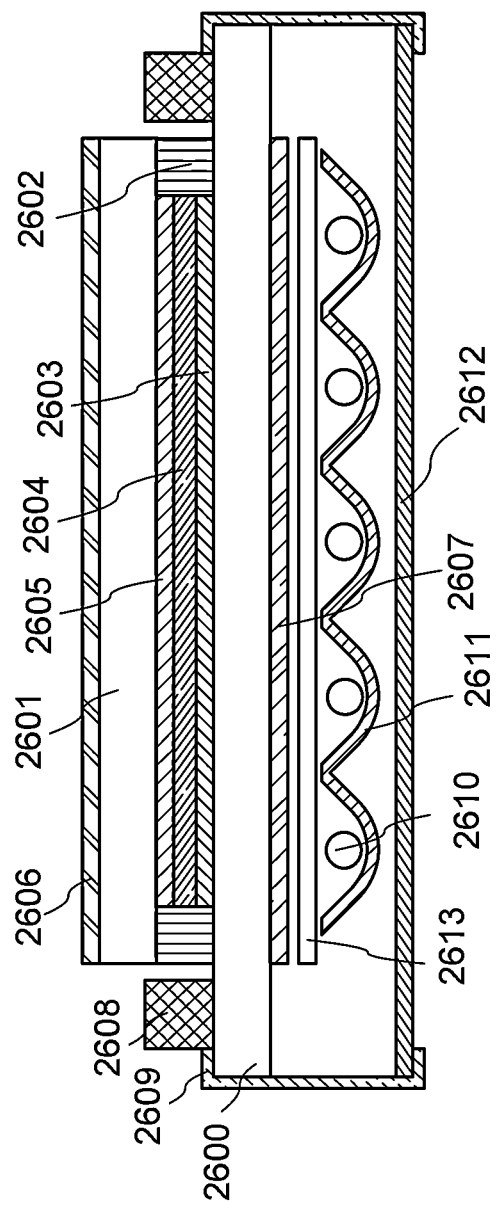
FIG. 21 illustrates a display device.

FIG. 21 illustrates an example of a liquid crystal display module which is formed as a semiconductor device by using a TFT substrate 2600 manufactured according to the manufacturing method disclosed in this specification.

FIG. 21 shows an example of the liquid crystal display module, in which the TFT substrate 2600 and a counter substrate 2601 are fixed to each other with a sealant 2602, and a pixel portion 2603 including a TFT and the like, a display element 2604 including a liquid crystal layer, and a coloring layer 2605 are provided between the substrates to form a display region. The coloring layer 2605 is necessary to perform color display. In the RGB system, coloring layers corresponding to colors of red, green, and blue are provided for pixels. A polarizing plate 2606, a polarizing plate 2607, and a diffusion plate 2613 are provided outside the TFT substrate 2600 and the counter substrate 2601. A light source includes a cold cathode tube 2610 and a reflective plate 2611. A circuit board 2612 is connected to a wiring circuit portion 2608 of the TFT substrate 2600 by a flexible wiring board 2609 and includes an external circuit such as a control circuit or a power source circuit. The polarizing plate and the liquid crystal layer may be stacked with a retardation plate therebetween.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Through the above-described steps, a liquid crystal display panel as a highly reliable semiconductor device can be manufactured.

This embodiment can be implemented in appropriate combination with any of the structures described in the other embodiments.

Embodiment 8

In this embodiment, an example of an electronic paper will be described as one embodiment of a semiconductor device.

The semiconductor device can be used for electronic paper in which electronic ink is driven by an element electrically connected to a switching element. The electronic paper is also referred to as an electrophoretic display device (an electrophoretic display) and has advantages in that it has the same level of readability as regular paper, it has lower power consumption than other display devices, and it can be made thin and lightweight.

Electrophoretic displays can have various modes. Electrophoretic displays contain a plurality of microcapsules dispersed in a solvent or a solute, each of which contains first particles that are positively charged and second particles that are negatively charged. By applying an electric field to the microcapsules, the particles in the microcapsules move in opposite directions to each other and only the color of the particles gathering on one side is displayed. Note that the first particles and the second particles contain a pigment and do not move without an electric field. Moreover, the first particles and the second particles have different colors (which may be colorless).

In this manner, an electrophoretic display utilizes a so-called dielectrophoretic effect by which a substance having a high dielectric constant moves to a high-electric field region. An electrophoretic display device does not need to use a polarizing plate, which is required for a liquid crystal display device.

A solution in which the above-described microcapsules are dispersed in a solvent is referred to as electronic ink. This electronic ink can be printed on a surface of glass, plastic, cloth, paper, or the like. Furthermore, color display can be achieved with a color filter or particles including a pigment.

When a plurality of the above-described microcapsules are arranged as appropriate over an active matrix substrate so as to be sandwiched between two electrodes, an active matrix display device can be completed, and display can be performed by application of an electric field to the microcapsules. For example, the active matrix substrate with the use of the thin film transistor in Embodiment 1 or 2 can be used.

Note that the first particles and the second particles in the microcapsules may be formed from one of a conductive material, an insulating material, a semiconductor material, a magnetic material, a liquid crystal material, a ferroelectric material, an electroluminescent material, an electrochromic material, and a magnetophoretic material or a composite material of any of these materials.

Figure 20:
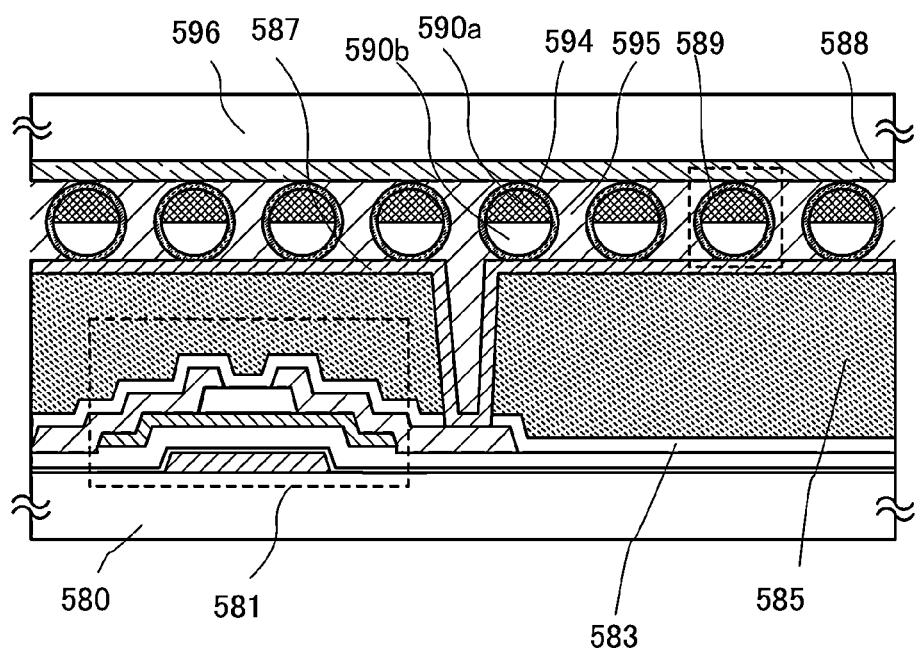
FIG. 20 illustrates a display device.

FIG. 20 illustrates an active matrix electronic paper as an example of a semiconductor device. A thin film transistor 581 used for the semiconductor device can be formed in a manner similar to that of the thin film transistor described in Embodiment 1 and is a highly reliable thin film transistor including an oxide semiconductor layer. Moreover, any of the thin film transistors described in Embodiments 2 to 4 can also be used as the thin film transistor 581 in this embodiment.

The electronic paper in FIG. 20 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 formed over a substrate 580 is a bottom-gate thin film transistor and covered with an insulating film 583. A source electrode layer or a drain electrode layer of the thin film transistor 581 is in contact with a first electrode layer 587 at an opening formed in the insulating layer 583 and an insulating layer 585, whereby the thin film transistor 581 is electrically connected to the first electrode layer 587. Spherical particles 589 are provided between the first electrode layer 587 and a second electrode layer 588 formed on a second substrate 596. Each of the spherical particles 589 includes a black region 590a, a white region 590b, and a cavity 594 filled with liquid around the black region 590a and the white region 590b. A space around the spherical particles 589 is filled with a filler 595 such as a resin. The first electrode layer 587 corresponds to a pixel electrode, and the second electrode layer 588 corresponds to a common electrode. The second electrode layer 588 is electrically connected to a common potential line provided over the substrate where the thin film transistor 581 is formed. With the use of a common connection portion, the second electrode layer 588 and the common potential line can be electrically connected to each other through conductive particles provided between a pair of substrates.

Alternatively, it is possible to use an electrophoretic element instead of the twisting ball. A microcapsule having a diameter of approximately 10 μm to 200 μm, in which transparent liquid, positively charged white microparticles, and negatively charged black microparticles are encapsulated, is used. In the microcapsule provided between the first electrode layer and the second electrode layer, when an electric field is applied by the first electrode layer and the second electrode layer, the white microparticles and the black microparticles move in opposite directions, so that white or black can be displayed. A display element using this principle is an electrophoretic display element, and a device including the electrophoretic display element is called electronic paper in general. The electrophoretic display element has higher reflectance than a liquid crystal display element; thus, an auxiliary light is unnecessary, power consumption is low, and a display portion can be recognized in a dim place. In addition, even when power is not supplied to the display portion, an image which has been displayed once can be maintained. Consequently, a displayed image can be stored even when a semiconductor device having a display function (which may be referred to simply as a display device or a semiconductor device provided with a display device) is kept away from an electric wave source.

Through the above-described steps, a highly reliable electronic paper can be manufactured as a semiconductor device.

This embodiment can be implemented in appropriate combination with any of the structures described in the other embodiments.

Embodiment 9

An example of a light-emitting display device will be described as a semiconductor device. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to the light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

Inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that here, an organic EL element is described as a light-emitting element.

Figure 14:
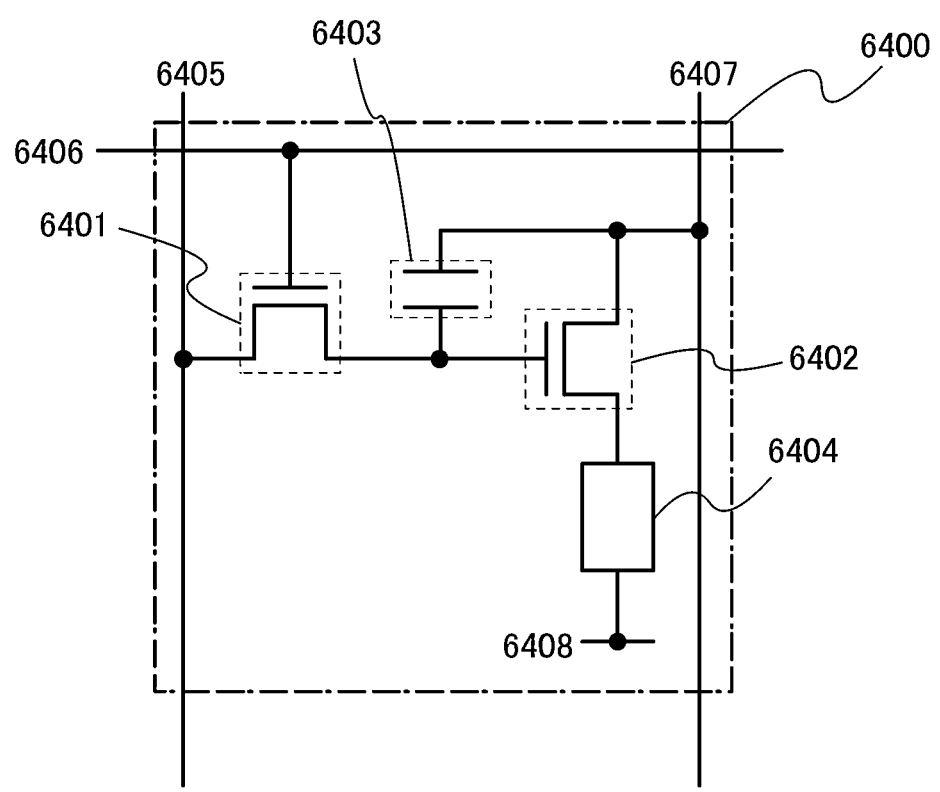
FIG. 14 illustrates an equivalent circuit of a pixel of a semiconductor device.

FIG. 14 illustrates an example of a pixel structure to which digital time grayscale driving can be applied, as an example of a semiconductor device.

A structure and operation of a pixel to which digital time grayscale driving can be applied are described. Here, one pixel includes two n-channel transistors each of which includes an oxide semiconductor layer as a channel formation region.

A pixel 6400 includes a switching transistor 6401, a driver transistor for a light-emitting element 6402, a light-emitting element 6404, and a capacitor 6403. A gate of the switching transistor 6401 is connected to a scan line 6406. A first electrode (one of a source electrode and a drain electrode) of the switching transistor 6401 is connected to a signal line 6405. A second electrode (the other of the source electrode and the drain electrode) of the switching transistor 6401 is connected to a gate of the driver transistor for a light-emitting element 6402. The gate of the driver transistor for a light-emitting element 6402 is connected to a power supply line 6407 through the capacitor 6403. A first electrode of the driver transistor for a light-emitting element 6402 is connected to the power supply line 6407. A second electrode of the driver transistor for a light-emitting element 6402 is connected to a first electrode (a pixel electrode) of the light-emitting element 6404. A second electrode of the light-emitting element 6404 corresponds to a common electrode 6408. The common electrode 6408 is electrically connected to a common potential line provided over the same substrate.

The second electrode (the common electrode 6408) of the light-emitting element 6404 is set to a low power supply potential. Note that the low power supply potential is lower than a high power supply potential that is set to the power supply line 6407. For example, GND or 0 V may be set as the low power supply potential. A potential difference between the high power supply potential and the low power supply potential is applied to the light-emitting element 6404 so that current flows through the light-emitting element 6404, whereby the light-emitting element 6404 emits light. In order to make the light-emitting element 6404 emit light, each potential is set so that the potential difference between the high power supply potential and the low power supply potential is higher than or equal to the forward threshold voltage of the light-emitting element 6404. Note that the common electrode 6408 may be set to a high power supply potential, and the power supply line 6407 may be set to a low power supply potential. In that case, the structure of the light-emitting element 6404 may be modified as appropriate because the current in the light-emitting element 6404 flows reversely.

Note that gate capacitance of the driver transistor for a light-emitting element 6402 may be used as a substitute for the capacitor 6403, so that the capacitor 6403 can be omitted. The gate capacitance of the driver transistor for a light-emitting element 6402 may be formed between the channel region and the gate electrode.

In the case of employing a voltage-input voltage-driving method, a video signal is input to the gate of the driver transistor for a light-emitting element 6402 so that the driver transistor for a light-emitting element 6402 is in either of two states of being sufficiently turned on or turned off. That is, the driver transistor for a light-emitting element 6402 is operated in a linear region. Since the driver transistor for a light-emitting element 6402 is operated in the linear region, a voltage higher than the voltage of the power supply line 6407 is applied to the gate of the driver transistor for a light-emitting element 6402. Note that a voltage higher than or equal to the sum of the power supply line voltage and Vth of the driver transistor for a light-emitting element 6402 is applied to the signal line 6405.

In the case of employing an analog grayscale method instead of the digital time grayscale method, the same pixel structure as that in FIG. 14 can be employed by changing signal input.

In the case of performing analog grayscale driving, a voltage higher than or equal to the sum of the forward voltage of the light-emitting element 6404 and Vth of the driver transistor for a light-emitting element 6402 is applied to the gate of the driver transistor for a light-emitting element 6402. The forward voltage of the light-emitting element 6404 indicates a voltage at which a desired luminance is obtained, and includes at least a forward threshold voltage. The video signal by which the driver transistor for a light-emitting element 6402 is operated in a saturation region is input, so that current can be supplied to the light-emitting element 6404. In order to operate the driver transistor for a light-emitting element 6402 in the saturation region, the potential of the power supply line 6407 is set higher than the gate potential of the driver transistor for a light-emitting element 6402. When an analog video signal is used, a current corresponding to the video signal can be supplied to the light-emitting element 6404, so that analog grayscale driving can be performed.

Note that the pixel structure is not limited to that illustrated in FIG. 14. For example, a switch, a resistor, a capacitor, a transistor, a logic circuit, or the like may be added to the pixel illustrated in FIG. 14.

Next, a structure of a light-emitting element will be described with reference to FIGS. 15A to 15C. Here described is a cross-sectional structure of an example in which an n-channel driver TFT for a light-emitting element is used, the upper electrode of two electrodes included in the light-emitting element is an anode, and the lower electrode thereof is a cathode. TFTs 7001, 7011, and 7021 serving as driver TFTs for a light-emitting element used in semiconductor devices illustrated in FIGS. 15A, 15B, and 15C can be formed in a manner similar to that of the thin film transistor provided for a pixel described in Embodiment 1 and are highly reliable thin film transistors each including an oxide semiconductor layer. Alternatively, any of the thin film transistors provided for a pixel described in Embodiments 2 to 4 can be employed as the TFTs 7001, 7011, and 7021.

In order to extract light emitted from the light-emitting element, at least one of an anode and a cathode needs to transmit light. A thin film transistor and a light-emitting element are formed over a substrate. The light-emitting element can have a top emission structure in which light is extracted through the surface opposite to the substrate; a bottom emission structure in which light is extracted through the surface on the substrate side; or a dual emission structure in which light is extracted through the surface opposite to the substrate and the surface on the substrate side. The pixel structure can be applied to a light-emitting element having any of these emission structures.

A light-emitting element having the top emission structure is described with reference to FIG. 15A.

Figure 15A:
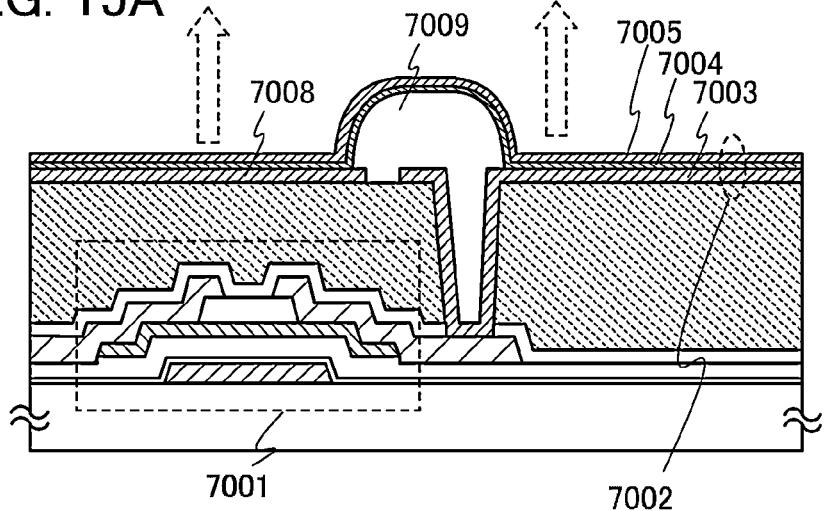
FIGS. 15A to 15C illustrate display devices.

FIG. 15A is a cross-sectional view of a pixel in the case where the TFT 7001 serving as the driver TFT for a light-emitting element is an n-channel TFT and light emitted from a light-emitting element 7002 passes through an anode 7005. In FIG. 15A, a cathode 7003 of the light-emitting element 7002 is electrically connected to the TFT 7001 serving as the driver TFT for a light-emitting element, and a light-emitting layer 7004 and the anode 7005 are stacked in this order over the cathode 7003. The cathode 7003 can be formed using a variety of conductive materials as long as they have a low work function and reflect light. For example, Ca, Al, MgAg, AlLi, or the like is preferably used. The light-emitting layer 7004 may be formed using a single layer or a plurality of layers stacked. When the light-emitting layer 7004 is formed using a plurality of layers, the light-emitting layer 7004 is formed by stacking an electron injection layer, an electron transport layer, a light-emitting layer, a hole transport layer, and a hole injection layer in this order over the cathode 7003. Note that it is not necessary to form all of these layers. The anode 7005 is formed using a light-transmitting conductive film, for example, a film of indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added.

Moreover, a bank 7009 is provided between the cathode 7003 and a cathode 7008 in an adjacent pixel so as to cover edges of the cathodes 7003 and 7008. The bank 7009 can be formed using an organic resin film of polyimide, acrylic, polyamide, epoxy, or the like; an inorganic insulating film; or organic polysiloxane. It is particularly preferable that the bank 7009 be formed using a photosensitive resin material so that its side surface is an inclined surface with continuous curvature. When a photosensitive resin material is used for the bank 7009, a step of forming a resist mask can be omitted.

The light-emitting element 7002 corresponds to a region where the light-emitting layer 7004 is sandwiched between the cathode 7003 and the anode 7005. In the pixel illustrated in FIG. 15A, light is emitted from the light-emitting element 7002 to the anode 7005 side as indicated by arrows.

Next, a light-emitting element having the bottom emission structure is described with reference to FIG. 15B. FIG. 15B is a cross-sectional view of a pixel in the case where the driver TFT for a light-emitting element 7011 is an n-channel TFT and light is emitted from a light-emitting element 7012 to a cathode 7013 side. In FIG. 15B, the cathode 7013 of the light-emitting element 7012 is formed over a light-transmitting conductive film 7017 that is electrically connected to the driver TFT for a light-emitting element 7011, and a light-emitting layer 7014 and an anode 7015 are stacked in this order over the cathode 7013. Note that a light-blocking film 7016 for reflecting or blocking light may be formed so as to cover the anode 7015 when the anode 7015 has light-transmitting properties. The cathode 7013 can be formed using a variety of conductive materials as in the case of FIG. 15A as long as they have a low work function. Note that the cathode 7013 is formed to a thickness that can transmit light (preferably approximately 5 nm to 30 nm). For example, a 20-nm-thick aluminum film can be used as the cathode 7013. As in the case of FIG. 15A, the light-emitting layer 7014 may be formed using a single layer or a plurality of layers stacked.

The anode 7015 is not necessary to transmit light, but can be formed using a light-transmitting conductive material as in the case of FIG. 15A. For the light-blocking film 7016, a metal or the like that reflects light can be used, for example; however, the light-blocking film 7016 is not limited to a metal film. For example, a resin or the like to which a black pigment is added can be used.

Moreover, a bank 7019 is provided between the conductive film 7017 and a conductive film 7018 in an adjacent pixel so as to cover edges of the conductive films 7017 and 7018. The bank 7019 can be formed using an organic resin film of polyimide, acrylic, polyamide, epoxy, or the like; an inorganic insulating film; or organic polysiloxane. It is particularly preferable that the bank 7019 be formed using a photosensitive resin material so that its side surface is an inclined surface with continuous curvature. When a photosensitive resin material is used for the bank 7019, a step of forming a resist mask can be omitted.

The light-emitting element 7012 corresponds to a region where the light-emitting layer 7014 is sandwiched between the cathode 7013 and the anode 7015. In the pixel illustrated in FIG. 15B, light is emitted from the light-emitting element 7012 to the cathode 7013 side as indicated by arrows.

Next, a light-emitting element having the dual emission structure is described with reference to FIG. 15C. In FIG. 15C, a cathode 7023 of a light-emitting element 7022 is formed over a light-transmitting conductive film 7027 that is electrically connected to the driver TFT for a light-emitting element 7021, and a light-emitting layer 7024 and an anode 7025 are sequentially stacked over the cathode 7023. As in the case of FIG. 15A, the cathode 7023 can be formed using any of a variety of materials as long as it is a conductive material having a low work function. Note that the cathode 7023 is formed to a thickness that can transmit light. For example, a 20-nm-thick film of Al can be used as the cathode 7023. As in the case of FIG. 15A, the light-emitting layer 7024 may be formed using a single layer or a plurality of layers stacked. The anode 7025 can be formed using a light-transmitting conductive material as in the case of FIG. 15A.

Moreover, a bank 7029 is provided between the conductive film 7027 and a conductive film 7028 in an adjacent pixel so as to cover edges of the conductive films 7027 and 7028. The bank 7029 can be formed using an organic resin film of polyimide, acrylic, polyamide, epoxy, or the like; an inorganic insulating film; or organic polysiloxane. It is particularly preferable that the bank 7029 be formed using a photosensitive resin material so that its side surface is an inclined surface with continuous curvature. When a photosensitive resin material is used for the bank 7029, a step of forming a resist mask can be omitted.

The light-emitting element 7022 corresponds to a portion where the cathode 7023, the light-emitting layer 7024, and the anode 7025 overlap with one another. In the pixel illustrated in FIG. 15C, light is emitted from the light-emitting element 7022 to both the anode 7025 side and the cathode 7023 side as indicated by arrows.

Note that although the organic EL elements are described here as the light-emitting elements, an inorganic EL element can also be provided as a light-emitting element.

Note that the example is described in which the thin film transistor (the driver TFT for a light-emitting element) which controls the driving of a light-emitting element is electrically connected to the light-emitting element; alternatively, a structure may be employed in which a TFT for current control is connected between the driver TFT for a light-emitting element and the light-emitting element.

Figure 15B:
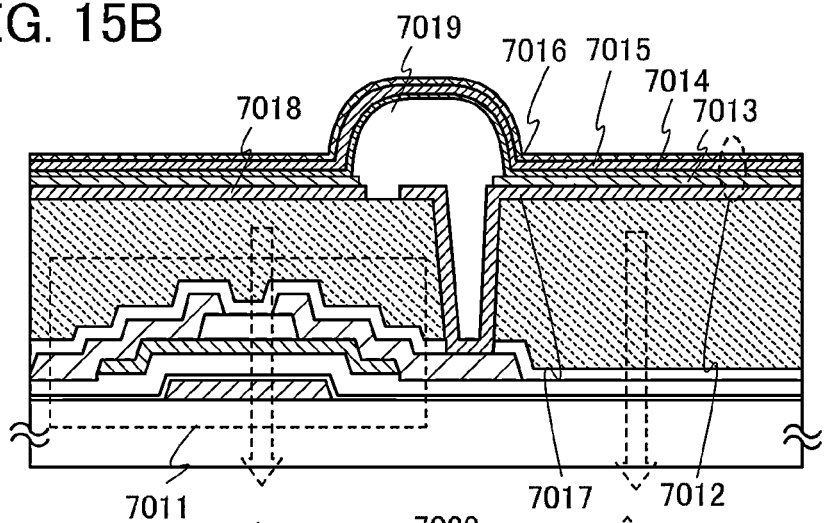
Figure 15C:
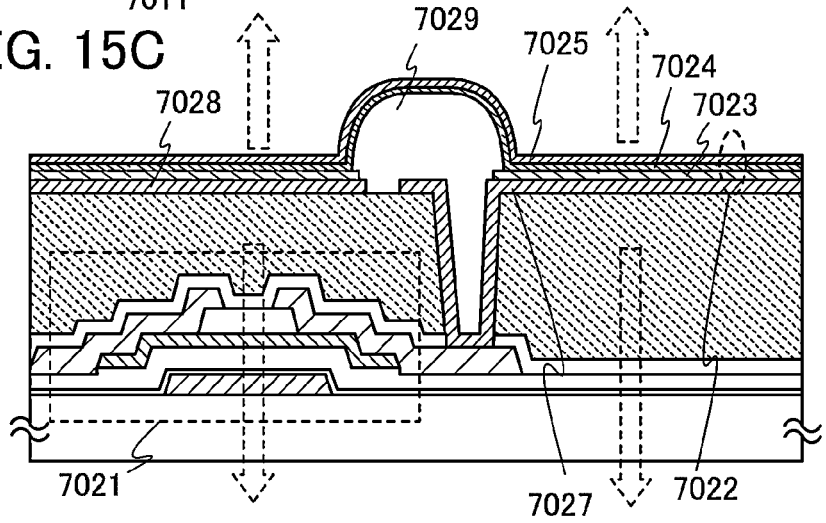

Note that the structure of the semiconductor device is not limited to those illustrated in FIGS. 15A to 15C and can be modified in various ways based on techniques disclosed in this specification.

Figure 13A:
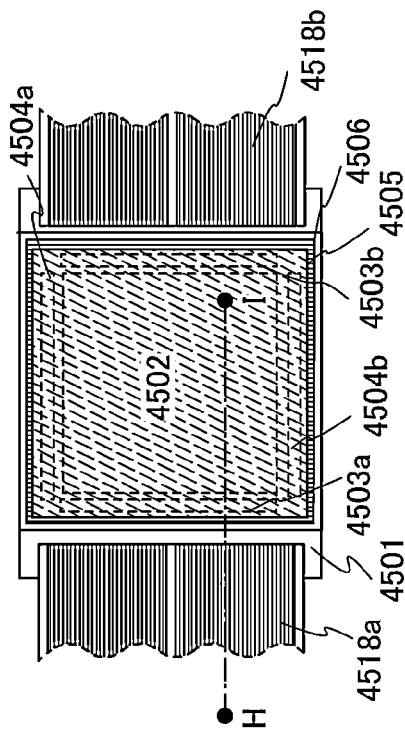
FIGS. 13A and 13B illustrate a display device.
Figure 13B:
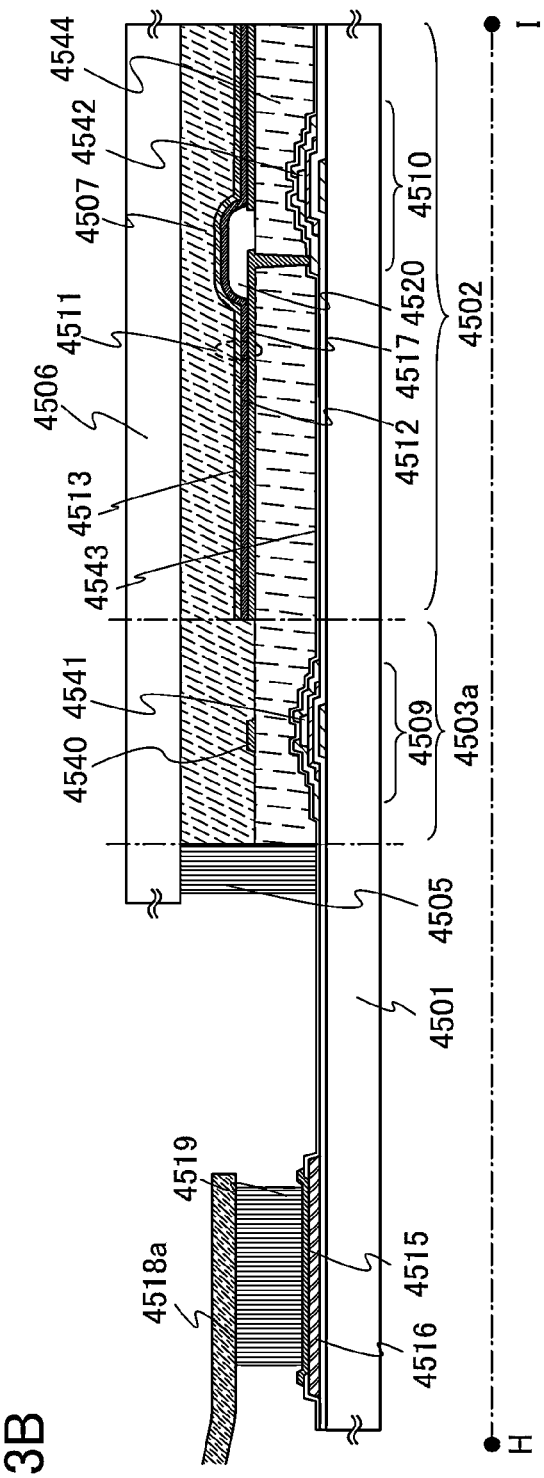

Next, the appearance and a cross section of a light-emitting display panel (also referred to as a light-emitting panel) which is one embodiment of a semiconductor device will be described with reference to FIGS. 13A and 13B. FIG. 13A is a plan view of a panel in which a thin film transistor and a light-emitting element that are formed over a first substrate are sealed between the first substrate and a second substrate with a sealant. FIG. 13B is a cross-sectional view along H-I in FIG. 13A.

A sealant 4505 is provided so as to surround a pixel portion 4502, signal line driver circuits 4503a and 4503b, and scan line driver circuits 4504a and 4504b which are provided over a first substrate 4501. Moreover, a second substrate 4506 is provided over the pixel portion 4502, the signal line driver circuits 4503a and 4503b, and the scan line driver circuits 4504a and 4504b. Consequently, the pixel portion 4502, the signal line driver circuits 4503a and 4503b, and the scan line driver circuits 4504a and 4504b are sealed together with a filler 4507 by the first substrate 4501, the sealant 4505, and the second substrate 4506. In this manner, a panel is preferably packaged (sealed) with a protective film (such as a laminate film or an ultraviolet curable resin film) or a cover material with high air-tightness and little degasification so that the panel is not exposed to the outside air.

The pixel portion 4502, the signal line driver circuits 4503a and 4503b, and the scan line driver circuits 4504a and 4504b, which are formed over the first substrate 4501, each include a plurality of thin film transistors. A thin film transistor 4510 included in the pixel portion 4502 and a thin film transistor 4509 included in the signal line driver circuit 4503a are illustrated as an example in FIG. 13B.

Any of the highly reliable thin film transistors including the oxide semiconductor layers described in any of Embodiment 1 or Embodiment 2 can be used as the thin film transistors 4509 and 4510. The thin film transistor 141 or the thin film transistor 143 described in Embodiment 1 or Embodiment 2 can be used as the thin film transistor 4509 provided for the driver circuit. The thin film transistor 142 or the thin film transistor 144 can be used as the thin film transistor 4510 provided for a pixel. In this embodiment, the thin film transistors 4509 and 4510 are n-channel thin film transistors.

A back-gate electrode 4540 is provided over a part of an insulating layer 4544, which overlaps with a channel formation region of an oxide semiconductor layer in the thin film transistor 4509 for the driver circuit. By providing the back-gate electrode 4540 overlapping with the channel formation region of the oxide semiconductor layer, the amount of change in threshold voltage of the thin film transistor 4509 before and after the BT testing can be reduced. A potential of the back-gate electrode 4540 may be the same as or different from that of a gate electrode layer in the thin film transistor 4509. The back-gate electrode 4540 can also function as a second gate electrode layer. Alternatively, the potential of the back-gate electrode 4540 may be GND, 0 V, or the back-gate electrode 4540 may be in a floating state.

In the thin film transistor 4509, the insulating layer 4541 is formed as a channel protective layer. In the thin film transistor 4510, an insulating layer 4542 is formed as a channel protective layer. The insulating layers 4541 and 4542 can be formed using a material by a method which are similar to those of the channel protective layers 116 and 216 described in Embodiment 1. Moreover, the insulating layer 4544 functioning as a planarization insulating film covers the thin film transistor in order to reduce surface unevenness of the thin film transistors. Here, as the insulating layers 4541 and 4542, a silicon oxide film is formed by a sputtering method described in Embodiment 1 as an example.

Furthermore, a protective insulating layer 4543 is formed over the thin film transistors 4509 and 4510. The protective insulating layer 4543 can be formed using a material by a method which are similar to those of the protective insulating film 107 described in Embodiment 1. Here, a silicon nitride film is formed by a PCVD method as the protective insulating layer 4543.

The insulating layer 4544 is formed as the planarization insulating film. The insulating layer 4544 can be formed using a material by a method which are similar to those of the second protective insulating film 108 described in Embodiment 1. Here, acrylic is used for the insulating layer 4544.

Reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that the structure of the light-emitting element 4511 is not limited to a layered structure of the first electrode layer 4517, an electroluminescent layer 4512, and a second electrode layer 4513. The structure of the light-emitting element 4511 can be changed as appropriate depending on the direction in which light is extracted from the light-emitting element 4511, or the like.

A bank 4520 is formed using an organic resin film, an inorganic insulating film, or organic polysiloxane. It is particularly preferable that the bank 4520 be formed using a photosensitive material and an opening be formed over the first electrode layer 4517 so that a sidewall of the opening is formed as an inclined surface with continuous curvature.

The electroluminescent layer 4512 may be formed with a single layer or a plurality of layers stacked.

A protective film may be formed over the second electrode layer 4513 and the bank 4520 in order to prevent the entry of oxygen, hydrogen, moisture, carbon dioxide, or the like into the light-emitting element 4511. As the protective film, a silicon nitride film, a silicon nitride oxide film, a DLC film, or the like can be formed.

In addition, a variety of signals and potentials are supplied to the signal line driver circuits 4503a and 4503b, the scan line driver circuits 4504a and 4504b, or the pixel portion 4502 from FPCs 4518a and 4518b.

A connection terminal electrode 4515 is formed from the same conductive film as the first electrode layer 4517 included in the light-emitting element 4511, and a terminal electrode 4516 is formed from the same conductive film as the source and drain electrode layers included in the thin film transistor 4509.

The connection terminal electrode 4515 is electrically connected to a terminal included in the FPC 4518a through an anisotropic conductive film 4519.

The second substrate positioned in the direction in which light is extracted from the light-emitting element 4511 needs to have light-transmitting properties. In that case, a light-transmitting material such as a glass plate, a plastic plate, a polyester film, or an acrylic film is used for the second substrate.

As the filler 4507, an ultraviolet curable resin or a thermosetting resin can be used in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. For example, nitrogen is used for the filler.

When needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, a polarizing plate or a circularly polarizing plate may be provided with an anti-reflection film. For example, anti-glare treatment can be performed by which reflected light can be diffused by projections and depressions on the surface so as to reduce glare.

Driver circuits formed using a single crystal semiconductor film or a polycrystalline semiconductor film over a substrate separately prepared may be mounted as the signal line driver circuits 4503a and 4503b and the scan line driver circuits 4504a and 4504b. Alternatively, only the signal line driver circuits or a part thereof, or only the scan line driver circuits or a part thereof may be separately formed and mounted. This embodiment is not limited to the structure illustrated in FIGS. 13A and 13B.

Through the above-described steps, a light-emitting display device (display panel) as a highly reliable semiconductor device can be manufactured.

This embodiment can be implemented in appropriate combination with any of the structures described in the other embodiments.

Embodiment 10

Figure 22:
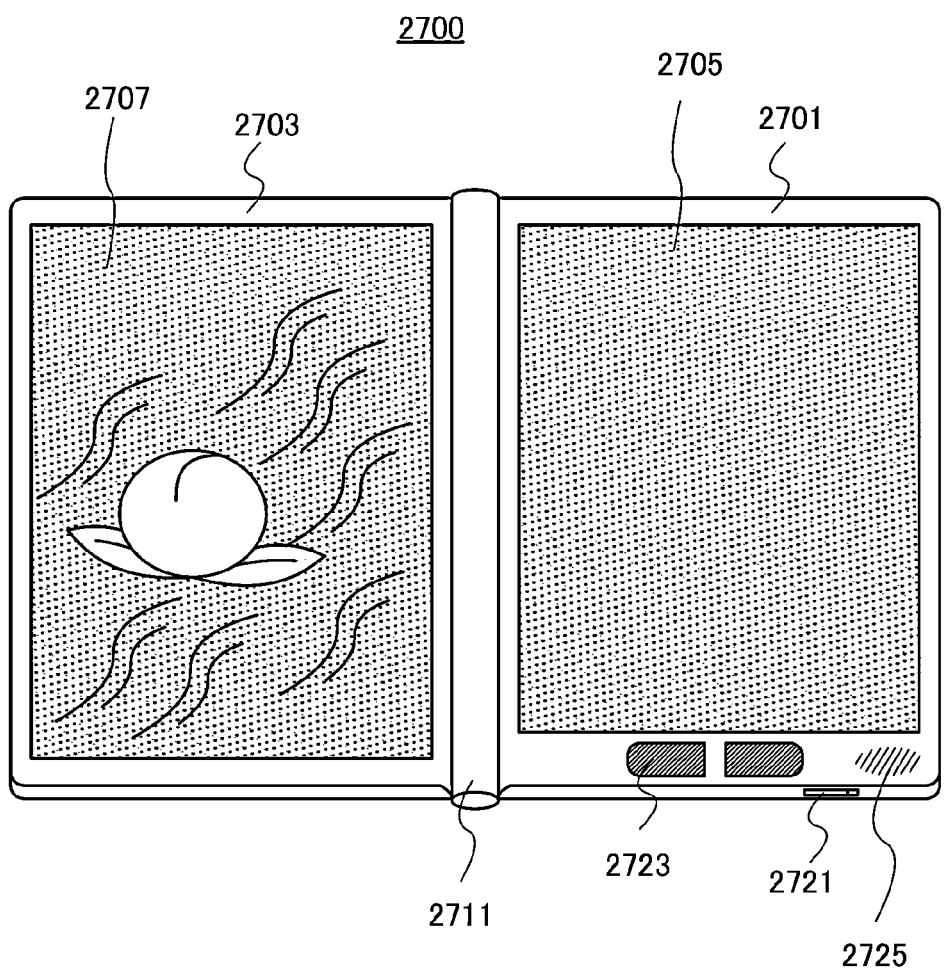
FIG. 22 is an external view illustrating an example of an electronic book reader.

A semiconductor device disclosed in this specification can be applied to electronic paper. Electronic paper can be used for electronic devices in all fields as long as they display data. For example, electronic paper can be applied to an e-book reader (an electronic book), a poster, an advertisement in a vehicle such as a train, or displays of a variety of cards such as a credit card. FIG. 22 illustrates an example of the electronic devices.

FIG. 22 illustrates an example of an e-book reader 2700. For example, the e-book reader 2700 includes two housings of a housing 2701 and a housing 2703. The housing 2701 and the housing 2703 are combined with a hinge 2711 so that the e-book reader 2700 can be opened and closed with the hinge 2711 as an axis. Such a structure enables the e-book reader 2700 to be operated like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 22) can display text and a display portion on the left side (the display portion 2707 in FIG. 22) can display graphics.

FIG. 22 illustrates an example in which the housing 2701 is provided with an operation portion and the like. For example, the housing 2701 is provided with a power switch 2721, operation keys 2723, a speaker 2725, and the like. Pages can be turned with the operation keys 2723. Note that a keyboard, a pointing device, and the like may be provided on the same surface as the display portion of the housing. Moreover, an external connection terminal (an earphone terminal, a USB terminal, a terminal connectable to a variety of cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may be configured to wirelessly transmit and receive data. Through wireless communication, desired book data or the like can be purchased and downloaded from an electronic book server.

Embodiment 11

A semiconductor device disclosed in this specification can be applied to a variety of electronic devices (including game machines). Examples of such electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pinball machine, and the like.

Figure 23A:
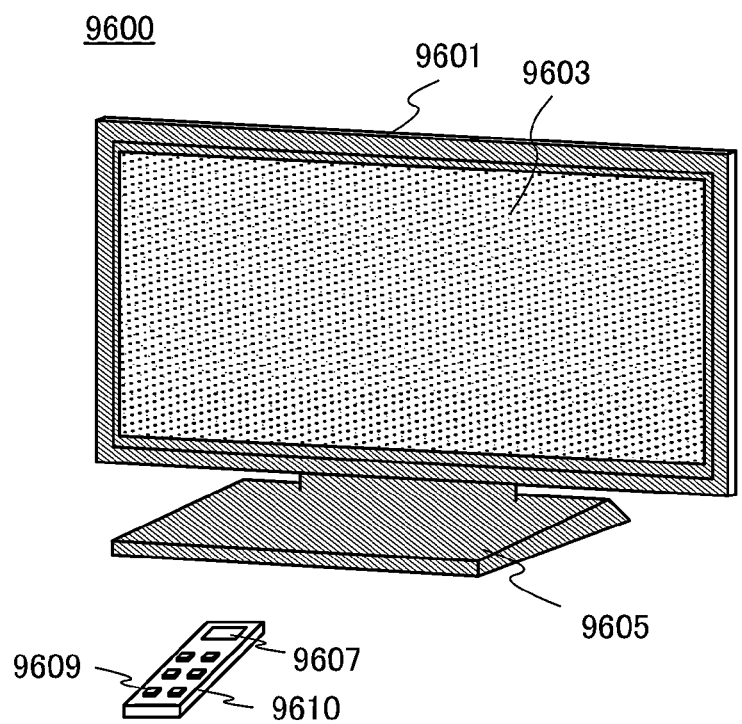
FIGS. 23A and 23B are external views illustrating examples of a television device and a digital photo frame.

FIG. 23A illustrates an example of a television set 9600. In the television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels can be switched and volume can be controlled with operation keys 9609 of the remote controller 9610, whereby an image displayed on the display portion 9603 can be controlled. Moreover, the remote controller 9610 may be provided with a display portion 9607 for displaying data outputted from the remote controller 9610.

Note that the television set 9600 is provided with a receiver, a modem, and the like. With the use of the receiver, general TV broadcasts can be received. Moreover, when the display device is connected to a communication network with or without wires via the modem, one-way (from a sender to a receiver) or two-way (between a sender and a receiver or between receivers) information communication can be performed.

Figure 23B:
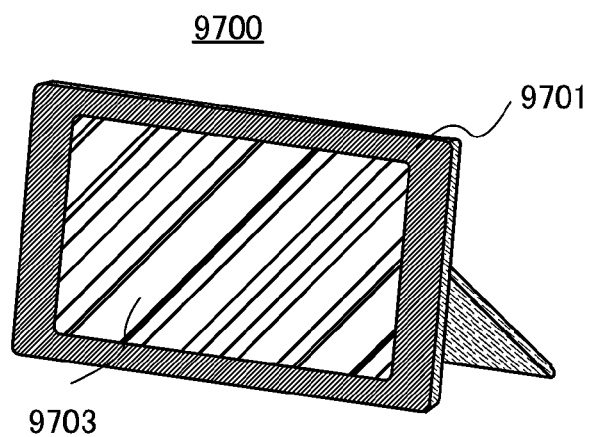

FIG. 23B illustrates an example of a digital photo frame 9700. For example, in the digital photo frame 9700, a display portion 9703 is incorporated in a housing 9701. The display portion 9703 can display a variety of images. For example, the display portion 9703 can display data of an image taken with a digital camera or the like and function as a normal photo frame.

Note that the digital photo frame 9700 is provided with an operation portion, an external connection portion (a USB terminal, a terminal connectable to a variety of cables such as a USB cable, or the like), a recording medium insertion portion, and the like. Although these components may be provided on the same surface as the display portion, it is preferable to provide them on the side surface or the back surface for design aesthetics. For example, a memory storing data of an image taken with a digital camera is inserted in the recording medium insertion portion of the digital photo frame 9700 and the data is loaded, whereby the image can be displayed on the display portion 9703.

The digital photo frame 9700 may be configured to transmit and receive data wirelessly. Through wireless communication, desired image data can be loaded to be displayed.

Figure 24A:
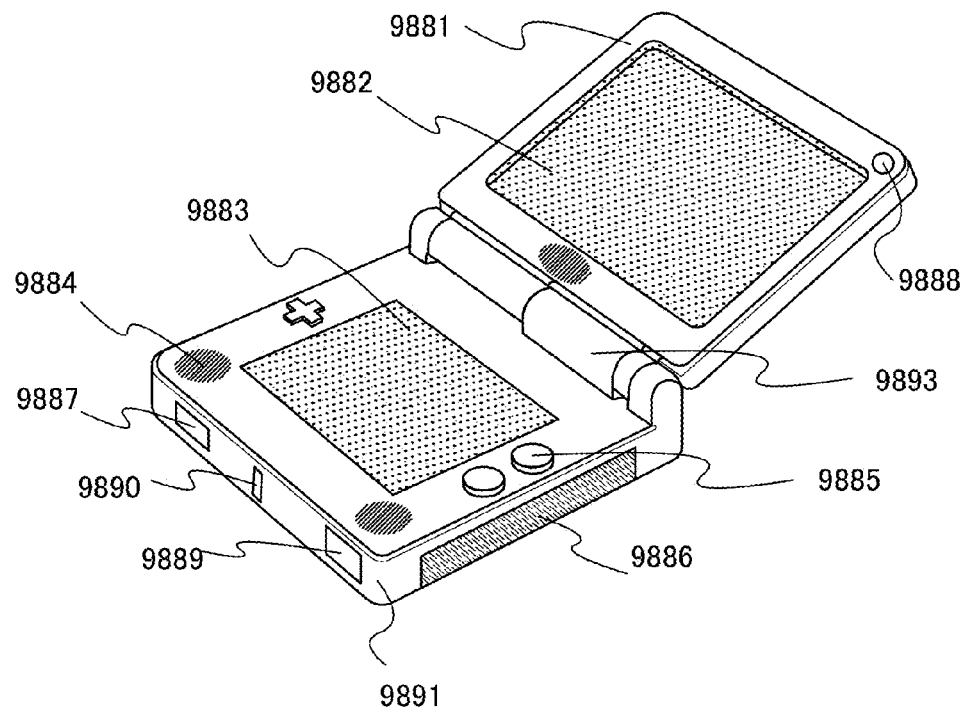
FIGS. 24A and 24B are external views illustrating examples of game machines.

FIG. 24A is a portable game machine and is constituted by two housings of a housing 9881 and a housing 9891 which are connected with a joint portion 9893 so that the portable game machine can be opened and folded. A display portion 9882 and a display portion 9883 are incorporated in the housing 9881 and the housing 9891, respectively. In addition, the portable game machine illustrated in FIG. 24A is provided with a speaker portion 9884, a recording medium insertion portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, smell, or infrared ray), and a microphone 9889), and the like. Needless to say, the structure of the portable game machine is not limited to the above structure and other structures provided with at least a semiconductor device disclosed in this specification can be employed. The portable game machine may include other accessory as appropriate. The portable game machine illustrated in FIG. 24A has a function of reading a program or data stored in the recording medium to display it on the display portion, and a function of sharing information with another portable game machine by wireless communication. Note that a function of the portable game machine illustrated in FIG. 24A is not limited to those described above, and the portable game machine can have a variety of functions.

Figure 24B:
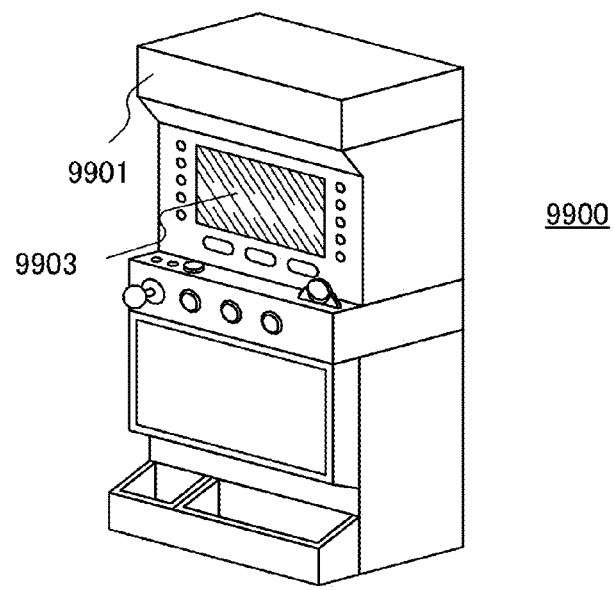

FIG. 24B illustrates an example of a slot machine 9900 which is a large-sized game machine. In the slot machine 9900, a display portion 9903 is incorporated in a housing 9901. In addition, the slot machine 9900 includes an operation means such as a start lever or a stop switch, a coin slot, a speaker, and the like. Needless to say, the structure of the slot machine 9900 is not limited to the above and other structures provided with at least a semiconductor device disclosed in this specification may be employed. The slot machine 9900 may include other accessory as appropriate.

Figure 25A:
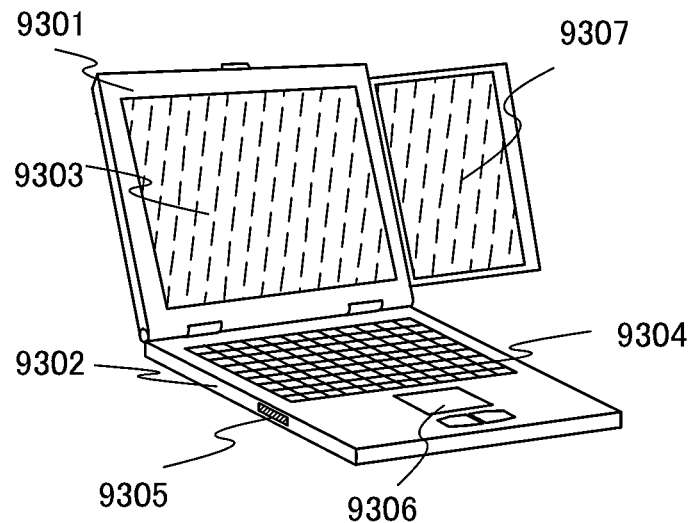
FIGS. 25A and 25B are external views respectively illustrating an example of a portable computer and an example of a mobile phone.

FIG. 25A is a perspective view illustrating an example of a portable computer.

In the portable computer illustrated in FIG. 25A, a top housing 9301 having a display portion 9303 and a bottom housing 9302 having a keyboard 9304 can overlap with each other by closing a hinge unit which connects the top housing 9301 and the bottom housing 9302. The portable computer illustrated in FIG. 25A is conveniently carried. Moreover, in the case of using the keyboard for input of data, the hinge unit is opened so that a user can input data looking at the display portion 9303.

The bottom housing 9302 includes a pointing device 9306 with which input can be performed, in addition to the keyboard 9304. When the display portion 9303 is a touch panel, a user can input data by touching a part of the display portion. The bottom housing 9302 includes an arithmetic function portion such as a CPU or hard disk. In addition, the bottom housing 9302 includes an external connection port 9305 into which another device, for example, a communication cable conformable to communication standards of a USB is inserted.

The top housing 9301, which includes a display portion 9307 and can keep the display portion 9307 therein by sliding it toward the inside of the top housing 9301, can have a large display screen. In addition, a user can adjust the angle of a screen of the display portion 9307 which can be kept in the top housing 9301. When the display portion 9307 which can be kept in the top housing 9301 is a touch panel, a user can input data by touching a part of the display portion 9307.

The display portion 9303 or the stowable display portion 9307 is are formed using an image display device such as a liquid crystal display panel or a light-emitting display panel using an organic light-emitting element, an inorganic light-emitting element, or the like.

In addition, the portable computer illustrated in FIG. 25A can be provided with a receiver and the like and can receive a TV broadcast to display an image on the display portion. A user can watch a TV broadcast when the whole screen of the display portion 9307 is exposed by being slid while the hinge unit which connects the top housing 9301 and the bottom housing 9302 is kept closed. In this case, the hinge unit is not opened and display is not performed on the display portion 9303. In addition, start up of only a circuit for displaying a TV broadcast is performed. Thus, power consumption can be minimized, which is useful for the portable computer whose battery capacity is limited.

Figure 25B:
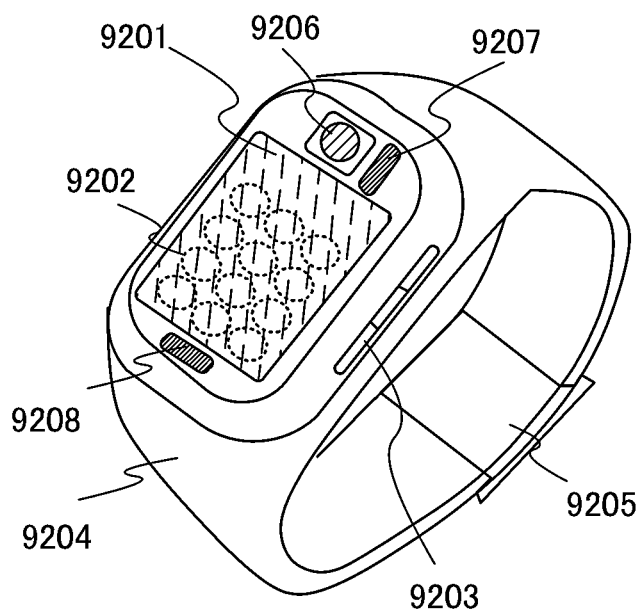

FIG. 25B is a perspective view of an example of a mobile phone that the user can wear on the wrist like a wristwatch.

This mobile phone is formed with a main body which includes a communication device including at least a telephone function, and a battery; a band portion 9204 which enables the main body to be worn on the wrist; an adjusting portion 9205 for adjusting the band portion 9204 to fit the wrist; a display portion 9201; a speaker 9207; and a microphone 9208.

In addition, the main body includes operation switches 9203. The operation switches 9203 can serve, for example, as a switch for starting a program for the Internet when pushed, in addition to serving as a power switch, a switch for switching displays, a switch for instruction to start taking images, or the like, and can be configured to have respective functions.

A user can input data into this mobile phone by touching the display portion 9201 with a finger or an input pen, operating the operation switches 9203, or inputting voice into the microphone 9208. In FIG. 25B, display buttons 9202 are displayed on the display portion 9201. A user can input data by touching the display buttons 9202 with a finger or the like.

Further, the main body includes a camera portion 9206 including an image pick-up means having a function of converting an image of an object, which is formed through a camera lens, to an electronic image signal. Note that the camera portion is not necessarily provided.

The mobile phone illustrated in FIG. 25B is provided with a receiver of a TV broadcast and the like, and can display an image on the display portion 9201 by receiving the TV broadcast. In addition, the mobile phone is provided with a memory device such as a memory, and the like, and can record the TV broadcast in the memory. The mobile phone illustrated in FIG. 25B may have a function of collecting location information such as GPS.

An image display device such as a liquid crystal display panel or a light-emitting display panel using an organic light-emitting element, an inorganic light-emitting element, or the like is used as the display portion 9201. The mobile phone illustrated in FIG. 25B is compact and lightweight and the battery capacity is limited. For the above reason, a panel which can be driven with low power consumption is preferably used as a display device for the display portion 9201.

Note that although FIG. 25B illustrates the electronic device which is worn on the wrist, this embodiment is not limited thereto as long as an electronic device is portable.

Embodiment 12

In this embodiment, as one mode of a semiconductor device, examples of display devices each including the thin film transistor described in any of Embodiments 1 to 5 will be described with reference to FIGS. 26 to 39. In this embodiment, examples of liquid crystal display devices in each of which a liquid crystal element is used as a display element will be described with reference to FIGS. 26 to 39. The thin film transistor described in any of Embodiments 1 to 5 can be used as TFTs 628 and 629. The TFTs 628 and 629 can be manufactured through a process similar to that described in any of Embodiments 1 to 5 and have excellent electrical characteristics and high reliability. The TFT 628 and the TFT 629 include a channel protective layer 608 and a channel protective layer 611, respectively, and are inverted staggered thin film transistors in each of which a channel formation region is formed in an oxide semiconductor layer.

First, a vertical alignment (VA) liquid crystal display device is described. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. In this embodiment, in particular, a pixel is divided into some regions (subpixels), and molecules are aligned in different directions in their respective regions. This is referred to as multi-domain or multi-domain design. Liquid crystal display devices of the multi-domain design are described below.

Figure 26:
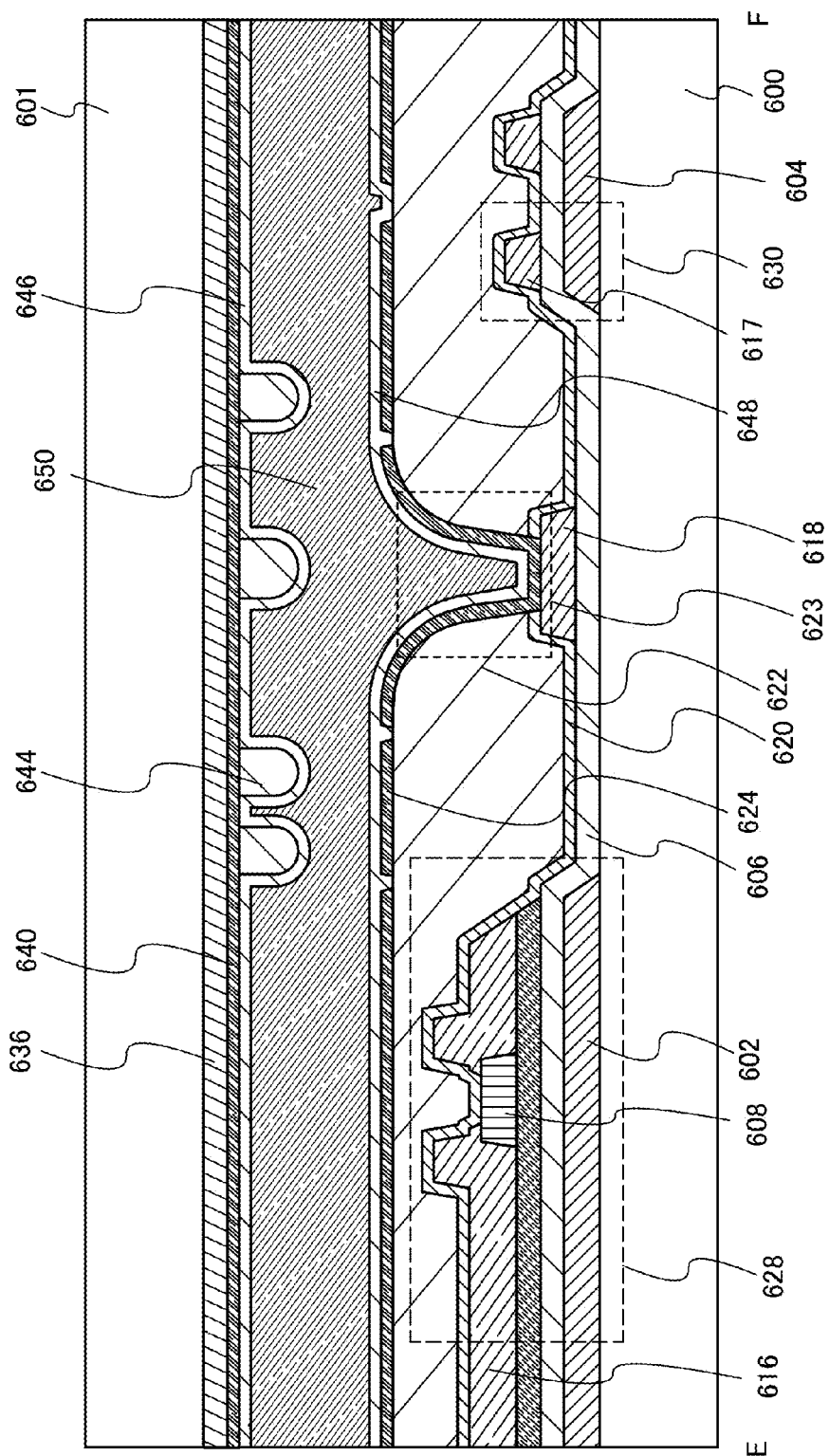
FIG. 26 illustrates a semiconductor device.
Figure 27:
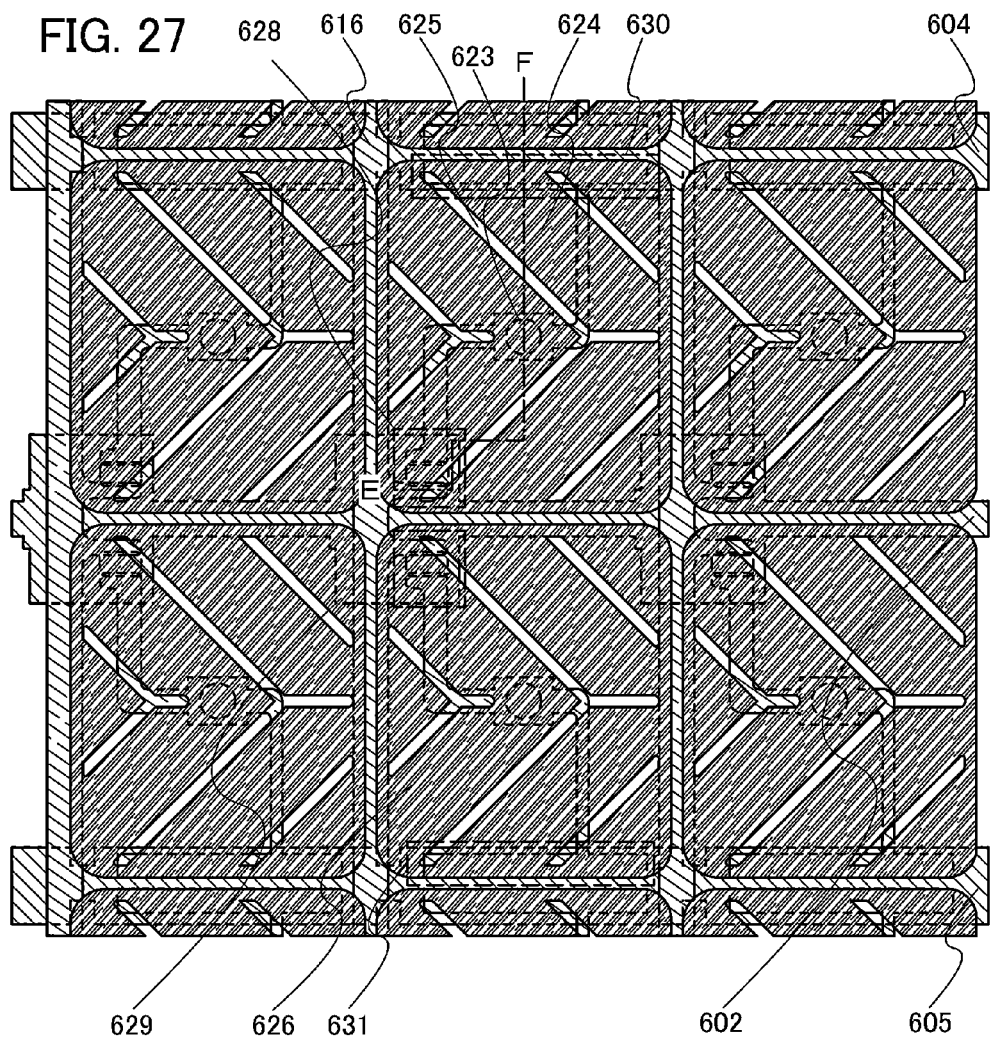
FIG. 27 illustrates the semiconductor device.
Figure 28:
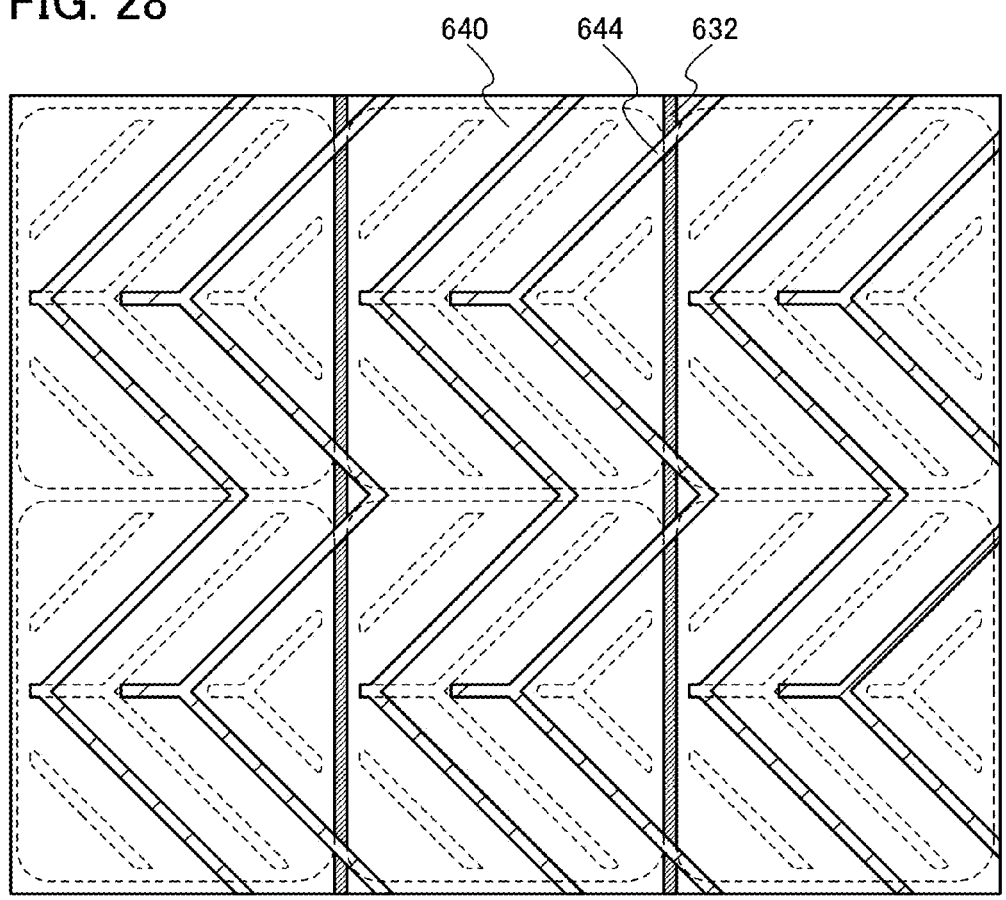
FIG. 28 illustrates the semiconductor device.

FIG. 27 and FIG. 28 illustrate a pixel electrode and a counter electrode, respectively. FIG. 27 is a plan view showing the substrate side where the pixel electrode is formed. FIG. 26 illustrates a cross-sectional structure taken along section line E-F in FIG. 27. FIG. 28 is a plan view showing the substrate side where the counter electrode is formed. Description below is given with reference to those drawings.

In FIG. 26, a substrate 600 over which a TFT 628, a pixel electrode layer 624 connected to the TFT 628, and a storage capacitor portion 630 are formed and a counter substrate 601 for which a counter electrode layer 640 and the like are provided overlap with each other, and liquid crystals are injected between the substrate 600 and the counter substrate 601.

A coloring film 636 and the counter electrode layer 640 are provided for the counter substrate 601, and protrusions 644 are formed on the counter electrode layer 640. An alignment film 648 is formed over the pixel electrode layer 624, and an alignment film 646 is similarly formed on the counter electrode layer 640 and the protrusions 644. A liquid crystal layer 650 is formed between the substrate 600 and the counter substrate 601.

The TFT 628, the pixel electrode layer 624 connected to the TFT 628, and the storage capacitor portion 630 are formed over the substrate 600. The pixel electrode layer 624 is connected to a wiring 618 through a contact hole 623 which penetrates an insulating film 620 for covering the TFT 628, a wiring 616, and the storage capacitor portion 630 and also penetrates an insulating film 622 for covering the insulating film 620. The thin film transistor described in any of Embodiments 1 to 5 can be used as the TFT 628 as appropriate. Further, the storage capacitor portion 630 includes a first capacitor wiring 604 which is formed at the same time as a gate wiring 602 of the TFT 628; a gate insulating film 606; and a second capacitor wiring 617 which is formed at the same time as the wirings 616 and 618.

The pixel electrode layer 624, the liquid crystal layer 650, and the counter electrode layer 640 overlap with each other, whereby a liquid crystal element is formed.

FIG. 27 illustrates a structure on the substrate 600. The pixel electrode layer 624 is formed using the material described in Embodiment 1. The pixel electrode layer 624 is provided with slits 625. The slits 625 are provided for controlling the alignment of the liquid crystals.

A TFT 629, a pixel electrode layer 626 connected to the TFT 629, and a storage capacitor portion 631 which are illustrated in FIG. 27 can be formed in a manner similar to that of the TFT 628, the pixel electrode layer 624, and the storage capacitor portion 630, respectively. Both the TFTs 628 and 629 are connected to the wiring 616. One pixel of this liquid crystal display panel includes the pixel electrode layers 624 and 626. The pixel electrode layers 624 and 626 constitute subpixels.

FIG. 28 illustrates a planar structure of the counter substrate side. The counter electrode layer 640 is formed over a light-blocking film 632. The counter electrode layer 640 is preferably formed using a material similar to that of the pixel electrode layer 624. The protrusions 644 which control the alignment of the liquid crystals are formed on the counter electrode layer 640. Note that in FIG. 28, the pixel electrode layers 624 and 626 formed over the substrate 600 are represented by dashed lines, and the counter electrode layer 640 and the pixel electrode layers 624 and 626 overlap with each other.

Figure 29:
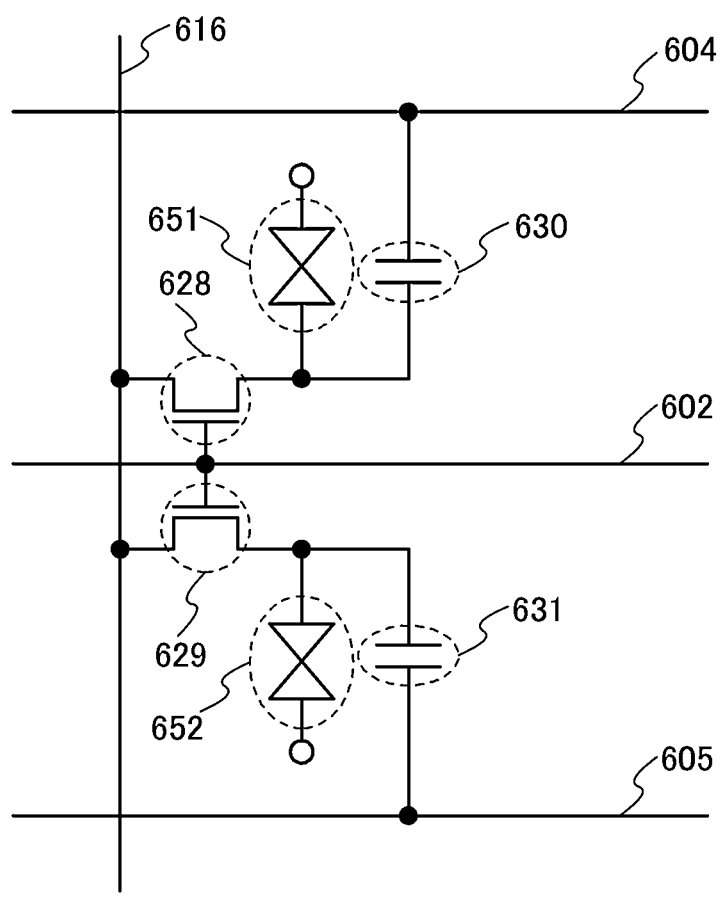
FIG. 29 illustrates the semiconductor device.

FIG. 29 illustrates an equivalent circuit of this pixel structure. Both the TFTs 628 and 629 are connected to the gate wiring 602 and the wiring 616. In that case, when potentials of the capacitor wiring 604 and a capacitor wiring 605 are different from each other, operations of liquid crystal elements 651 and 652 can vary. In other words, the alignment of the liquid crystals is precisely controlled and a viewing angle is increased by separate control of potentials of the capacitor wirings 604 and 605.

When a voltage is applied to the pixel electrode layer 624 provided with the slits 625, a distorted electric field (an oblique electric field) is generated in the vicinity of the slits 625. The protrusions 644 on the counter substrate 601 side and the slits 625 are alternately arranged so that the oblique electric field is effectively generated to control the alignment of the liquid crystals, whereby the direction of the alignment of the liquid crystals varies depending on the location. In other words, a viewing angle of the liquid crystal display panel is increased by multi-domain.

Next, a VA liquid crystal display device, which is different from the above-described device, will be described with reference to FIG. 30 to FIG. 33.

Figure 30:
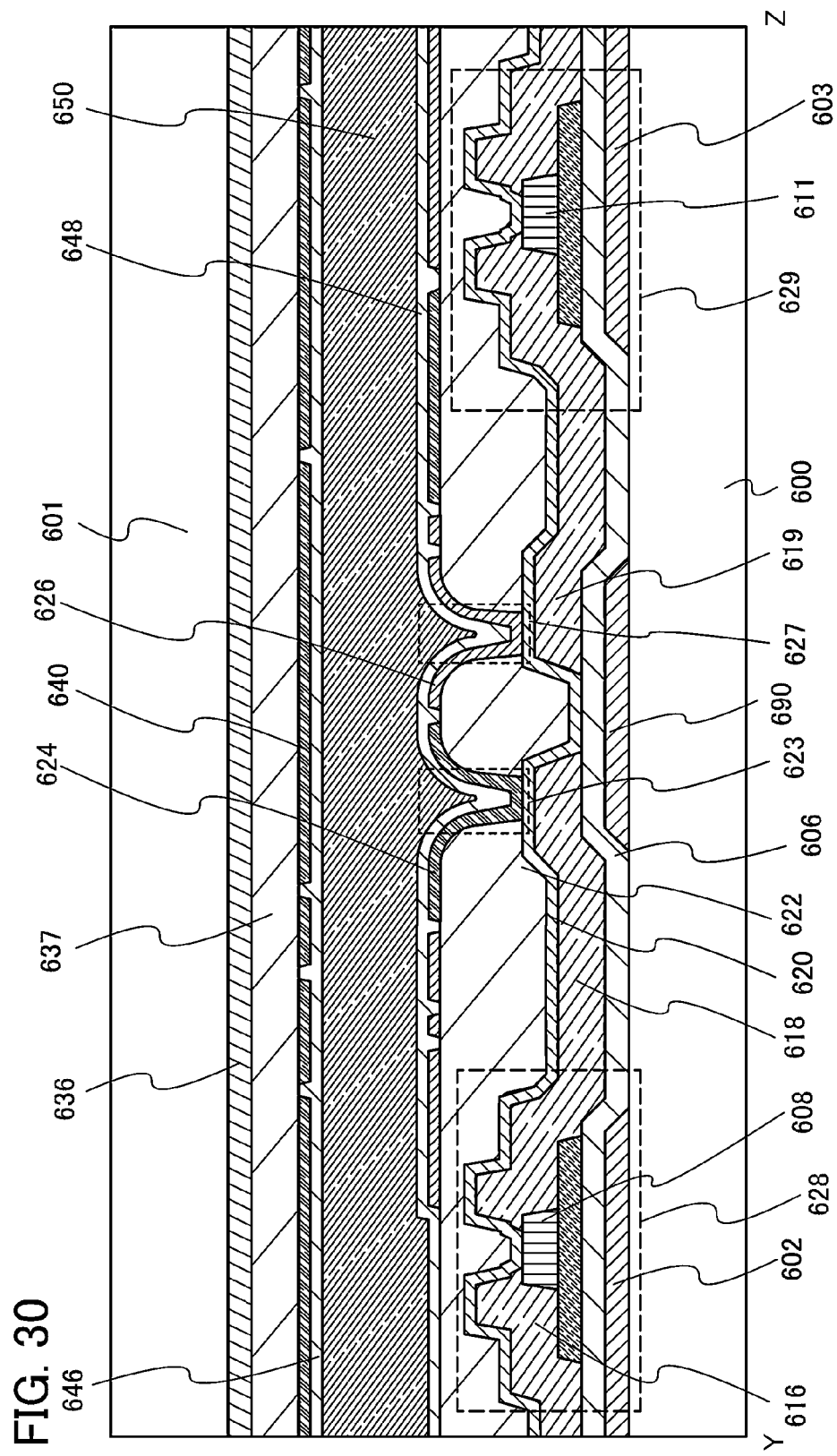
FIG. 30 illustrates a semiconductor device.
Figure 31:
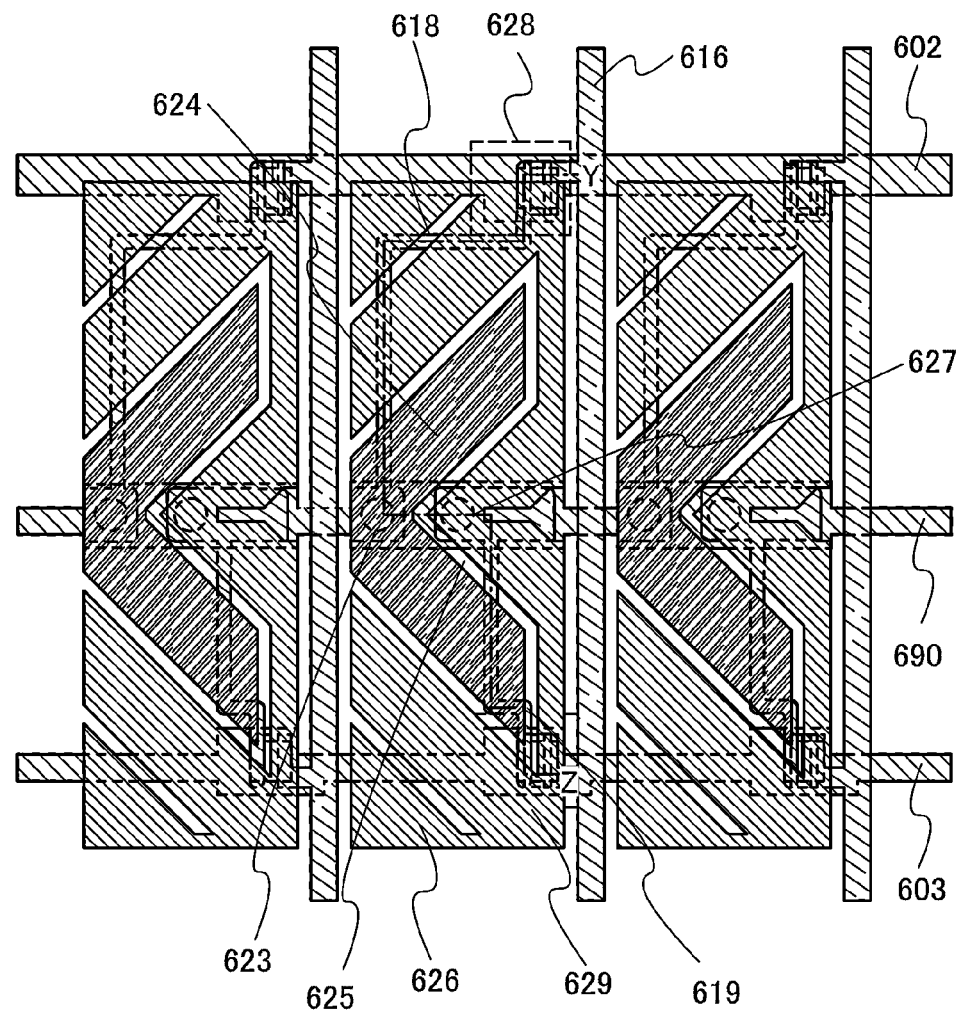
FIG. 31 illustrates the semiconductor device.

FIG. 30 and FIG. 31 illustrate a pixel structure of a VA liquid crystal display panel. FIG. 31 is a plan view of the substrate 600. FIG. 30 illustrates a cross-sectional structure taken along section line Y-Z in FIG. 31.

In this pixel structure, a plurality of pixel electrodes are provided in one pixel, and a TFT is connected to each of the pixel electrodes. The plurality of TFTs are driven by different gate signals. That is, signals applied to individual pixel electrodes in a multi-domain pixel are controlled independently of each other.

A pixel electrode layer 624 is connected to a TFT 628 through a wiring 618 in a contact hole 623 penetrating the insulating film 622. The pixel electrode layer 626 is connected to a TFT 629 through a wiring 619 in a contact hole 627 penetrating the insulating film 622. A gate wiring 602 of the TFT 628 is separated from a gate wiring 603 of the TFT 629 so that different gate signals can be supplied. On the other hand, a wiring 616 serving as a data line is shared by the TFTs 628 and 629. The thin film transistor described in any of Embodiments 1 to 5 can be used as the TFTs 628 and 629 as appropriate. Note that a gate insulating film 606 is formed over the gate wiring 602, the gate wiring 603, and a capacitor wiring 690.

Figure 33:
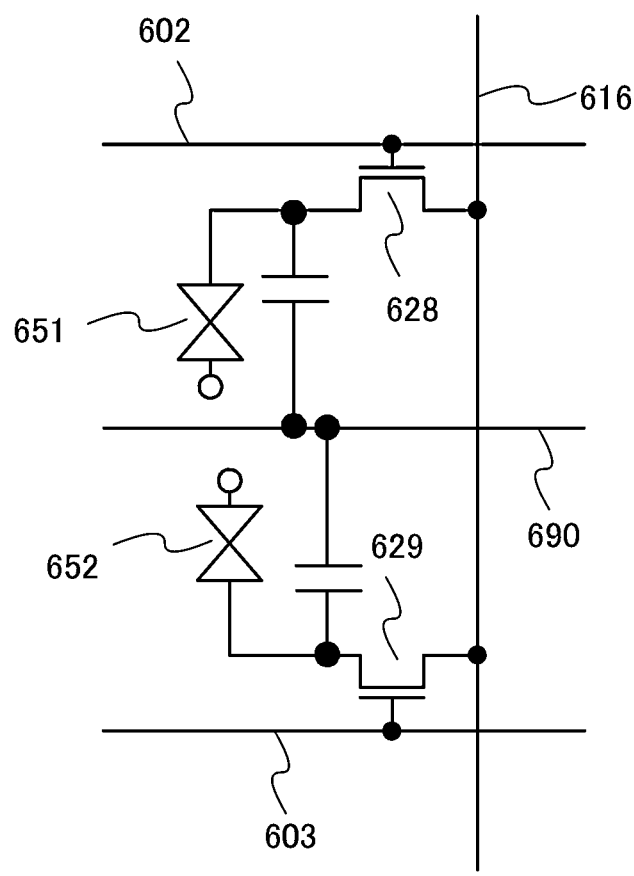
FIG. 33 illustrates the semiconductor device.

The shape of the pixel electrode layer 624 is different from that of the pixel electrode layer 626. The pixel electrode layer 626 is formed so as to surround the external side of the pixel electrode layer 624 which spreads into a V shape. Voltages applied to the pixel electrode layers 624 and 626 are made to be different in TFTs 628 and 629, whereby alignment of liquid crystals is controlled. FIG. 33 illustrates an equivalent circuit of this pixel structure. The TFT 628 is connected to the gate wiring 602, and the TFT 629 is connected to the gate wiring 603. Both the TFTs 628 and 629 are connected to the wiring 616. When different gate signals are supplied to the gate wirings 602 and 603, operations of liquid crystal elements 651 and 652 can vary. That is, the operations of the TFTs 628 and 629 are controlled separately to precisely control the alignment of the liquid crystals in the liquid crystal elements 651 and 652, which leads to a wider viewing angle.

Figure 32:
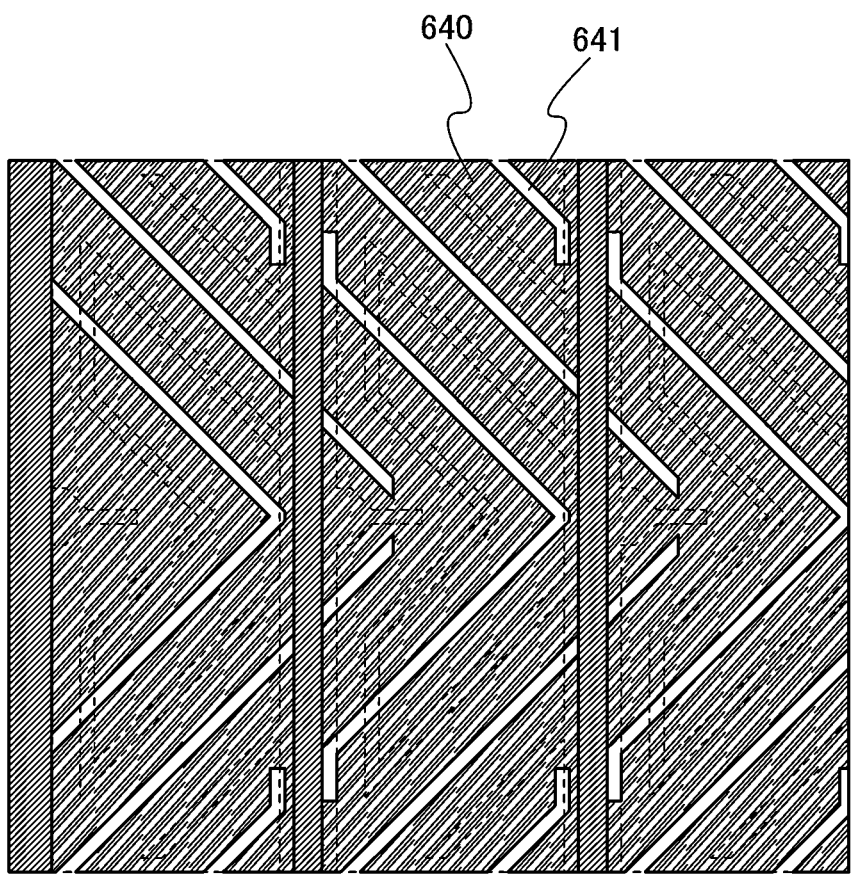
FIG. 32 illustrates the semiconductor device.

A counter substrate 601 is provided with a coloring film 636 and a counter electrode layer 640. A planarization film 637 is formed between the coloring film 636 and the counter electrode layer 640 to prevent alignment disorder of the liquid crystals. FIG. 32 illustrates a planar structure of the counter substrate side. The counter electrode layer 640 is an electrode shared by different pixels and slits 641 are formed. The slits 641 and the slits 625 on the pixel electrode layer 624 and 626 sides are alternately arranged so that an oblique electric field is effectively generated, whereby the alignment of the liquid crystals can be controlled. Accordingly, the alignment of the liquid crystals can vary in different locations, which leads to a wider viewing angle. Note that in FIG. 32, the pixel electrode layers 624 and 626 formed over the substrate 600 are represented by dashed lines and the counter electrode layer 640 and the pixel electrode layers 624 and 626 overlap with each other.

An alignment film 648 is formed over the pixel electrode layer 624 and the pixel electrode layer 626, and the counter electrode layer 640 is similarly provided with an alignment film 646. A liquid crystal layer 650 is formed between the substrate 600 and a counter substrate 601. The pixel electrode layer 624, the liquid crystal layer 650, and the counter electrode layer 640 overlap with each other to form a first liquid crystal element. The pixel electrode layer 626, the liquid crystal layer 650, and the counter electrode layer 640 overlap with each other to form a second liquid crystal element. The pixel structure of the display panel illustrated in FIG. 30 to FIG. 33 is a multi-domain structure in which the first liquid crystal element and the second liquid crystal element are provided in one pixel.

Next, a liquid crystal display device in a horizontal electric field mode is described. In the horizontal electric field mode, an electric field is applied in a horizontal direction with respect to liquid crystal molecules in a cell, whereby liquid crystals are driven to express a gray scale. With this method, a viewing angle can be increased to about 180°. A liquid crystal display device in the horizontal electric field mode is described below.

Figure 34:
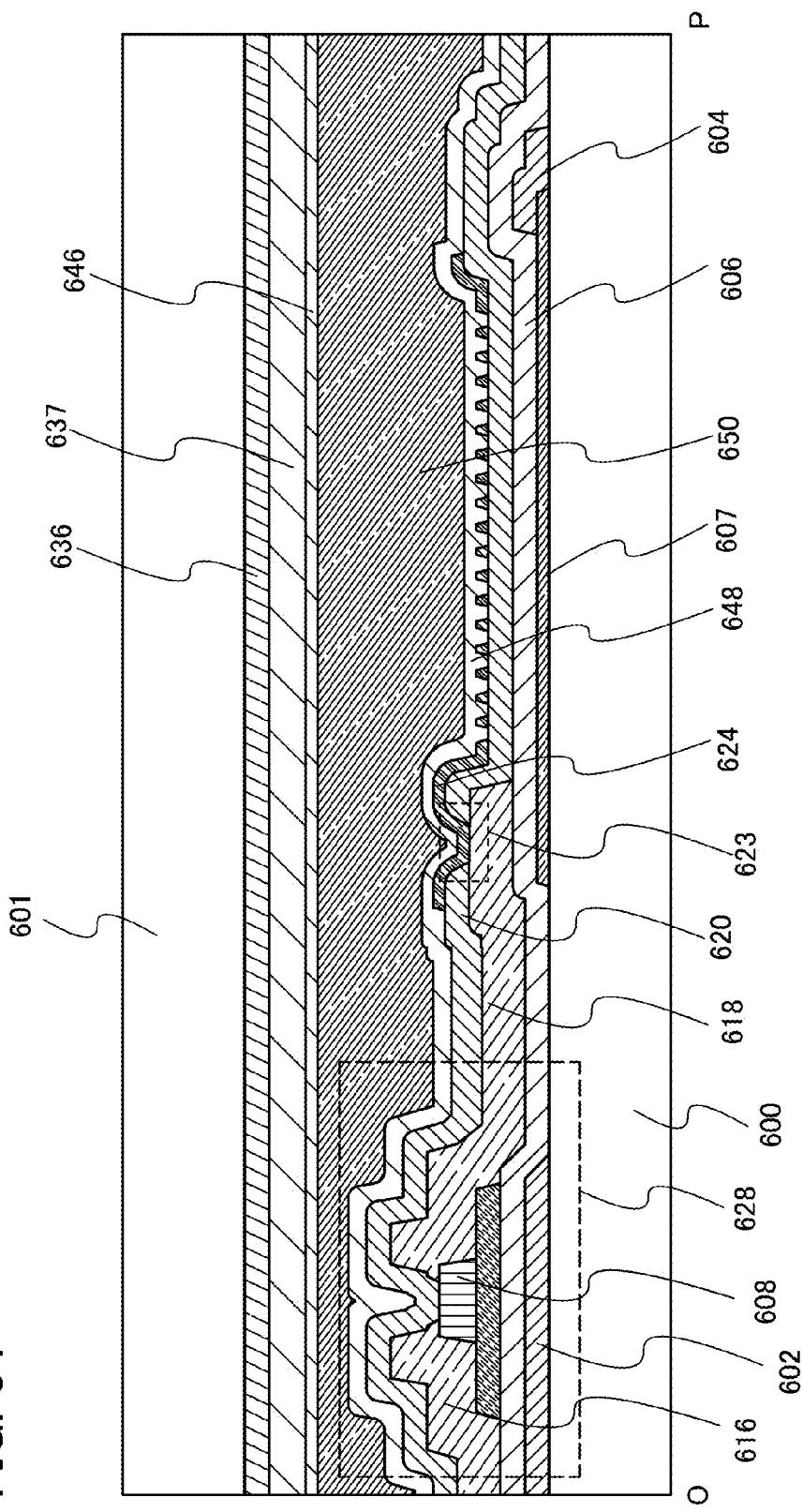
FIG. 34 illustrates a semiconductor device.

In FIG. 34, a substrate 600 over which an electrode layer 607, a TFT 628, and a pixel electrode layer 624 connected to the TFT 628 are formed overlaps with a counter substrate 601, and liquid crystals are injected between the substrate 600 and the counter substrate 601. The counter substrate 601 is provided with a coloring film 636, a planarization film 637, and the like. Note that a counter electrode is not provided on the counter substrate 601 side. In addition, a liquid crystal layer 650 is formed between the substrate 600 and the counter substrate 601 with the alignment films 646 and 648 therebetween.

The electrode layer 607 and a capacitor wiring 604 connected to the electrode layer 607, and the TFT 628 are formed over the substrate 600. The capacitor wiring 604 can be formed at the same time as a gate wiring 602 of the TFT 628. The thin film transistor described in any of Embodiments 1 to 5 can be used as the TFT 628. The electrode layer 607 can be formed using a material similar to that of the pixel electrode layer described in any of Embodiments 1 to 5. The electrode layer 607 is divided almost in a pixel form. Note that a gate insulating film 606 is formed over the electrode layer 607 and the capacitor wiring 604.

Wirings 616 and 618 of the TFT 628 are formed over the gate insulating film 606. The wiring 616 is a data line through which a video signal travels, extends in one direction in a liquid crystal display panel, is connected to a source or drain region of the TFT 628, and functions as one of source and drain electrodes. The wiring 618 functions as the other of the source and drain electrodes and is connected to the pixel electrode layer 624.

An insulating film 620 is formed over the wirings 616 and 618. Over the insulating film 620, the pixel electrode layer 624 is formed to be connected to the wiring 618 through a contact hole formed in the insulating film 620. The pixel electrode layer 624 is formed using a material similar to that of the pixel electrode described in Embodiment 1.

In such a manner, the TFT 628 and the pixel electrode layer 624 connected to the TFT 628 are formed over the substrate 600. Note that a storage capacitor is formed between the electrode layer 607 and the pixel electrode layer 624.

Figure 35:
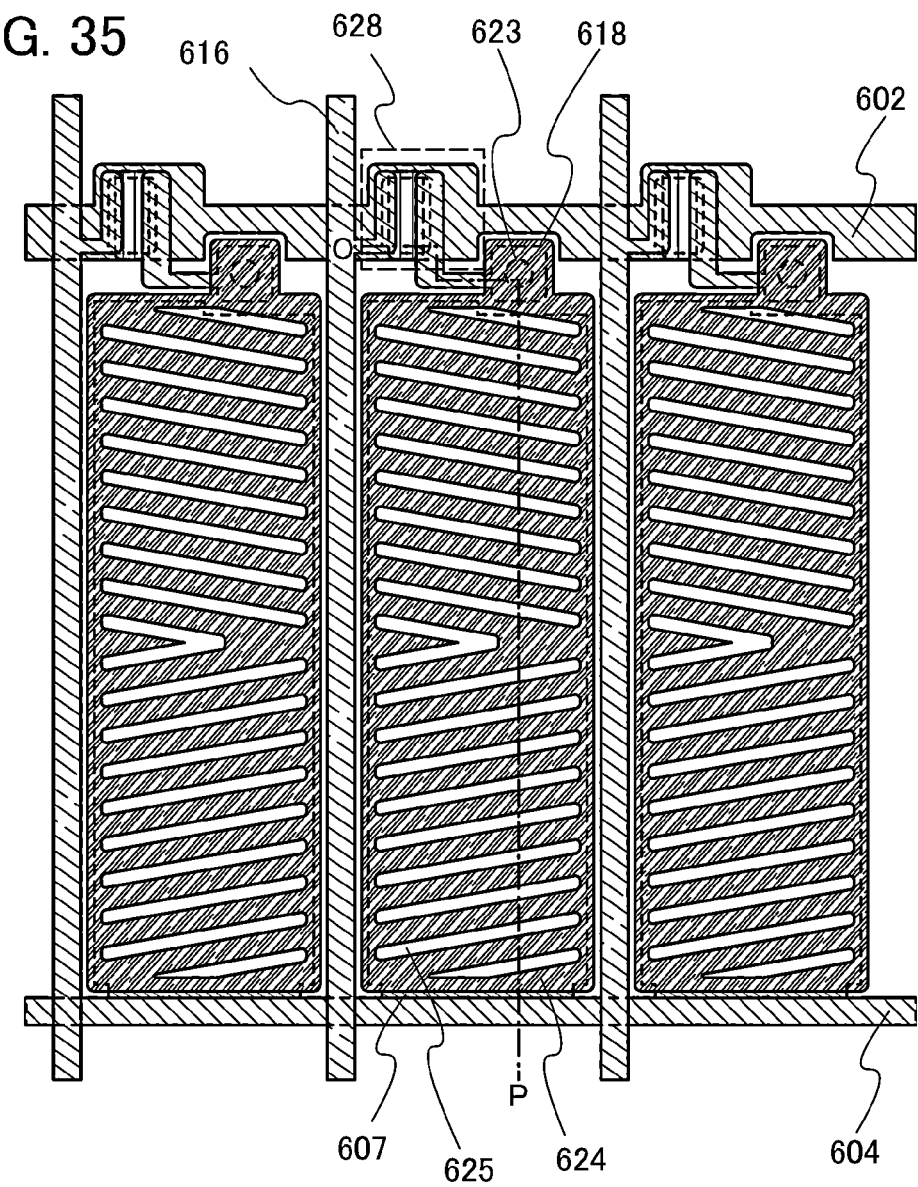
FIG. 35 illustrates the semiconductor device.

FIG. 35 is a plan view illustrating a structure of the pixel electrode. FIG. 35 illustrates a cross-sectional structure taken along section line O-P in FIG. 34. The pixel electrode layer 624 is provided with slits 625. The slits 625 are provided for controlling alignment of liquid crystals. In that case, an electric field is generated between the electrode layer 607 and the second pixel electrode layer 624. The thickness of the gate insulating film 606 formed between the electrode layer 607 and the pixel electrode layer 624 is 50 nm to 200 nm, which is much smaller than the thickness of the liquid crystal layer which is 2 μm to 10 μm. Thus, an electric field is generated substantially in parallel (in a horizontal direction) to the substrate 600. The alignment of the liquid crystals is controlled with this electric field. Liquid crystal molecules are horizontally rotated with the use of the electric field in the direction substantially parallel to the substrate. In that case, the liquid crystal molecules are horizontally aligned in any state, and thus the contrast or the like is less influenced by the viewing angle, which leads to a wider viewing angle. In addition, since both the electrode layer 607 and the pixel electrode layer 624 are light-transmitting electrodes, an aperture ratio can be improved.

Next, a different example of the liquid crystal display device in the horizontal electric field mode is described.

Figure 36:
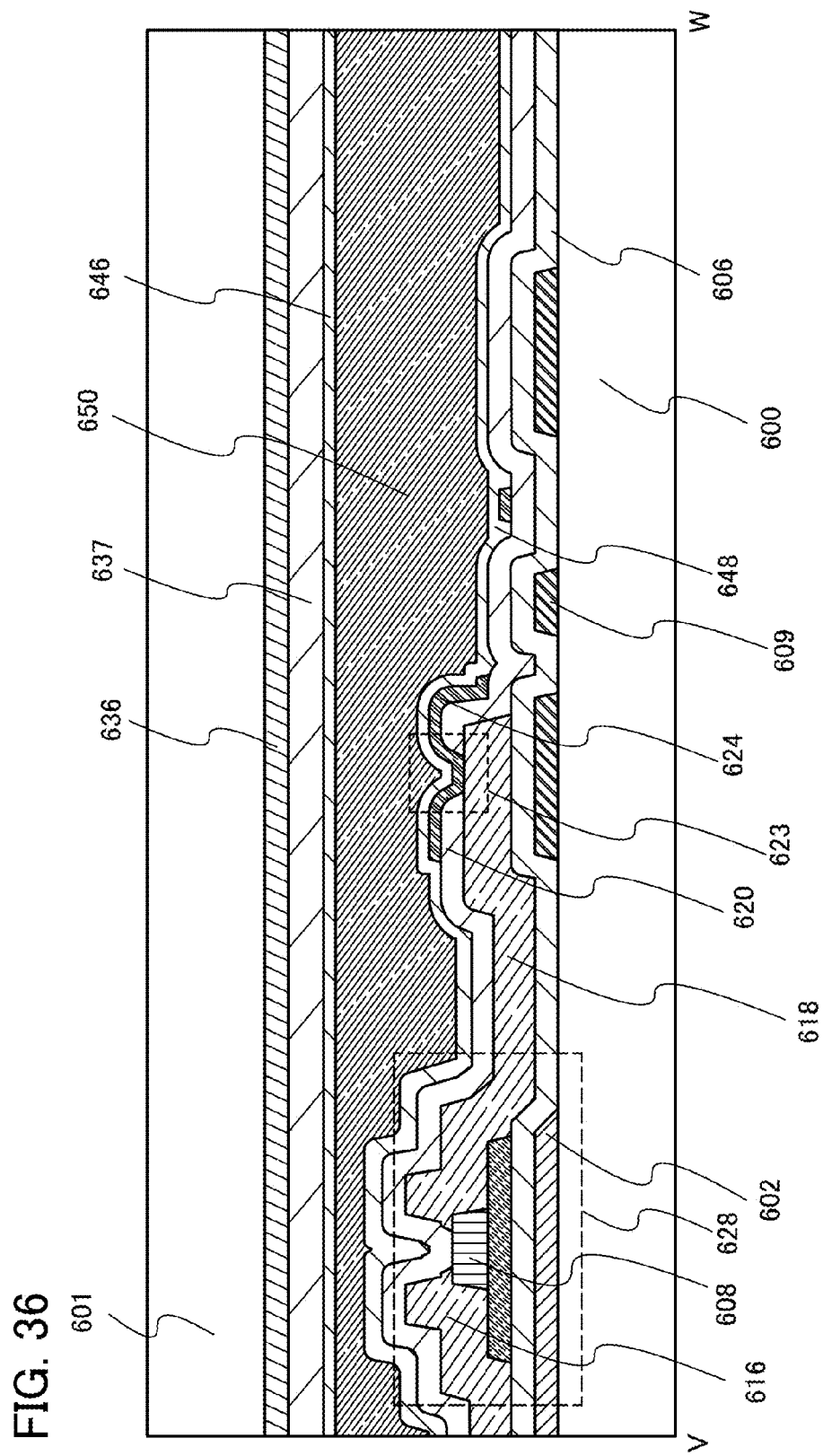
FIG. 36 illustrates a semiconductor device.
Figure 37:
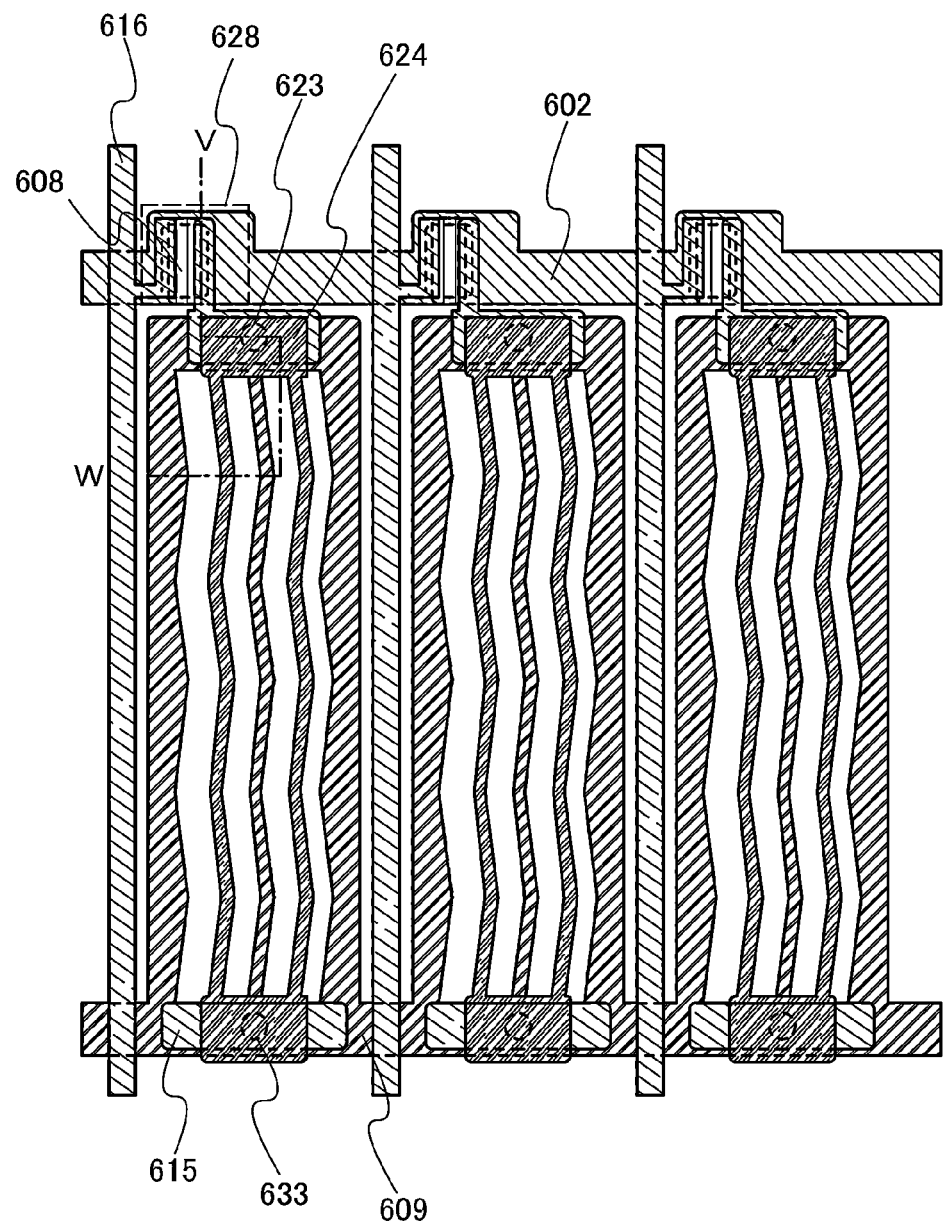
FIG. 37 illustrates the semiconductor device.

FIG. 36 and FIG. 37 illustrate a pixel structure of a liquid crystal display device in an IPS mode. FIG. 37 is a plan view. FIG. 36 illustrates a cross-sectional structure taken along section line V-W in FIG. 37. Description below is given with reference to both the drawings.

In FIG. 36, a substrate 600 over which a TFT 628 and a pixel electrode layer 624 connected to the TFT 628 are formed overlaps with a counter substrate 601, and liquid crystals are injected between the substrate 600 and the counter substrate 601. The counter substrate 601 is provided with a coloring film 636, a planarization film 637, and the like. Note that a counter electrode is not provided on the counter substrate 601 side. A liquid crystal layer 650 is formed between the substrate 600 and the counter substrate 601 with alignment films 646 and 648 therebetween.

A common potential line 609 and the TFT 628 are formed over the substrate 600. The common potential line 609 can be formed at the same time as a gate wiring 602 of the TFT 628. The thin film transistor described in any of Embodiments 1 to 5 can be used as the TFT 628.

Wirings 616 and 618 of the TFT 628 are formed over the gate insulating film 606. The wiring 616 is a data line through which a video signal travels, extends in one direction in a liquid crystal display panel, is connected to a source or drain region of the TFT 628, and functions as one of source and drain electrodes. The wiring 618 functions as the other of the source and drain electrodes and is connected to the pixel electrode layer 624.

An insulating film 620 is formed over the wirings 616 and 618. Over the insulating film 620, the pixel electrode layer 624 is formed to be connected to the wiring 618 through a contact hole 623 formed in the insulating film 620. The pixel electrode layer 624 is formed using a material similar to that of the pixel electrode described in any of Embodiments 1 to 5. Note that, as illustrated in FIG. 37, the pixel electrode layer 624 is formed such that the pixel electrode layer 624 and a comb-like electrode that is formed at the same time as the common potential line 609 can generate a horizontal electric field. Further, the pixel electrode layer 624 is formed so that comb-teeth portions of the pixel electrode layer 624 and those of the comb-like electrode that is formed at the same time as the common potential line 609 are alternately arranged.

The alignment of the liquid crystals is controlled by an electric field generated between a potential applied to the pixel electrode layer 624 and a potential of the common potential line 609. Liquid crystal molecules are horizontally rotated with the use of the electric field in the direction substantially parallel to the substrate. In that case, the liquid crystal molecules are horizontally aligned in any state, and thus the contrast or the like is less influenced by the viewing angle, which leads to a wider viewing angle.

In such a manner, the TFT 628 and the pixel electrode layer 624 connected to the TFT 628 are formed over the substrate 600. A storage capacitor is formed by providing the gate insulating film 606 between the common potential line 609 and a capacitor electrode 615, and formed with the gate insulating film 606, the common potential line 609, the capacitor electrode 615. The capacitor electrode 615 and the pixel electrode layer 624 are connected to each other through a contact hole 633.

Next, a mode of a liquid crystal display device in a TN mode is described.

Figure 38:
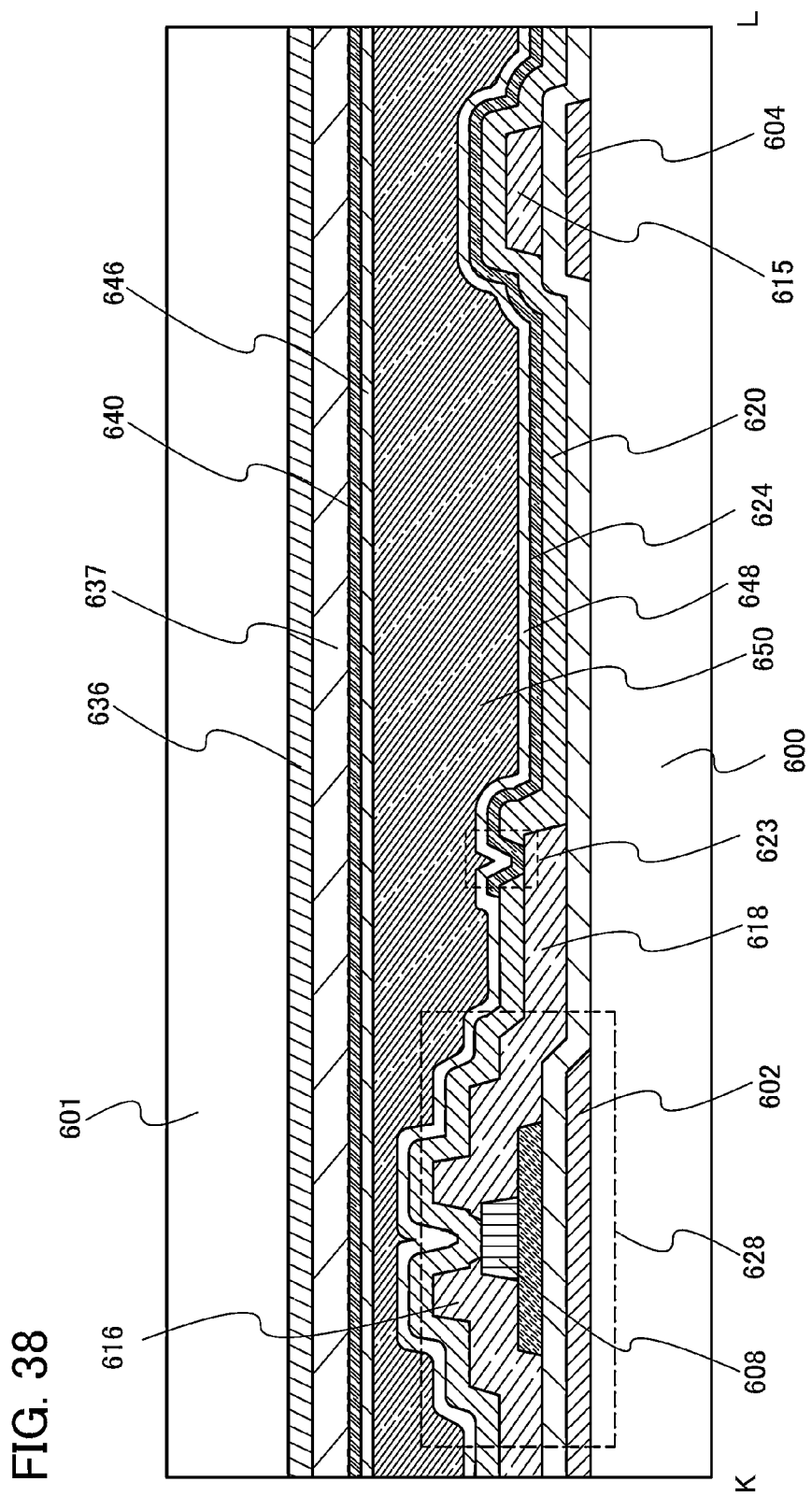
FIG. 38 illustrates a semiconductor device.
Figure 39:
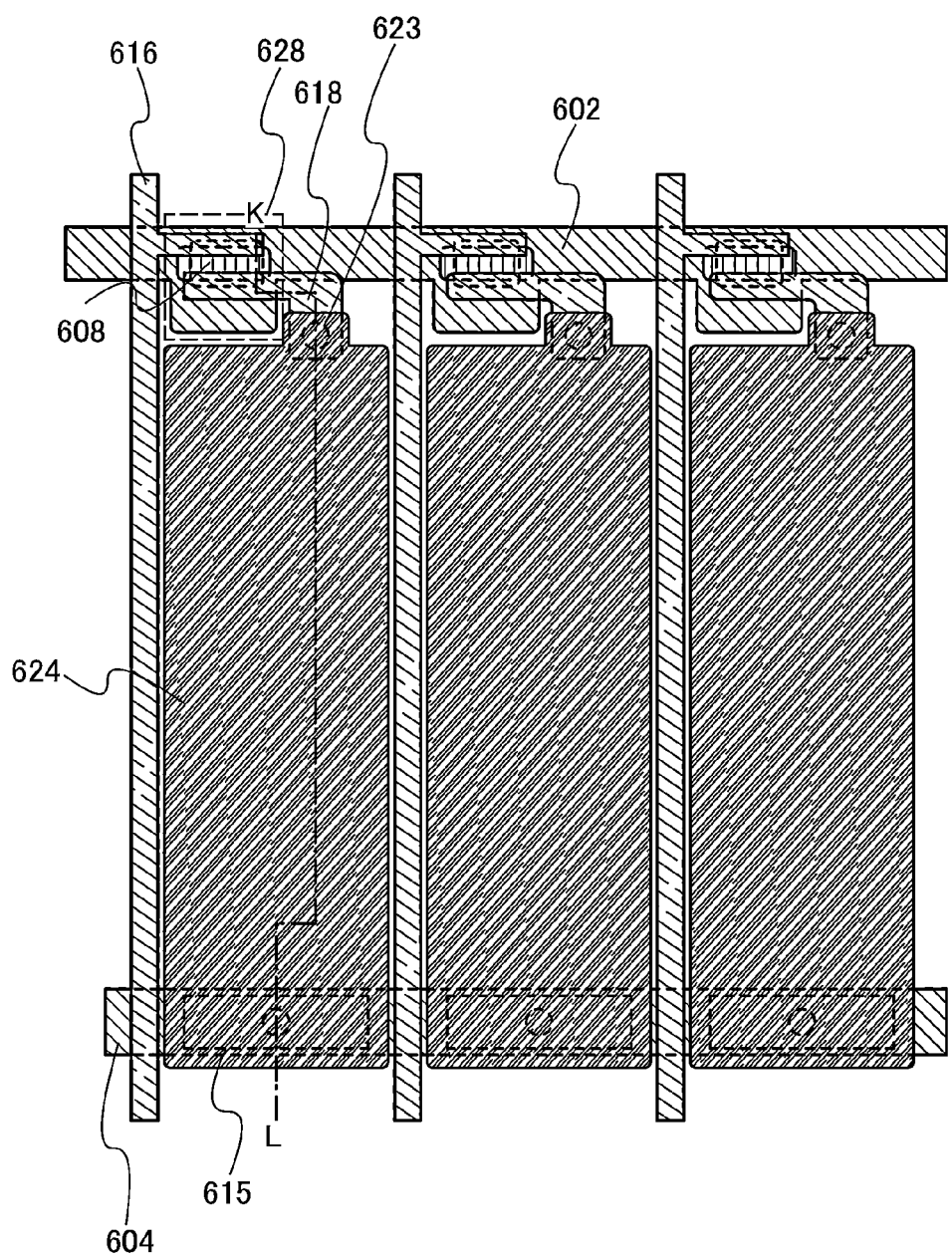
FIG. 39 illustrates the semiconductor device.

FIG. 38 and FIG. 39 illustrate a pixel structure of a liquid crystal display device in a TN mode. FIG. 39 is a plan view. FIG. 38 illustrates a cross-sectional structure taken along section line K-L in FIG. 39. Description below is given with reference to both the drawings.

A pixel electrode layer 624 is connected to a TFT 628 through a wiring 618 and a contact hole 623 formed in an insulating film 620. A wiring 616 functioning as a data line is connected to the TFT 628. The TFT described in any of Embodiments 1 to 5 can be used as the TFT 628.

The pixel electrode layer 624 is formed using the pixel electrode described in any of Embodiments 1 to 5. A capacitor wiring 604 can be formed at the same time as a gate wiring 602 of the TFT 628. The gate insulating film 606 is formed over the gate wiring 602 and the capacitor wiring 604. A storage capacitor is formed with the gate insulating film 606, the capacitor wiring 604, and a capacitor electrode 615.

A counter substrate 601 is provided with a coloring film 636 and a counter electrode layer 640. A planarization film 637 is formed between the coloring film 636 and the counter electrode layer 640 to prevent alignment disorder of liquid crystals. A liquid crystal layer 650 is formed between the pixel electrode layer 624 and the counter electrode layer 640 with the alignment films 646 and 648 therebetween.

The pixel electrode layer 624, the liquid crystal layer 650, and the counter electrode layer 640 overlap with each other, whereby a liquid crystal element is formed.

The coloring film 636 may be formed on the substrate 600 side. A polarizing plate is attached to a surface of the substrate 600, which is opposite to the surface provided with the thin film transistor, and a polarizing plate is attached to a surface of the counter substrate 601, which is opposite to the surface provided with the counter electrode layer 640.

Through the above-described process, liquid crystal display devices can be manufactured as display devices. The liquid crystal display devices of this embodiment each have a high aperture ratio.

Embodiment 13

Figure 40:
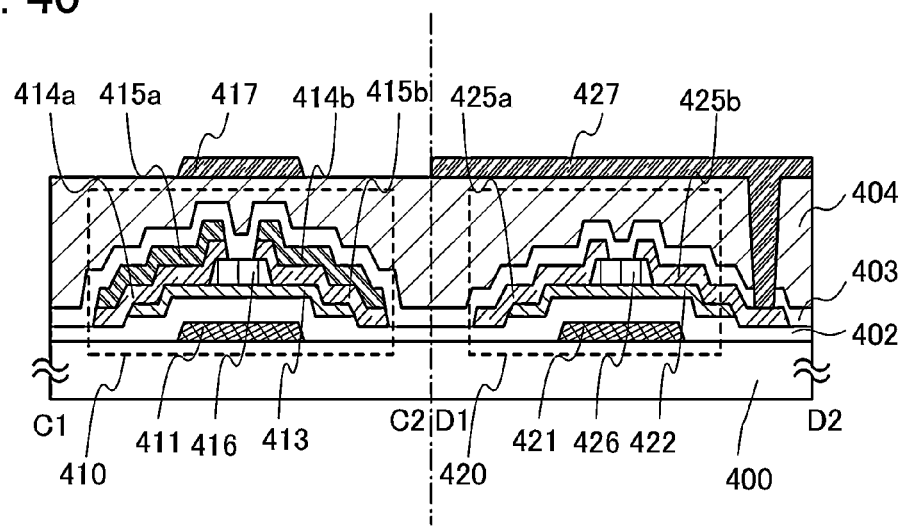
FIG. 40 illustrates a semiconductor device.

In this embodiment, FIG. 40 illustrates an example in which an oxide semiconductor layer is surrounded by nitride insulating films when seen in cross section. FIG. 40 is the same as FIG. 1A except the top surface shape and the positions of end portions of an oxide insulating layer 416, and the structure of the gate insulating layer. Thus, specific description of the same portions is omitted.

A thin film transistor 410 provided in a driver circuit is a channel-stop-type thin film transistor and includes, over a substrate 400 having an insulating surface, a gate electrode layer 411, a gate insulating layer 402 formed using a nitride insulating film, an oxide semiconductor layer including at least an oxide semiconductor layer 413, a first low-resistant n-type region 414a, and a second low-resistant n-type region 414b, a source electrode layer 415a, and a drain electrode layer 415b. In addition, the oxide insulating layer 416 which functions as a channel protective layer is provided so as to be in contact with the oxide semiconductor layer 413.

A thin film transistor 420 provided for a pixel is a channel-stop-type thin film transistor like the thin film transistor 410, and includes a gate electrode layer 421, a gate insulating layer 402 formed using a nitride insulating film, an oxide semiconductor layer 422, a source electrode layer 425a and a drain electrode layer 425b. In addition, an oxide insulating layer 426 which functions as a channel protective layer is provided so as to be in contact with a channel formation region of the oxide semiconductor layer 422.

The gate insulating layer 402, which is on an outer side than the thin film transistor 410 and the thin film transistor 420, is processed so as to be exposed when the oxide insulating layer 416 and the oxide insulating layer 426 are formed through a photolithography step.

Further, a protective insulating layer 403 formed using a nitride insulating film is formed so as to cover a top surface and side surfaces of the thin film transistor 410 and the thin film transistor 420.

The first low-resistant n-type region 414a is formed in contact with an undersurface of the source electrode layer 415a in a self-aligned manner. Further, the second low-resistant n-type region 414b is formed in contact with an undersurface of the drain electrode layer 405b in a self-aligned manner. The channel formation region of the oxide semiconductor layer 413 is in contact with the oxide insulating layer 416, has a small thickness, and is a region (i-type region) having higher resistance than the first low-resistant n-type region 414a and the second low-resistant n-type region 414b.

The gate insulating layer 402 is formed, using a nitride insulating film, in contact with undersurfaces of the channel formation region of the oxide semiconductor layer 413, the first low-resistant n-type region 414a, and the second low-resistant n-type region 414b.

For the protective insulating layer 403 formed using a nitride insulating film, an inorganic insulating film which does not contain impurities such as moisture, a hydrogen ion, and OH⁻ and blocks entry of them from the outside is used: for example, a silicon nitride film, a silicon oxynitride film, an aluminum nitride film, or an aluminum oxynitride film obtained with a sputtering method is used.

In this embodiment, as the protective insulating layer 403 formed using a nitride insulating film, a silicon nitride film is formed to a thickness of 100 nm with an RF sputtering method so as to cover a top surface and side surfaces of the thin film transistor 410 and the thin film transistor 420. In addition, the protective insulating layer 403 is in contact with the gate insulating layer 402 formed using a nitride insulating film outside the thin film transistor 410 and the thin film transistor 420.

With the structure illustrated in FIG. 40, entry of moisture from the outside can be prevented in a manufacturing process after formation of the protective insulating layer 403 formed using a nitride insulating film. Further, even after a device is completed as a semiconductor device such as a liquid crystal display device, entry of moisture from the outside can be prevented in the long term; therefore, long-term reliability of the device can be improved.

In this embodiment, the structure in which one thin film transistor is covered with a nitride insulating film; however, one embodiment of the present invention is not limited thereto. Alternatively, a plurality of thin film transistors may be covered with a nitride insulating film or a plurality of thin film transistors in a pixel portion may be collectively covered with a nitride insulating film. A region where the protective insulating layer 403 and the gate insulating layer 402 are in contact with each other may be formed so that at least the pixel portion of the active matrix substrate is surrounded.

This embodiment can be freely combined with any of the other embodiments.

This application is based on Japanese Patent Application serial no. 2009-169601 filed with Japan Patent Office on Jul. 18, 2009, the entire contents of which are hereby incorporated by reference.

EXPLANATION OF REFERENCE

10: first pulse output circuit, 11: wiring, 12: wiring, 13: wiring, 14: wiring, 15: wiring, 21: input terminal, 22: input terminal, 23: input terminal, 24: input terminal, 25: input terminal, 26: output terminal, 27: output terminal, 31: transistor, 32: transistor, 33: transistor, 34: transistor: 35: transistor, 36: transistor, 37: transistor, 38: transistor, 39: transistor, 40: transistor, 41: transistor, 42: transistor, 43: transistor, 51: power supply line, 52: power supply line, 53: power supply line, 61: period, 62: period, 100: substrate, 102: gate insulating film, 102b: gate insulating film, 107: protective insulating film, 107a: protective insulating film, 108: protective insulating film, 111: bottom-gate electrode, 113: oxide semiconductor layer, 113a: oxide semiconductor layer, 113b: oxide semiconductor layer, 113c: oxide semiconductor layer, 113d: oxide semiconductor region, 114a: conductive layer, 114b: conductive layer, 115a: conductive layer, 115b: conductive layer, 116: channel protective layer, 125: contact hole, 128: pixel electrode, 129: back-gate electrode, 134: resist mask, 135: resist mask, 141: thin film transistor, 142: thin film transistor, 143: thin film transistor, 144: thin film transistor, 145: thin film transistor, 146: thin film transistor, 200: substrate, 202*a*: gate insulating layer, 202*b*: gate insulating layer, 203: protective insulating layer, 204: protective insulating layer, 210: thin film transistor, 211: bottom-gate electrode, 213: oxide semiconductor layer, 213*a*: oxide semiconductor layer, 213*b*: oxide semiconductor layer, 213*c*: oxide semiconductor layer, 213*d*: oxide semiconductor region, 214*a*: source electrode or drain electrode, 214*b*: source electrode or drain electrode, 215*a*: conductive layer, 215*b*: conductive layer, 216: channel protective layer, 217: conductive layer, 220: thin film transistor, 224: contact hole, 227: pixel electrode layer, 230: capacitor wiring layer, 231: capacitor electrode, 232: gate wiring layer, 234: source wiring, 235: terminal electrode, 236: metal wiring layer, 237: metal wiring layer, 238: gate wiring layer, 240: thin film transistor, 241: metal wiring layer, 242: metal wiring layer, 250: capacitor wiring layer, 251: oxide semiconductor layer, 400: substrate, 402: gate insulating layer, 403: protective insulating layer, 405*b*: drain electrode layer, 410: thin film transistor, 411: gate electrode layer, 413: oxide semiconductor layer, 414*a*: low-resistant n-type region, 414*b*: low-resistant n-type region, 415*a*: source electrode layer, 415*b*: drain electrode layer, 416: oxide insulating layer, 420: thin film transistor, 421: gate electrode layer, 422: oxide semiconductor layer, 425*a*: source electrode layer, 425*b*: drain electrode layer, 426: oxide insulating layer, 580: substrate, 581: thin film transistor, 583: insulating film, 585: insulating layer, 587: electrode layer, 588: electrode layer, 589: spherical particle, 590*a*: black region, 590*b*: white region, 594: cavity, 595: filler, 596: substrate, 600: substrate, 601: counter substrate, 602: gate wiring, 603: gate wiring, 604: capacitor wiring, 605: capacitor wiring, 606: gate insulating film, 607: electrode layer, 608: channel protective layer, 609: common potential line, 611: channel protective layer, 615: capacitor electrode, 616: wiring, 617: capacitor wiring, 618: wiring, 619: wiring, 620: insulating film, 622: insulating film, 623: contact hole, 624: pixel electrode layer, 625: slit, 626: pixel electrode layer, 627: contact hole, 628: TFT, 629: TFT, 630: storage capacitor portion, 631: storage capacitor portion, 632: light-blocking film, 633: contact hole, 636: coloring film, 637: planarization film, 640: counter electrode layer, 641: slit, 644: protrusion, 646: alignment film, 648: alignment film, 650: liquid crystal layer, 651: liquid crystal element, 652: liquid crystal element, 690: capacitor wiring, 2600: TFT substrate, 2601: counter substrate, 2602: sealant, 2603: pixel portion, 2604: display element, 2605: coloring layer, 2606: polarizing plate, 2607: polarizing plate, 2608: wiring circuit portion, 2609: flexible wiring board, 2610: cold cathode tube, 2611: reflective plate, 2612: circuit board, 2613: diffusion plate, 2700: e-book reader, 2701: housing, 2703: housing, 2705: display portion, 2707: display portion, 2711: hinge, 2721: power switch, 2723: operation key, 2725: speaker, 4001: substrate, 4002: pixel portion, 4003: signal line driver circuit, 4004: scan line driver circuit, 4005: sealant, 4006: substrate, 4008: liquid crystal layer, 4010: thin film transistor, 4011. thin film transistor, 4013: liquid crystal element, 4015: connection terminal electrode, 4016: terminal electrode, 4018: FPC, 4019: anisotropic conductive film, 4020: insulating layer, 4021: insulating layer, 4030: pixel electrode layer, 4031: counter electrode layer, 4032: insulating layer, 4035: spacer, 4040: back-gate electrode, 4041: insulating layer, 4042: insulating layer, 4501: substrate, 4502: pixel portion, 4503*a*: signal line driver circuit, 4504*a*: scan line driver circuit, 4505: sealant, 4506: substrate, 4507: filler, 4509: thin film transistor, 4510: thin film transistor, 4511: light-emitting element, 4512: electroluminescent layer, 4513: electrode layer, 4515: connection terminal electrode, 4516: terminal electrode, 4517: electrode layer, 4518*a*: FPC, 4518*b*: FPC, 4519: anisotropic conductive film, 4520: bank, 4540: back-gate electrode, 4541: insulating layer, 4542: insulating layer, 4543: insulating layer, 4544: insulating layer, 5300: substrate, 5301: pixel portion, 5302: scan line driver circuit, 5303: scan line driver circuit, 5304: signal line driver circuit, 5305: timing control circuit, 5601: shift register, 5602: switching circuit, 5603: thin film transistor, 5604: wiring, 5605: wiring, 6400: pixel, 6401: switching transistor, 6402: driver transistor, 6403: capacitor, 6404: light-emitting element, 6405: signal line, 6406: scan line, 6407: power supply line, 6408: common electrode, 7001: TFT, 7002: light-emitting element, 7003: cathode, 7004: light-emitting layer, 7005: anode, 7008: cathode, 7009: bank, 7011: driver TFT, 7012: light-emitting element, 7013: cathode, 7014: light-emitting layer, 7015: anode, 7016: light-blocking film, 7017: conductive film, 7018: conductive film, 7019: bank, 7021: driver TFT, 7022: light-emitting element, 7023: cathode, 7024: light-emitting layer, 7025: anode, 7027: conductive film, 7028: conductive film, 7029: bank, 9201: display portion, 9202: display button, 9203: operation switch, 9204: band portion, 9205: adjusting portion, 9206: camera portion, 9207: speaker, 9208: microphone, 9301: top housing, 9302: bottom housing, 9303: display portion, 9304: keyboard, 9305: external connection port, 9306: pointing device, 9307: display portion, 9600: television set, 9601: housing, 9603: display portion, 9605: stand, 9607: display portion, 9609: operation key, 9610: remote controller, 9700: digital photo flame, 9701: housing, 9703: display portion, 9881: housing, 9882: display portion, 9883: display portion, 9884: speaker portion, 9885: input means (operation key), 9886: recording medium insertion portion, 9887: connection terminal, 9888: sensor, 9889: microphone, 9890: LED lamp, 9891: housing, 9893: joint portion, 9900: slot machine, 9901: housing, 9903: display portion.

The invention claimed is:

1. A semiconductor device comprising:
   a pixel portion including a first transistor and a pixel electrode over a substrate; and
   a driver circuit including a second transistor over the substrate,
   wherein the first transistor comprises:
      a first gate electrode over the substrate;
      a gate insulating layer over the first gate electrode;
      a first oxide semiconductor layer over the gate insulating layer;
      a first channel protective layer over and in contact with a part of the first oxide semiconductor layer; and
      a first source electrode and a first drain electrode over the first channel protective layer and the first oxide semiconductor layer,
   wherein the second transistor comprises:
      a second gate electrode over the substrate;
      the gate insulating layer over the second gate electrode;
      a second oxide semiconductor layer over the gate insulating layer;
      a second channel protective layer over and in contact with a part of the second oxide semiconductor layer;
      a second source electrode and a second drain electrode over the second channel protective layer and the second oxide semiconductor layer; and
      a third gate electrode over the second channel protective layer,
   wherein the third gate electrode overlaps with the second gate electrode,
   wherein the pixel electrode is electrically connected to one of the first source electrode and the first drain electrode, and wherein the third gate electrode and the pixel electrode are provided on a same surface.

2. The semiconductor device according to claim 1, wherein the first channel protective layer and the second channel protective layer comprise the same insulating material which has a light-transmitting property.

3. The semiconductor device according to claim 1, wherein the second source electrode and the second drain electrode are a film formed using an element selected from Al, Cr, Cu, Ta, Ti, Mo, and W, or a stacked film including the film and an alloy film thereof.

4. The semiconductor device according to claim 1, wherein the first source electrode, the first drain electrode, and the pixel electrode comprise any of indium oxide, an alloy of indium oxide and tin oxide, an alloy of indium oxide and zinc oxide, and zinc oxide.

5. The semiconductor device according to claim 1, further comprises a capacitor portion over the substrate,
wherein the capacitor portion comprises:
a capacitor wiring; and
a capacitor electrode overlapping with the capacitor wiring, and
wherein the capacitor wiring and the capacitor electrode have a light-transmitting property.

6. The semiconductor device according to claim 1,
wherein the first channel protective layer and the second channel protective layer comprise an oxide insulating film.

7. The semiconductor device according to claim 1,
wherein a first portion of the first oxide semiconductor layer is in contact with the first channel protective layer,
wherein a second portion of the first oxide semiconductor layer is not in contact with the first channel protective layer, and
wherein a carrier concentration of the second portion is larger than a carrier concentration of the first portion.

8. The semiconductor device according to claim 1,
wherein a first portion of the first oxide semiconductor layer is in contact with the first channel protective layer,
wherein a second portion of the first oxide semiconductor layer is not in contact with the first channel protective layer, and
wherein a carrier concentration of the first portion is less than $1 \times 10^{17}/cm^3$, and
wherein a carrier concentration of the second portion is equal to or more than $1 \times 10^{17}/cm^3$.

9. The semiconductor device according to claim 1, further comprising:
a first protective insulating layer over and in contact with the first channel protective layer and the second channel protective layer; and
a second protective insulating layer over the first protective insulating layer,
wherein the third gate electrode is formed over and in contact with the first protective insulating layer.

10. The semiconductor device according to claim 1, further comprising:
a first protective insulating layer over and in contact with the first channel protective layer and the second channel protective layer; and
a second protective insulating layer over the first protective insulating layer,
wherein the third gate electrode is formed over and in contact with the second protective insulating layer.

11. A semiconductor device comprising:
a pixel portion including a first transistor and a pixel electrode over a substrate; and
a driver circuit including a second transistor over the substrate,
wherein the first transistor comprises:
a first gate electrode over the substrate;
a gate insulating layer over the first gate electrode;
a first oxide semiconductor layer over the gate insulating layer;
a first channel protective layer over and in contact with a part of the first oxide semiconductor layer; and
a first source electrode and a first drain electrode over the first channel protective layer and the first oxide semiconductor layer,
wherein the second transistor comprises:
a second gate electrode over the substrate;
the gate insulating layer over the second gate electrode;
a second oxide semiconductor layer over the gate insulating layer;
a second channel protective layer over and in contact with a part of the second oxide semiconductor layer;
a second source electrode and a second drain electrode over the second channel protective layer and the second oxide semiconductor layer; and
a third gate electrode over the second channel protective layer,
wherein the third gate electrode overlaps with the second gate electrode,
wherein the pixel electrode is electrically connected to one of the first source electrode and the first drain electrode,
wherein the first gate electrode, the gate insulating layer, the first oxide semiconductor layer, the first source electrode, the first drain electrode, the first channel protective layer, and the pixel electrode have a light-transmitting property,
wherein each of the first source electrode and the first drain electrode comprises an oxide conductive material,
wherein each of the second source electrode and the second drain electrode comprises a metal, and
wherein the third gate electrode and the pixel electrode are provided on a same surface.

12. The semiconductor device according to claim 11, wherein the first channel protective layer and the second channel protective layer comprise the same insulating material which has a light-transmitting property.

13. The semiconductor device according to claim 11, wherein the metal is one selected from Al, Cr, Cu, Ta, Ti, Mo, and W.

14. The semiconductor device according to claim 11, wherein the oxide conductive material comprises any of indium oxide, an alloy of indium oxide and tin oxide, an alloy of indium oxide and zinc oxide, and zinc oxide.

15. The semiconductor device according to claim 11, further comprises a capacitor portion over the substrate,
wherein the capacitor portion comprises:
a capacitor wiring; and
a capacitor electrode overlapping with the capacitor wiring, and
wherein the capacitor wiring and the capacitor electrode have a light-transmitting property.

16. The semiconductor device according to claim 11,
wherein the first channel protective layer and the second channel protective layer comprise an oxide insulating film.

17. The semiconductor device according to claim 11,
wherein a first portion of the first oxide semiconductor layer is in contact with the first channel protective layer, wherein a second portion of the first oxide semiconductor layer is not in contact with the first channel protective layer, and wherein a carrier concentration of the second portion is larger than a carrier concentration of the first portion.

18. The semiconductor device according to claim 11, wherein a first portion of the first oxide semiconductor layer is in contact with the first channel protective layer, wherein a second portion of the first oxide semiconductor layer is not in contact with the first channel protective layer, and wherein a carrier concentration of the first portion is less than $1\times10^{17}/cm^3$, and wherein a carrier concentration of the second portion is equal to or more than $1\times10^{17}/cm^3$.

19. The semiconductor device according to claim 11, further comprising:

a first protective insulating layer over and in contact with the first channel protective layer and the second channel protective layer; and a second protective insulating layer over the first protective insulating layer, wherein the third gate electrode is formed over and in contact with the first protective insulating layer.

20. The semiconductor device according to claim 11, further comprising:

a first protective insulating layer over and in contact with the first channel protective layer and the second channel protective layer; and a second protective insulating layer over the first protective insulating layer, wherein the third gate electrode is formed over and in contact with the second protective insulating layer.

* * * * *